United States Patent
Huibers

(10) Patent No.: US 6,962,419 B2
(45) Date of Patent: Nov. 8, 2005

(54) MICROMIRROR ELEMENTS, PACKAGE FOR THE MICROMIRROR ELEMENTS, AND PROJECTION SYSTEM THEREFOR

(75) Inventor: Andrew G. Huibers, Palo Alto, CA (US)

(73) Assignee: Reflectivity, INC, Sunnyvale, CA (US)

( * ) Notice: Subject to any disclaimer, the term of this patent is extended or adjusted under 35 U.S.C. 154(b) by 320 days.

(21) Appl. No.: 10/343,307

(22) PCT Filed: Mar. 8, 2001

(86) PCT No.: PCT/US01/24332
§ 371 (c)(1),
(2), (4) Date: Jan. 29, 2003

(87) PCT Pub. No.: WO02/12925
PCT Pub. Date: Feb. 14, 2002

(65) Prior Publication Data
US 2004/0125346 A1 Jul. 1, 2004

Related U.S. Application Data

(63) Continuation-in-part of application No. 09/631,536, filed on Aug. 3, 2000, now Pat. No. 6,529,310, which is a continuation-in-part of application No. 09/437,586, filed on Nov. 9, 1999, now Pat. No. 6,172,797, which is a continuation of application No. 09/160,361, filed on Sep. 24, 1998, now Pat. No. 6,046,840, said application No. PCT/US01/24332, and a continuation-in-part of application No. 09/732,445, filed on Dec. 7, 2000, now Pat. No. 6,523,961.

(60) Provisional application No. 60/229,246, filed on Aug. 30, 2000.

(51) Int. Cl.[7] .............................................. G03B 21/14

(52) U.S. Cl. ..................... 353/99; 348/771; 359/298; 359/323

(58) Field of Search .............................. 353/31, 98, 99; 359/198, 212, 222, 267, 291, 292, 298, 323; 348/742, 743, 771; 345/31, 108

(56) References Cited

U.S. PATENT DOCUMENTS

| | | | |
|---|---|---|---|
| 4,573,764 A | | 3/1986 | Bradley |
| 4,592,628 A | * | 6/1986 | Altman et al. ............... 359/223 |
| 4,679,900 A | | 7/1987 | McKechnie et al. |

(Continued)

FOREIGN PATENT DOCUMENTS

| | | | |
|---|---|---|---|
| EP | 1 191 382 A2 | 3/2002 | ........... G02B/26/08 |

*Primary Examiner*—William C. Dowling
(74) *Attorney, Agent, or Firm*—Gregory R. Muir

(57) ABSTRACT

In order to minimize light diffraction along the direction of switching and more particularly light diffraction into the acceptance cone of the collection optics, in the present invention, micromirrors are provided which are not rectangular. Also, in order to minimize the cost of the illumination optics and the size of the display unit of the present invention, the light source is placed orthogonal to the rows (or columns) of the array, and/or the light source is placed orthogonal to a side of the frame defining the active area of the array. The incident light beam, though orthogonal to the sides of the active area, is not however, orthogonal to any substantial portion of sides of the individual micromirrors in the array. Orthogonal sides cause incident light to diffract along the direction of micromirror switching, and result in light 'leakage' into the 'on' state even if the micromirror is in the 'off' state. This light diffraction decreases the contrast ratio of the micromirror. The micromirrors of the present invention result in an improved contrast ratio, and the arrangement of the light source to micromirror array in the present invention results in a more compact system. Another feature of the invention is the ability of the micromirrors to pivot in opposite direction to on and off positions (the on position directing light to collection optics), where the movement to the on position is greater than movement to the off position. A further feature of the invention is a package for the micromirror array, the package having a window that is not parallel to the substrate upon which the micromirrors are formed. One example of the invention includes all the above features.

142 Claims, 52 Drawing Sheets

U.S. PATENT DOCUMENTS

| | | | |
|---|---|---|---|
| 4,701,020 A | 10/1987 | Bradley, Jr. | |
| 4,762,393 A | 8/1988 | Gerrotsen et al. | |
| 5,064,277 A | 11/1991 | Blazey et al. | |
| 5,076,661 A | 12/1991 | Bradley | |
| 5,084,807 A | 1/1992 | McKechnie et al. | |
| 5,103,302 A | 4/1992 | Yoshida et al. | |
| 5,162,897 A | 11/1992 | Jitsukata et al. | |
| 5,166,824 A | 11/1992 | Nishiguchi et al. | |
| 5,289,287 A | 2/1994 | Dargis et al. | |
| 5,293,511 A | 3/1994 | Poradish et al. | |
| 5,321,551 A | 6/1994 | Choi | |
| 5,386,250 A | 1/1995 | Guerinot | |
| 5,410,370 A | 4/1995 | Janssen | |
| 5,420,655 A | 5/1995 | Shimizu | |
| 5,428,408 A | 6/1995 | Stanton | |
| 5,442,414 A | 8/1995 | Janssen et al. | |
| 5,448,314 A | 9/1995 | Heimbuch | |
| 5,499,062 A | 3/1996 | Urbanus | |
| 5,508,738 A | 4/1996 | Janssen et al. | |
| 5,532,763 A | 7/1996 | Janssen et al. | |
| 5,535,047 A | 7/1996 | Hornbeck | |
| 5,537,159 A | 7/1996 | Suematsu et al. | |
| 5,548,301 A | 8/1996 | Kornher et al. | |
| 5,548,347 A | 8/1996 | Melnik et al. | |
| 5,579,151 A | 11/1996 | Cho | |
| 5,581,393 A | 12/1996 | Min | |
| 5,590,943 A | 1/1997 | Yoshida et al. | |
| 5,592,188 A | 1/1997 | Doherty et al. | |
| 5,601,351 A | 2/1997 | van den Brandt | |
| 5,608,467 A | 3/1997 | Janssen et al. | |
| 5,610,438 A | 3/1997 | Wallace et al. | |
| 5,610,757 A | 3/1997 | Ji et al. | |
| 5,611,611 A | 3/1997 | Ogino et al. | |
| 5,613,748 A | 3/1997 | Yoshida et al. | |
| 5,614,921 A | 3/1997 | Conner et al. | |
| 5,629,801 A | 5/1997 | Staker et al. | |
| 5,654,775 A | 8/1997 | Brennesholtz | |
| 5,657,036 A | 8/1997 | Markandey et al. | |
| 5,659,374 A * | 8/1997 | Gale et al. | 348/771 |
| 5,668,572 A | 9/1997 | Meyer et al. | |
| 5,680,156 A | 10/1997 | Gove et al. | |
| 5,680,180 A | 10/1997 | Huang | |
| 5,696,619 A | 12/1997 | Knipe et al. | |
| 5,708,521 A | 1/1998 | Joen et al. | |
| 5,717,513 A | 2/1998 | Weaver | |
| 5,729,386 A | 3/1998 | Hwang | |
| 5,771,116 A | 6/1998 | Miller et al. | |
| 5,774,196 A | 6/1998 | Marshall | |
| 5,793,348 A | 8/1998 | Lee et al. | |
| 5,795,049 A | 8/1998 | Gleckman | |
| 5,798,743 A | 8/1998 | Bloom | |
| 5,808,797 A | 9/1998 | Bloom et al. | |
| 5,815,220 A | 9/1998 | Marshall | |
| 5,815,304 A | 9/1998 | Choi | |
| 5,815,641 A | 9/1998 | Marshall | |
| 5,818,545 A | 10/1998 | Takiguchi et al. | |
| 5,835,256 A | 11/1998 | Huibers | |
| 5,841,579 A | 11/1998 | Bloom et al. | |
| 5,844,715 A | 12/1998 | Park et al. | |
| 5,845,981 A | 12/1998 | Bradley | |
| 5,860,720 A | 1/1999 | Negishi et al. | |
| 5,862,002 A | 1/1999 | Ji | |
| 5,868,482 A | 2/1999 | Edlinger et al. | |
| 5,870,076 A | 2/1999 | Lee et al. | |
| 5,870,225 A | 2/1999 | Ogino et al. | |
| 5,886,811 A | 3/1999 | Min | |
| 5,892,623 A | 4/1999 | Bradley | |
| 5,905,545 A | 5/1999 | Poradish et al. | |
| 5,909,204 A | 6/1999 | Gale et al. | |
| 5,917,558 A | 6/1999 | Stanton | |
| 5,929,945 A | 7/1999 | Negishi et al. | |
| 5,930,050 A | 7/1999 | Dewald | |
| 5,936,758 A | 8/1999 | Fisher et al. | |
| 5,937,271 A | 8/1999 | Min | |
| 5,939,785 A | 8/1999 | Klonis et al. | |
| 5,959,598 A | 9/1999 | McKnight | |
| 5,967,636 A | 10/1999 | Stark et al. | |
| 5,969,619 A * | 10/1999 | Niemiro et al. | 340/618 |
| 5,982,553 A | 11/1999 | Bloom et al. | |
| 5,991,079 A | 11/1999 | Furlani et al. | |
| 5,993,007 A | 11/1999 | Jung | |
| 5,999,306 A | 12/1999 | Atobe et al. | |
| 6,002,452 A | 12/1999 | Morgan | |
| 6,004,912 A | 12/1999 | Gudeman | |
| 6,008,785 A | 12/1999 | Hewlett et al. | |
| 6,014,257 A | 1/2000 | Furlani et al. | |
| 6,031,652 A | 2/2000 | Furlani et al. | |
| 6,038,057 A | 3/2000 | Brazas, Jr. et al. | |
| 6,046,840 A | 4/2000 | Huibers | |
| 6,061,166 A | 5/2000 | Furlani et al. | |
| 6,064,404 A | 5/2000 | Aras et al. | |
| 6,067,183 A | 5/2000 | Furlani et al. | |
| 6,084,626 A | 7/2000 | Ramanujan et al. | |
| 6,088,102 A | 7/2000 | Manhart | |
| 6,101,036 A | 8/2000 | Bloom | |
| 6,123,985 A * | 9/2000 | Robinson et al. | 427/162 |
| 6,128,121 A * | 10/2000 | Choi et al. | 359/224 |
| 6,128,125 A | 10/2000 | Gericke et al. | |
| 6,130,770 A | 10/2000 | Bloom | |
| 6,144,481 A | 11/2000 | Kowarz et al. | |
| 6,175,443 B1 * | 1/2001 | Aksyuk et al. | 359/291 |
| 6,222,667 B1 * | 4/2001 | Gobeli | 359/323 |
| 6,276,801 B1 | 8/2001 | Fielding | |
| 6,288,828 B1 * | 9/2001 | Hewlett | 359/291 |
| 6,351,330 B2 * | 2/2002 | Ko et al. | 359/298 |

* cited by examiner

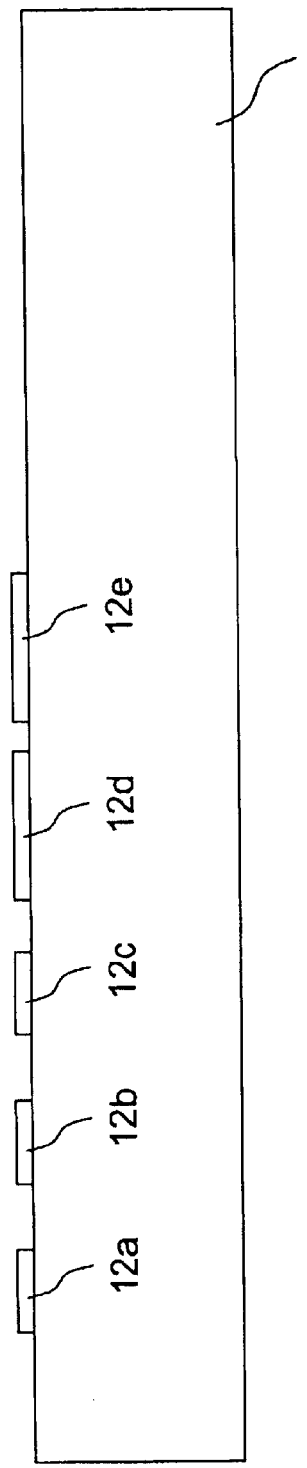
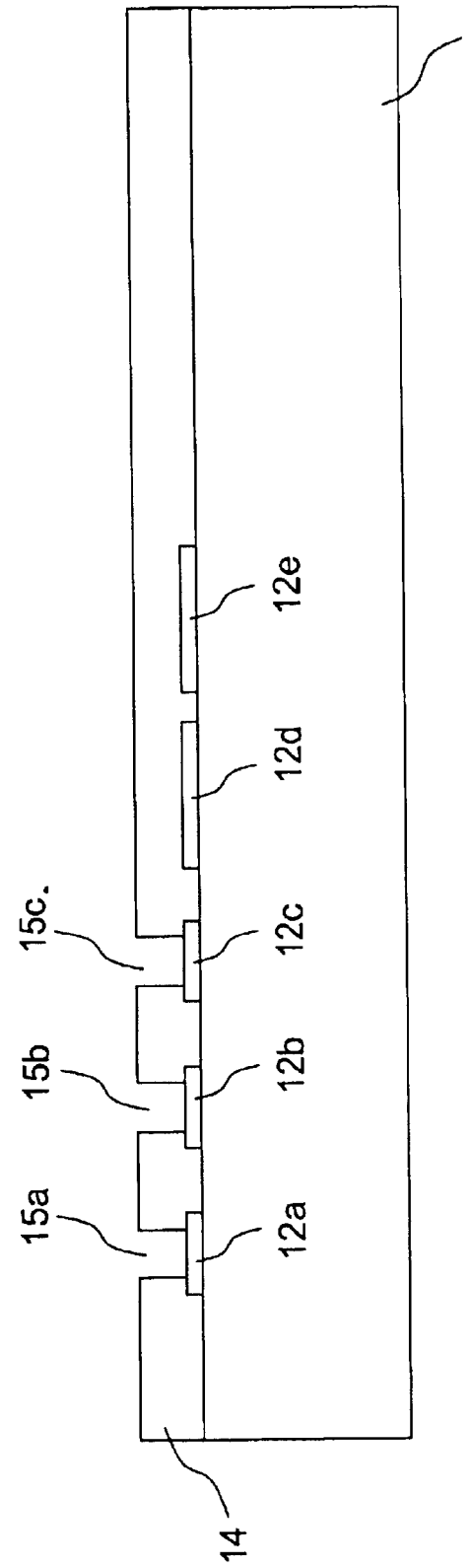
FIG. 5A
FIG. 5B

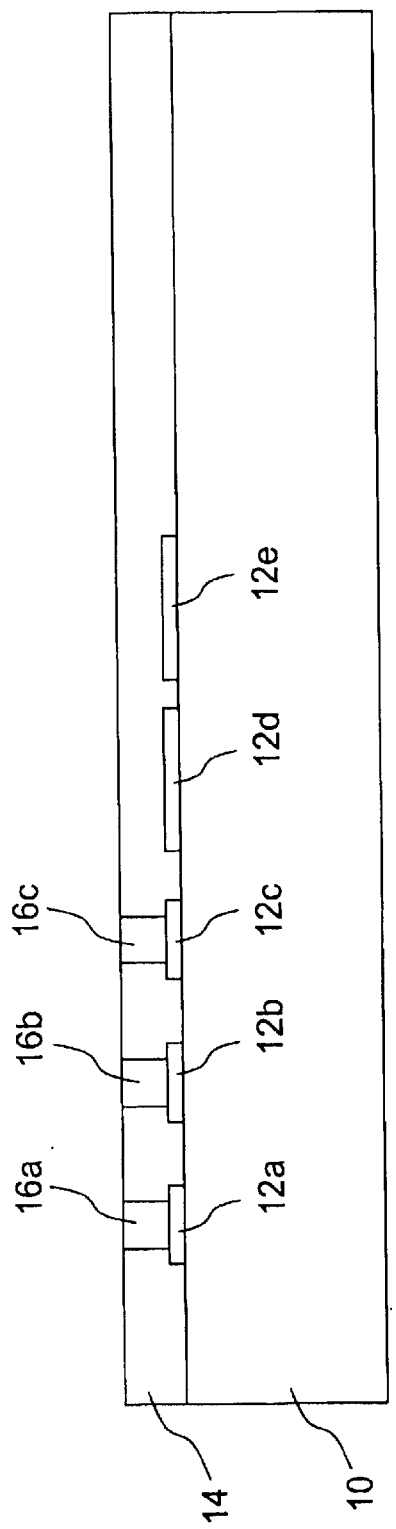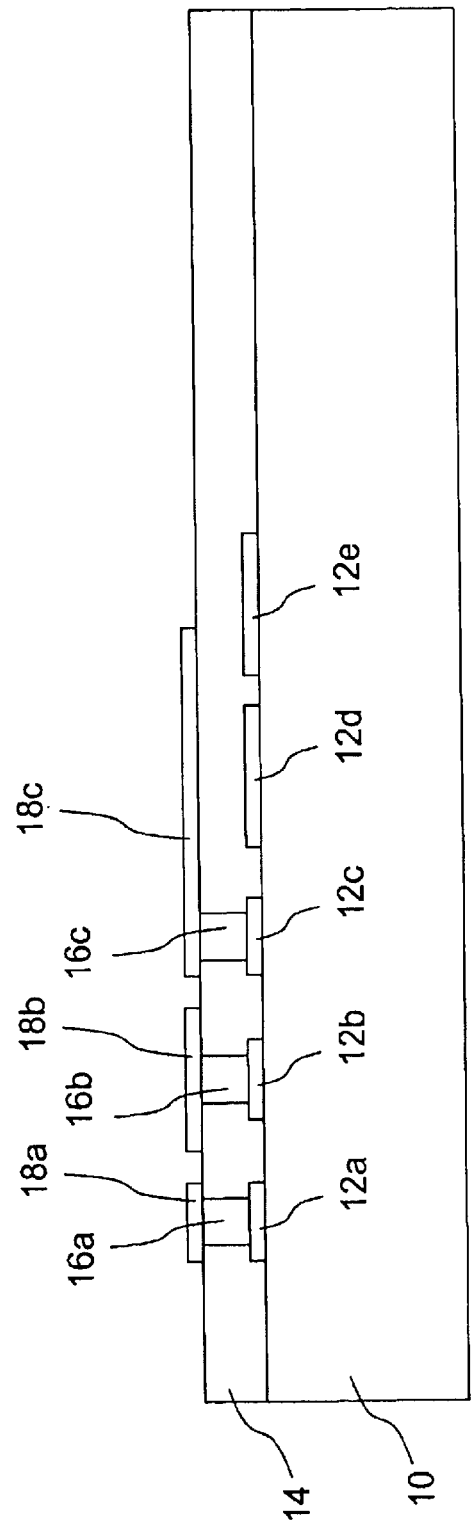
FIG. 5C
FIG. 5D

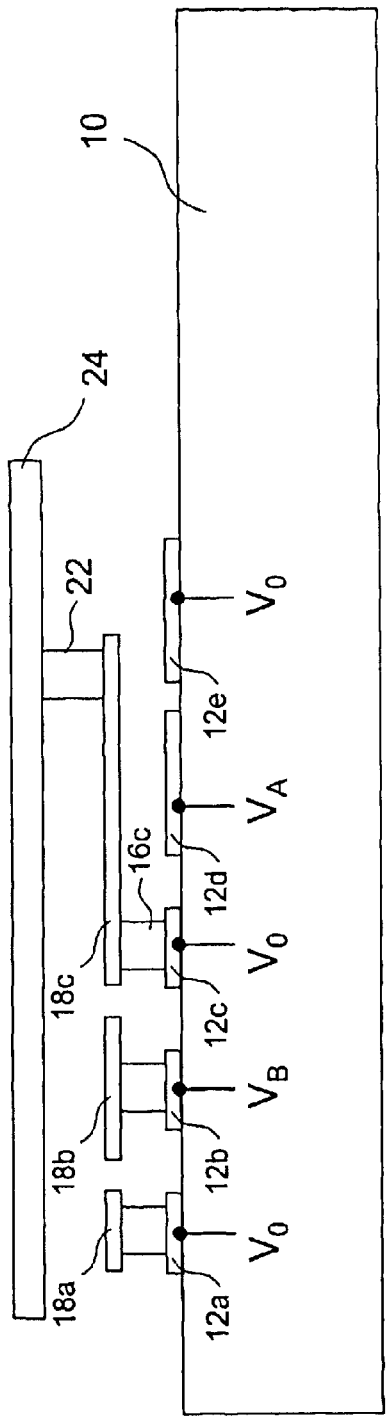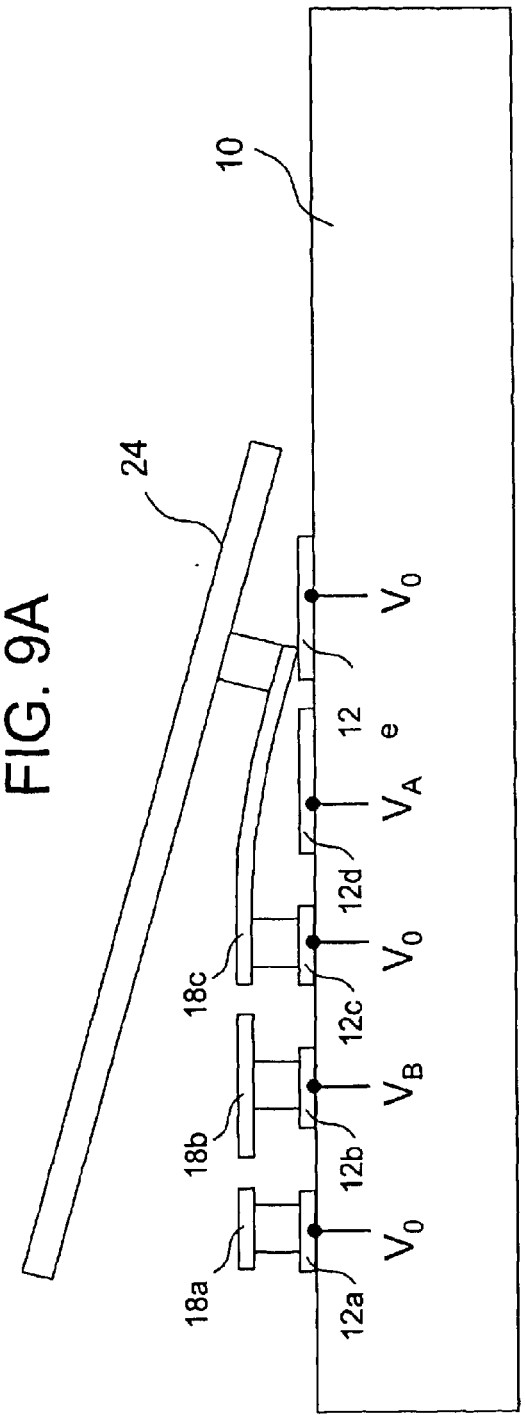

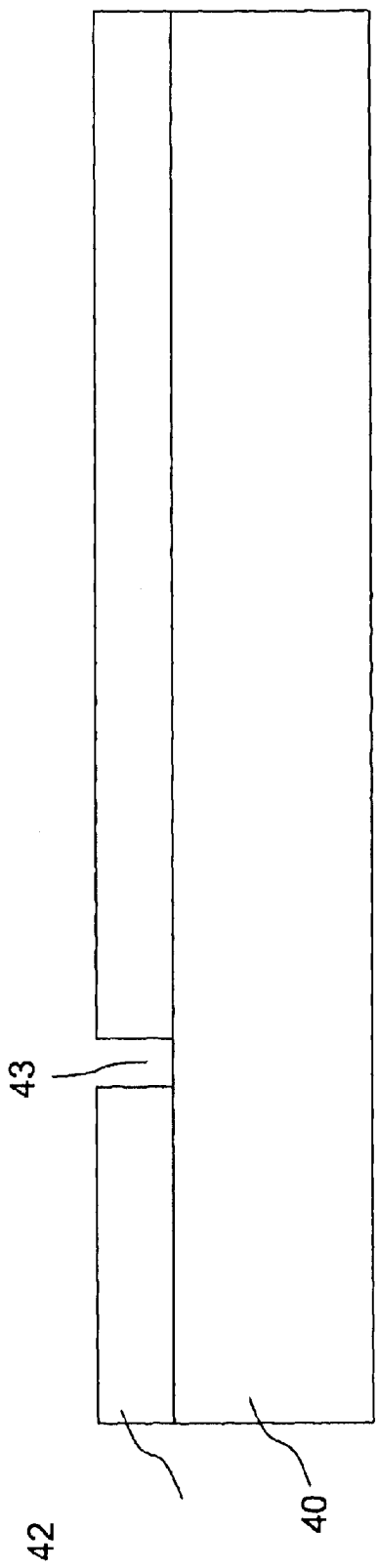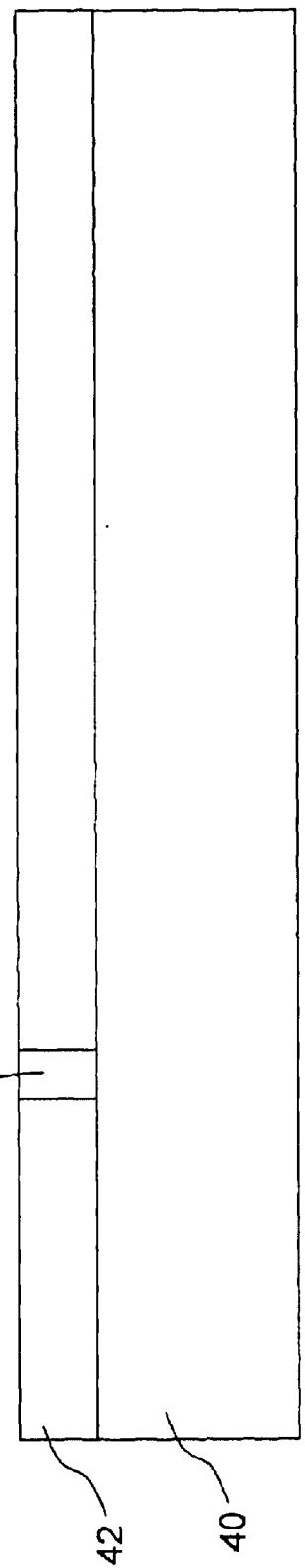

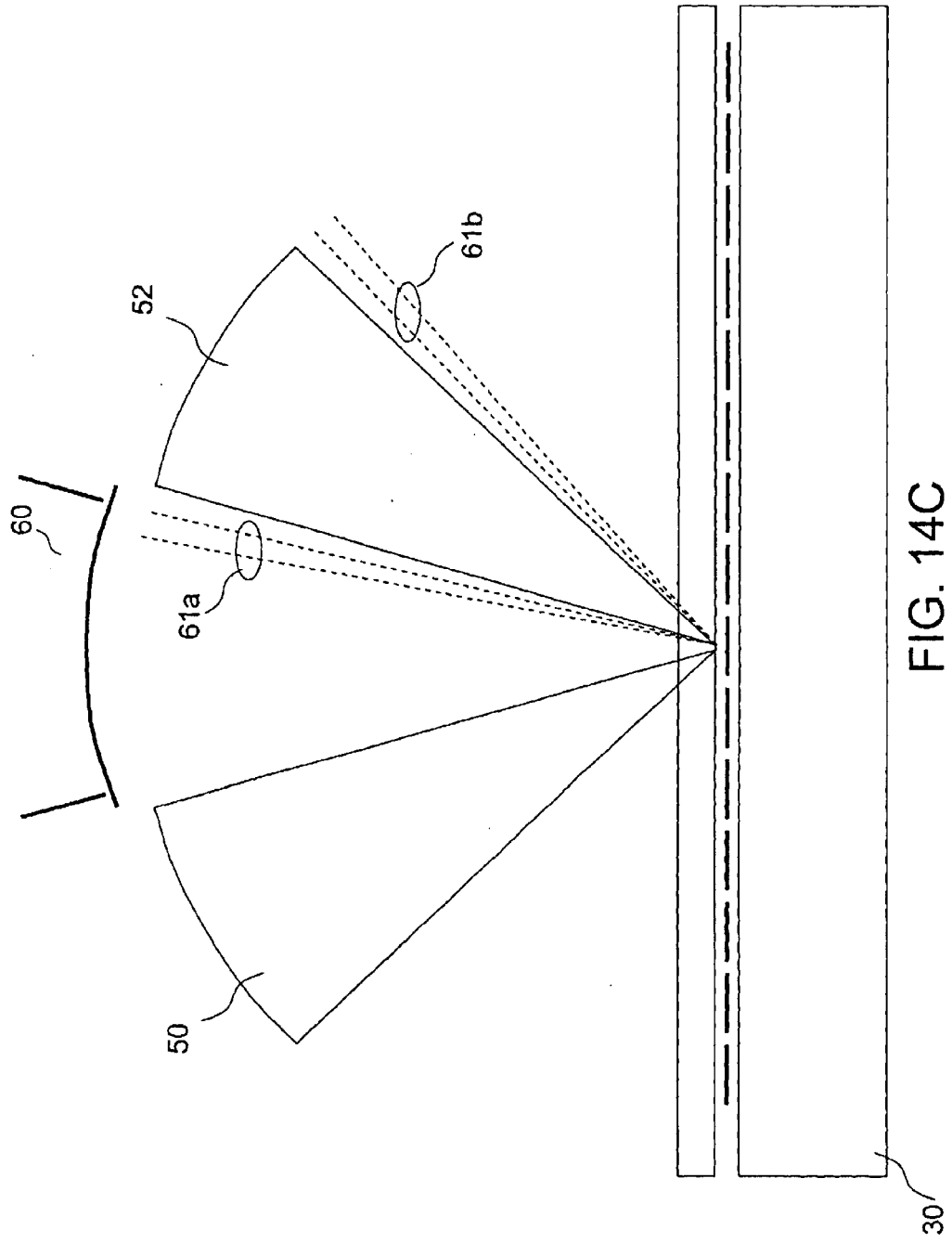

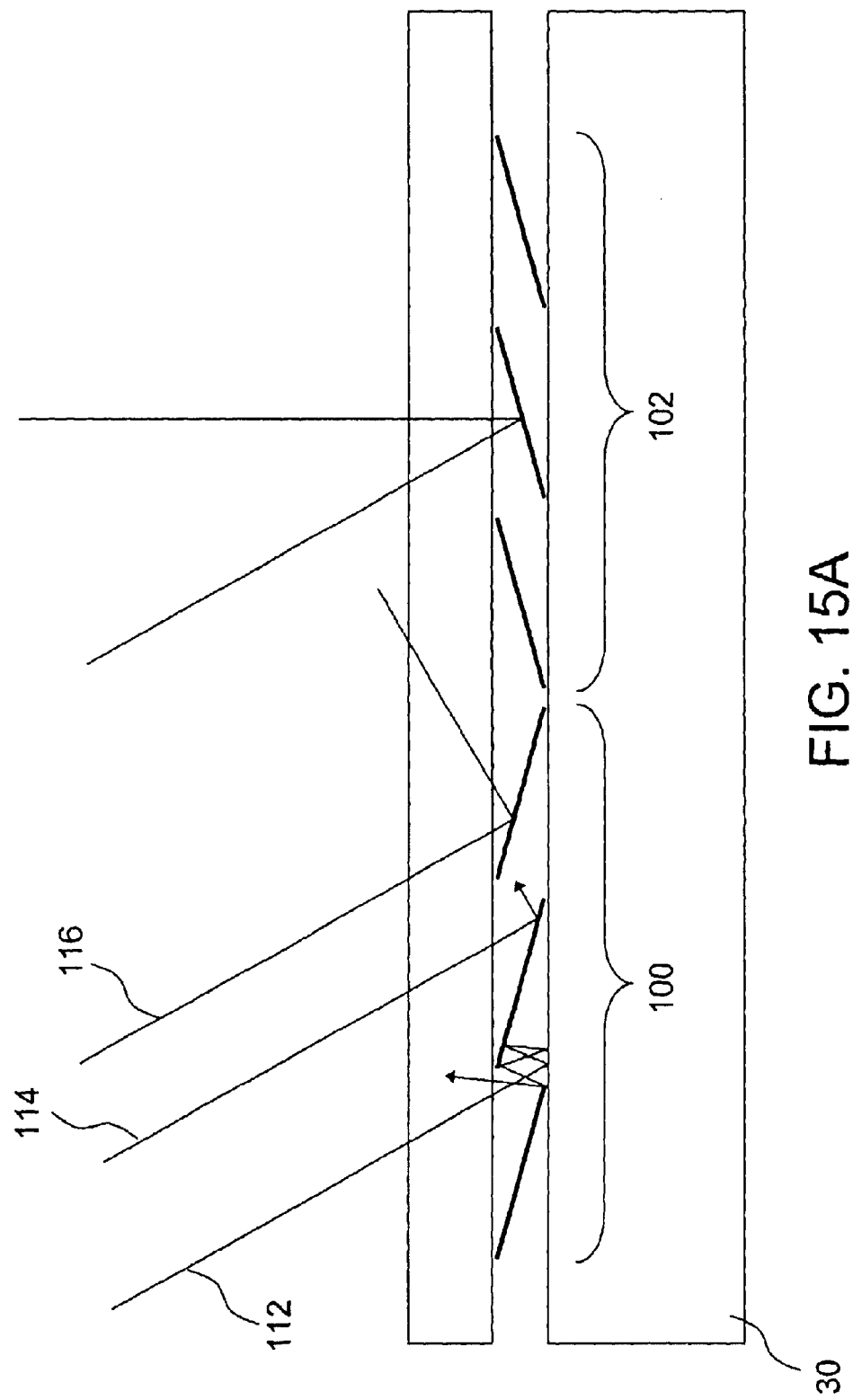

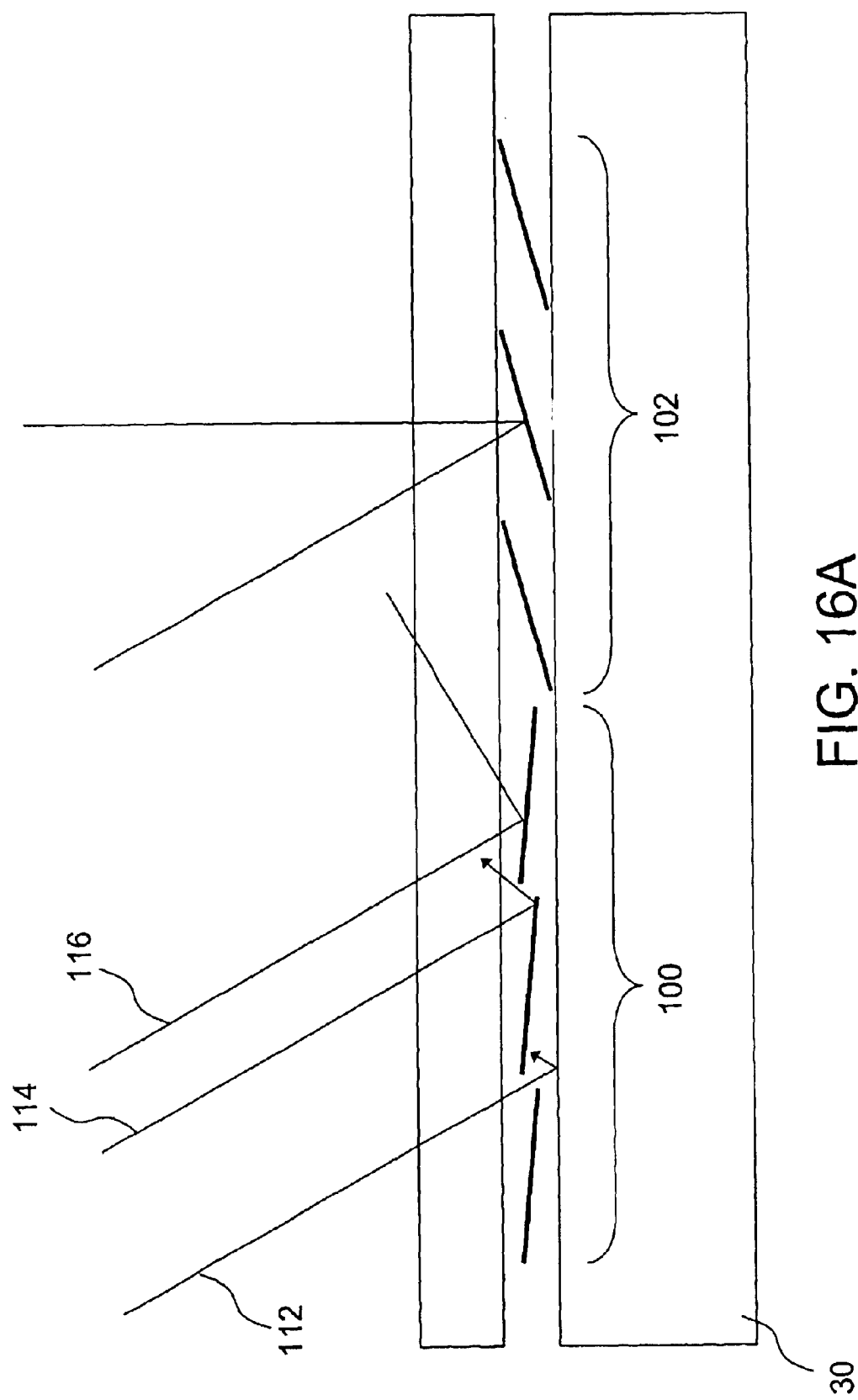

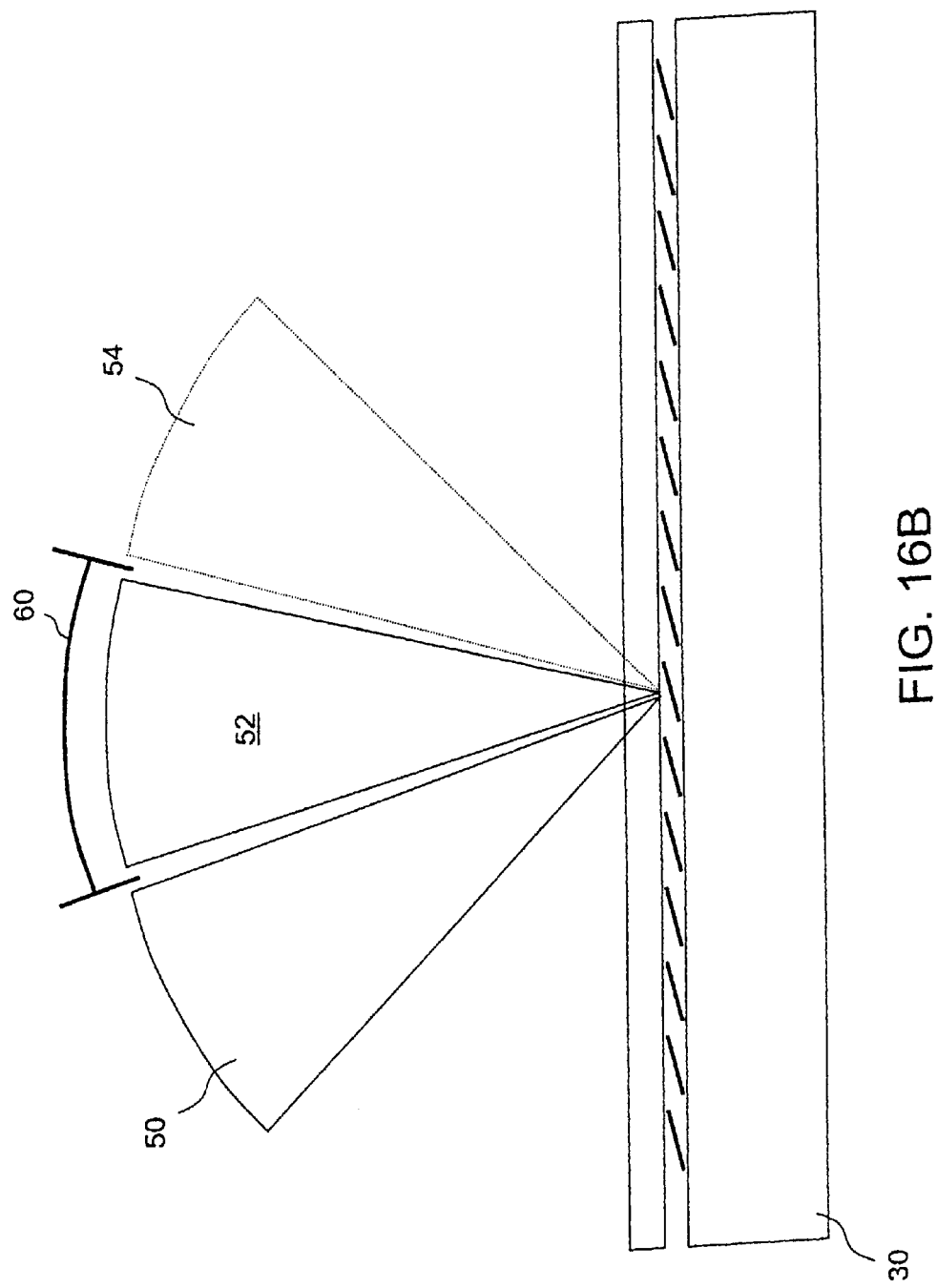

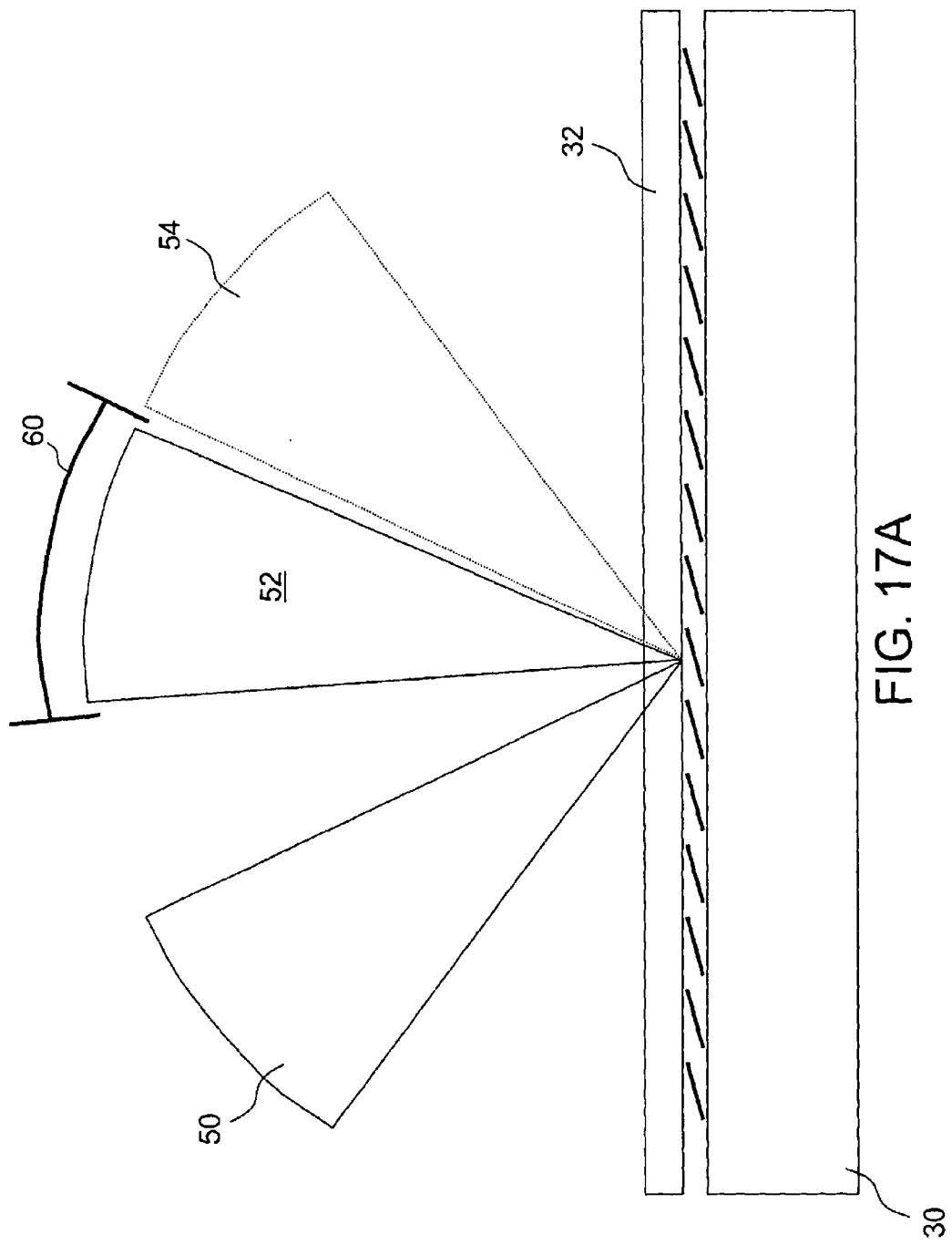

MICROMIRROR ELEMENTS, PACKAGE FOR THE MICROMIRROR ELEMENTS, AND PROJECTION SYSTEM THEREFOR

This application is a 371 of PCT/US01/24332 filed Aug. 3, 2001,
which is a CIP of Ser. No. 09/631,536, filed Aug. 3, 2000, now U.S. Pat. No. 6,529,310,
which is a CIP of Ser. No. 09/437,586, filed Nov. 9, 1999, now U,S. Pat. No. 6,172,797,
which is a continuation of Ser. No. 09/160,361, filed Sep. 24, 1998, now U.S. Pat. No. 6,046,840,
and said PCT/US01/24332 filed Aug. 3, 2000 claims benefit of Ser. No. 60/229,246, filed Aug. 30, 2000,
and is a CIP of Ser. No. 09/732,445, filed Dec. 7, 2000, now U.S. Pat. No. 6,523,961,
which claims benefit of Ser. No. 60/229,246, filed Aug. 30. 2000.

BACKGROUND

The present invention relates to movable micromirrors and micromirror arrays for, e.g., projection displays. U.S. Pat. Nos. 5,835,256 and 6,046,840 to Huibers, and U.S. patent application Ser. No. 09/617,419 to Huibers et al., the subject matter of each being incorporated herein by reference, disclose micro-electromechanical devices (MEMS) for steering light beams, such as in an optical switch, and/or for a display (e.g., a projection display). A common feature is a micromirror element that is movable so as to deflect light through different angles, depending upon the micromirror element's tilt angle. In one type of conventional direct view or projection display system, an array of reflective micromirror elements is provided for producing an image. Typically the micromirror elements are square and have either a single tilt angle for the 'on' state and are flat for the off state, or the same tilt angles for 'on' and 'off' states but opposite sign.

SUMMARY OF THE INVENTION

In order to minimize light diffraction along the direction of switching and in particular light diffraction into the acceptance cone of the collection optics, in the present invention, micromirrors are provided which are not rectangular ("rectangular" as used herein including square micromirrors). Diffraction as referred to herein, denotes the scattering of light off of a periodic structure, where the light is not necessarily monochromatic or phase coherent. Also, in order to minimize the cost of the illumination optics and the size of the display unit of the present invention, the light source is placed orthogonal to the rows (or columns) of the array, and/or the light source is placed orthogonal to a side of the frame defining the active area of the array. The incident light beam, though orthogonal to the rows (or columns) and/or side of the active area, should not, however, be orthogonal to sides of the individual micromirrors in the array. Orthogonal sides cause incident light to diffract along the direction of micromirror switching, and result in light 'leakage' into the 'on' state even if the micromirror is in the 'off' state. This light diffraction decreases the contrast ratio of the micromirror.

The present invention optimizes the contrast ratio of the micromirror array so that when micromirrors are in their 'off' state they send minimal light to the spatial region where light is directed when micromirrors are in their 'on' state. More specifically, the present invention comprises a particularly located light source and incident light beam and particularly designed micromirrors in the array, which minimize light diffracted into the acceptance cone of the projection (or viewing) optics, so as to provide an improved contrast ratio. The arrangement and design of the present invention also minimizes non-reflective areas in the array, by allowing for a tight fit of micromirrors and a large fill factor with low diffraction from the 'off' to the 'on' state, even when the array is illuminated along the axes of micromirror periodicity. Namely, the design optimizes contrast ratio through angular sides non-parallel to the micromirror's axis of rotation and optimizes fill factor through hinges that require a relatively small amount of area and allow neighboring micromirrors to tile together with little wasted non-reflective area. The micromirror structures and shapes of various examples of the invention also decrease cross talk between adjacent micromirrors when the micromirrors are deflected electrostatically.

Another aspect of the invention is a micromirror array where the individual micromirrors tilt asymmetrically around a flat or non-deflected state. By making the 'off' state of the micromirrors at an angle less than the opposite angle of the micromirrors in the 'on' state, a) diffracted light from the edges of the micromirrors that enters the collection optics is minimized, b) and light that is scattered from beneath the micromirrors that enters the collection optics is also minimized, c) travel of the micromirrors is decreased thus minimizing the possibility of adjacent micromirrors hitting each other, which in turn allows for reducing the gap between micromirrors and increasing fill factor of the micromirror array, and d) the angle of deflection of the micromirrors can be increased to a greater extent than micromirror array arrangements with the same angle of deflection for the on and off states.

Another aspect of the invention is a package for the micromirror array that has a light transmissive portion of the package that is not parallel with the substrate upon which the micromirrors are formed. The light transmissive portion can be any suitable material such as a plate of glass, quartz or polymer, and allows for directing specular reflection from the light transmissive substrate in directions other than those that result from a parallel light transmissive plate in the packaging. Preferably the specular reflection is directed sufficiently far from the collection optics so that an increase in the size of the illumination cone will keep the specular reflection from entering the collection optics.

A further aspect of the invention is a projection system, comprising an array of active micromirrors disposed in a rectangular shape, the micromirrors capable of rotation around a switching axis between an off-state and an on-state, the micromirrors corresponding to pixels in a viewed image; a light source for directing light to the array of micromirrors, the light source disposed so as to direct light non-perpendicular to at least two sides of each micromirror, and parallel, when viewed as a top view of each micromirror, to at least two other sides of each micromirror; and collection optics disposed to receive light from micromirrors in an on-state.

Another aspect of the invention is a projection system, comprising an array of micromirrors, each micromirror corresponding to a pixel in a viewed image and having a shape of a concave polygon or one or more non-rectangular parallelograms; a light source for directing light to the array of micromirrors collection optics disposed to receive light reflected from the micromirrors.

Yet another aspect of the invention is a projection system comprising a light source for providing an incident light beam, an array of movable reflective elements, and collection optics for projecting light from the array, wherein an image projected from the projection system will appear on a target as a rectangular image, with the image being formed of from thousands to millions of pixels, each pixel being in the shape of a concave polygon, a single non-rectangular parallelogram, or an assembly of non-rectangular parallelograms.

Still another aspect of the invention is a projection system comprising a light source, an array of movable micromirror elements, and collection optics, wherein each micromirror element in the array has a switching axis substantially parallel to at least one side of the active area of the array, and at an angle of from 35 to 60 degrees to one or more sides of the micromirror element.

Another aspect of the invention is a projection system comprising a light source and an array of movable micromirror elements, each micromirror element having a leading side that is non-perpendicular to the incident light beam, and non-perpendicular to any side of the active area, so as to achieve an increase of 2 to 10 times the contrast ratio compared to micromirror elements having perpendicular sides to the incident light beam.

Another aspect of the invention is a projection system comprising a light source, collection optics, and an array of movable micromirror elements, the projection system having a diffraction pattern substantially the same as that illustrated in FIG. 21C.

Yet another aspect of the invention is a projection system comprising a light source and a rectangular array of movable micromirrors, the micromirrors capable of moving between an on-state and an off-state and capable of reflecting light in the on-state to a predetermined spatial area, wherein the light source is disposed to direct light at a substantially 90 degree angle to at least one side of the rectangle defined by the array, and wherein substantially no diffracted light enters the predetermined spatial area when the micromirrors are in the off-state.

Another aspect of the invention is a method for projecting an image on a target comprising: directing a light beam onto a rectangular array of micromirrors, the light beam directed to the leading side of the rectangular array at an angle within a range of 90 degrees plus or minus 40 degrees, and wherein the micromirrors in the array are shaped as polygons and positioned such that the light beam is incident on all of the polygonal sides at angles other than 90 degrees; and projecting the light from the micromirrors onto a target so as to form an image thereon.

Another part of the invention is a projection system comprising a light source, light collection optics and an array of micromirrors disposed to spatially modulate a light beam from the light source, the array formed on a substrate and constructed so that each micromirror is capable of being in a first position when not actuated, each micromirror being capable of movement to an on position that directs light to light collection optics for the array, and capable of movement in an opposite direction to an off position for directing light away from the light collection optics, both said on and off positions being different from said first position, and wherein the on position is at an angle relative to the first position different from the off position.

Still another aspect of the invention is a method for spatially modulating a light beam, comprising directing a light beam from a light source to light collection optics via an array of micromirrors disposed to spatially modulate the light beam from the light source, the array formed on a substrate and each micromirror being in a first position when not modulated, modulating micromirrors in the array so that each micromirror moves to an on position that directs light to the light collection optics for the array, and moves to an off position for directing light away from the light collection optics, both said on and off positions being different from said first position, and wherein the on position is at a magnitude of an angle relative to the first position different from the magnitude of an angle when in the off position.

Still another aspect of the invention is an optical micromechanical element formed on a substrate having an on position at a first magnitude of an angle relative to the substrate, having an off position at a second magnitude of an angle to the substrate, the first and second magnitudes being different, and having a third position substantially parallel to the substrate, both the on and off positions being defined by abutment of the optical micromechanical element against the substrate or against structure formed on said substrate.

Yet another aspect of the invention is a method for modulating light, comprising reflecting light from an array of deflectable micromirrors disposed on a planar substrate; said micromirrors tilted to either a first position or to a second position; wherein the angle formed between said first position and the substrate, and the angle formed between said second position and the substrate, are substantially different.

Another part of the invention is a method for modulating light, comprising a light source, a planar light modulator array comprising a deflectable elements and collection optics, wherein the elements in the array are selectively configured in at least two states, wherein the first state elements direct the light from the light source through a first angle into the collection optics, and in the second state elements direct the light from the light source through a second angle into the collection optics, a third angle representing light that is reflected from the array as if it were a micromirrored surface, wherein the difference between the first and third and second and third angles are substantially different.

Another aspect of the invention is a projection system, comprising a light source for providing a light beam; a micromirror array comprising a plurality of micromirrors provided in a path of the light beam; and collection optics disposed in a path of the light beam after the light beam is incident on the micromirror array and reflects off of the plurality of micromirrors as a pattern of on and off micromirrors in the array; wherein the micromirror array comprises a substrate, the array of micromirrors being held on the substrate where each micromirror is capable of moving to an on position and an off position from a non-deflected position, wherein the on position is at a different angle than the off position relative to the non-deflected position.

Still another part of the invention is a method for projecting an image onto a target, comprising directing a light beam from a light source onto a micromirror array; modulating the micromirrors each to an on or off position, wherein in the on position, micromirrors direct light to collection optics disposed for receiving light from micromirrors in their on position, wherein the pattern of on and off micromirrors forms an image; and wherein the position of the micromirrors in their on position is at a different magnitude of an angle compared to the magnitude of the angle of the micromirrors in their off position.

Yet another part of the invention is a method for spatially modulating a light beam, comprising directing a beam of light onto an array of micromirrors, the micromirrors capable of movement to a first or second position, wherein in the first position the micromirrors direct a portion of the beam of light incident thereon into a collection optic, and wherein the minimum distance between adjacent micromirrors when each in the second position is less than the minimum distance between the adjacent micromirrors when each is in the first position.

Another aspect of the invention is a device comprising a substrate on which is formed a movable reflective or diffractive micromechanical device; a package for holding the substrate with the movable micromechanical device; wherein the package comprises an optically transmissive window that is non-parallel to the substrate.

A further part of the invention is a projection system, comprising a light source; light collection optics; a substrate on which is formed a movable reflective or diffractive micromechanical device; a package for holding the substrate with the movable micromechanical device; wherein the package comprises an optically transmissive window that is non-parallel to the substrate; the packaged micromechanical device disposed in a path of a light beam from the light source for modulating light from the light beam, and the collection optics collecting the modulated light.

A still further part of the invention is a projector comprising a light source, a packaged MEMS device having a substrate with a micromechanical device thereon and a window in the package disposed at an angle to the substrate, and collection optics disposed to receive light from the light source after modulation by the packaged MEMS device.

Another aspect of the invention is a method for making a micromirror, comprising providing a substrate;

depositing and patterning a first sacrificial layer on the substrate; depositing at least one hinge layer on the sacrificial layer and patterning the at least one hinge layer to define at least one flexure hinge; depositing and patterning a second sacrificial layer; depositing at least one mirror layer on the second sacrificial layer and patterning the at least one mirror layer to form a mirror element; and removing the first and second sacrificial layers so as to release the micromirror.

And still yet another aspect of the invention is an optical micromechanical device, comprising a substrate; a first post on the substrate; a flexure hinge where a proximal end of flexure hinge is on the post; a second post attached to a distal end of the flexure hinge; and a plate attached to the second post.

BRIEF DESCRIPTION OF THE DRAWINGS

FIGS. 5A to 5G are cross sectional views illustrating yet a further method for making micromirrors in accordance with the present invention;

FIGS. 9A to 9C are cross sectional views showing actuation of a micromirror of the embodiment of FIG. 8;

FIGS. 10A to 10D are cross sectional views of a process in accordance with yet another embodiment of the invention;

FIGS. 14A to 14C illustrate micromirrors having a flat non-deflected 'off' state;

FIGS. 15A to 15C illustrate micromirrors having deflected 'on' and 'off' states of equal angles;

FIGS. 16A to 16C illustrated micromirrors having a greater angle for the 'on' state than the 'off' state;

FIGS. 17A to 17E illustrate a package arrangement for micromirrors having an angled window;

DETAILED DESCRIPTION

Figure 1:
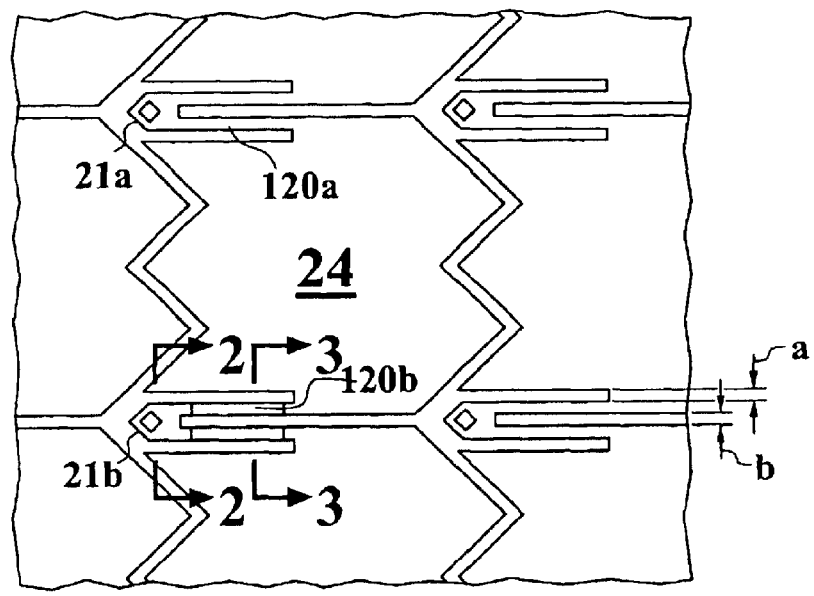
FIG. 1 is a top view of one embodiment of the micromirrors of the present invention.

Processes for microfabricating a movable micromirror or micromirror array are disclosed in U.S. Pat. Nos. 5,835,256 and 6,046,840 both to Huibers, the subject matter of each being incorporated herein by reference. A similar process for forming the micromirrors of the present invention is illustrated in FIGS. 1 to 3. FIG. 1 is a top view of one embodiment of the micromirrors of the present invention. As can be seen in FIG. 1, posts 21a and 21b hold micromirror plate 24 via hinges 120a and 120b above a lower substrate having electrodes thereon (not shown) for causing deflection of micromirror plate 24. Though not shown in FIG. 1, and as will be discussed further herein, thousands or even millions of micromirrors 24 can be provided in an array for reflecting light incident thereon and projecting an image to a viewer or target/screen.

Micromirror 24, and the other micromirrors in the array, can be fabricated by many different methods. One method is illustrated in FIGS. 2A to 2E (taken along cross section 2—2 from FIG. 1) where the micromirrors are fabricated on preferably a light transmissive substrate which is then bonded to a circuit substrate. This method is disclosed further in U.S. Provisional Patent Application 60/229,246, to Ilkov et al., filed Aug. 30, 2000, and U.S. patent application Ser. No. 09/732,445 to Ilkov et al., filed Dec. 7, 2000. Though the method will be describe in connection with a light transmissive substrate, any other suitable substrate could be used, such as a semiconductor substrate with circuitry. If a semiconductor substrate such as single crystal silicon is used, it may be preferred to electrically connect the micromirror posts to the metal 3 layer in the IC process and utilize conductive materials for at least a part of the micromirrors. Methods of forming micromirrors directly on a circuit substrate (instead of on a separate light transmissive substrate) will be discussed in more detail further herein.

Figure 2A:
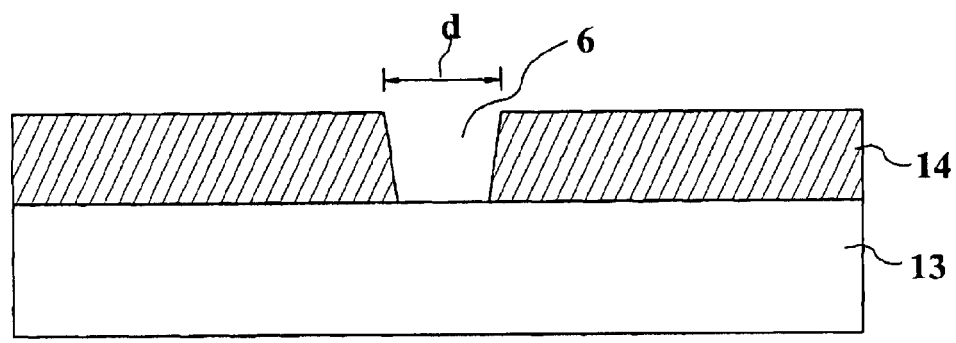
FIGS. 2A to 2E are cross sectional views of one method for making the micromirrors of the present invention, taken along line 2—2 of FIG. 1.

As can be seen in FIG. 2A, a light transmissive substrate 13 (at least prior to adding further layers thereon) such as glass (e.g., Corning 1737F or Eagle2000), quartz, Pyrex™, sapphire, etc. is provided. The light transmissive substrate can have an optional light blocking layer added on its lower side to help in handling the substrate during processing. Such a light blocking layer could be a TiN layer deposited by reactive sputtering to a depth of 2000 angstroms on the back side of the light transmissive substrate, which would later be removed once processing is complete. The substrate can be any shape or size, though one that is the shape of a standard wafer used in an integrated circuit fabrication facility is preferred.

As can also be seen in FIG. 2A, a sacrificial layer 14, such as amorphous silicon, is deposited. The sacrificial layer can be another suitable material that can later be removed from under the micromechanical structural materials (e.g., SiO2, polysilicon, polyimide, novolac, etc.). The thickness of the sacrificial layer can be wide ranging depending upon the movable element/micromirror size and desired tilt angle, though a thickness of from 500 Å to 50,000 Å, preferably around 5000 Å is preferred. Alternative to the amorphous silicon, the sacrificial layer could be any of a number of polymers, photoresist or other organic material (or even polysilicon, silicon nitride, silicon dioxide, etc. depending upon the materials selected to be resistant to the etchant, and the etchant selected). An optional adhesion promoter (e.g., SiO2 or SiN) can be provided prior to depositing the sacrifiical material.

Hole 6 having width "d" is formed in the sacrificial layer in order to provide a contact area between the substrate 13 and later deposited micromechanical structural layers. The holes are formed by spinning on a photoresist and directing light through a mask to increase or decrease solubility of the resist (depending upon whether the resist is a positive or negative resist). Dimension "d" can be from 0.2 to 2 micrometers (preferably around 0.7 um), depending upon the ultimate size of the micromirror and the micromirror array. After developing the resist to remove the resist in the area of the holes, the holes are etched in the sacrificial amorphous silicon with a chlorine or other suitable etchant (depending upon the sacrificial material). The remaining photoresist is then removed, such as with an oxygen plasma. The hole in the sacrificial layer can be any suitable size, though preferably having a diameter of from 0.1 to 1.5 um, more preferably around 0.7+/−0.25 um. The etching is performed down to the glass/quartz substrate or down to any intermediate layers such as adhesion promoting layers. If the light transmissive substrate is etched at all, it is preferably in an amount less than 2000 Å. If the sacrificial layer 14 is a directly patternable material (e.g., a novolac or other photosensitive photoresist) then an additional layer of photoresist deposited and developed on top of the sacrificial layer 14 is not needed. In such a case, the photoresist sacrificial layer is patterned to remove material in the area of hole(s) 6 and then optionally hardened before depositing additional layers.

Figure 2B:
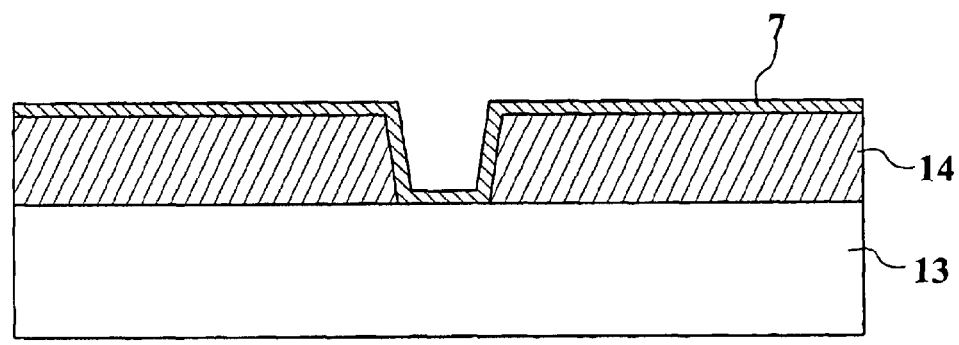

At this point, as can be seen in FIG. 2B, a first structural layer 7 is deposited by, e.g., chemical vapor deposition. Preferably the material is silicon nitride or silicon oxide deposited by LPCVD (low pressure chemical vapor deposition) or PECVD (plasma enhanced chemical vapor deposition), however any suitable thin film material such as polysilicon, a metal or metal alloy, silicon carbide or an organic compound could be deposited at this point (of course the sacrificial layer and etchant should be adapted to the structural material(s) used). The thickness of this first layer can vary depending upon the movable element size and desired amount of stiffness of the element, however in one embodiment the layer has a thickness of from 100 to 3200 Å, more preferably between 900 and 1100 Å. As can be seen in FIG. 2B, layer 7 extends into the holes etched in the sacrificial layer.

Figure 2C:
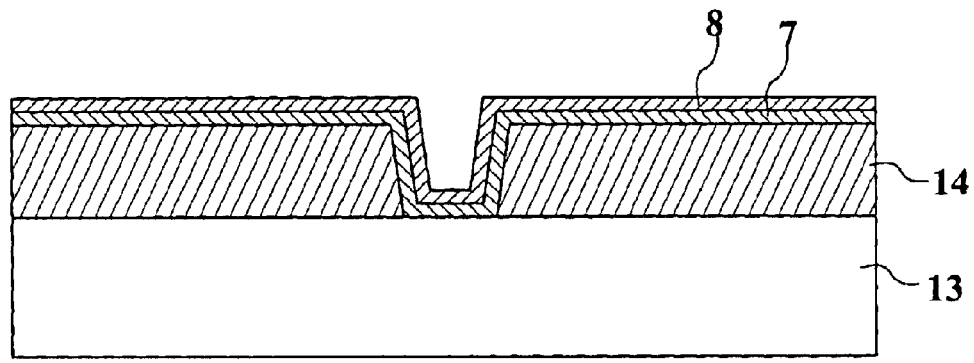

A second layer 8 is deposited as can be seen in FIG. 2C. The material can be the same (e.g., silicon nitride) as the first layer or different (silicon oxide, silicon carbide, polysilicon, etc.) and can be deposited by chemical vapor deposition as for the first layer. The thickness of the second layer can be greater or less than the first, depending upon the desired stiffness for the movable element, the desired flexibility of the hinge, the material used, etc. In one embodiment the second layer has a thickness of from 50 Å to 2100 Å, and preferably around 900 Å. In another embodiment, the first layer is deposited by PECVD and the second layer by LPCVD.

In the embodiment illustrated in FIGS. 2A to 2E, both the first and second layers are deposited in the areas defining the movable (micromirror) element and the posts. Depending upon the desired stiffness for the micromirror element, it is also possible to deposit only one of the first or second layers in the area of the micromirror element. Also, a single layer could be provided in place of the two layers 7, 8 for all areas of the microstructure, though this could involve a tradeoff in plate stiffness and hinge flexibility. Also, if a single layer is used, the area forming the hinge could be partially etched to lower the thickness in this area and increase the flexibility of the resulting hinge. It is also possible to use more than two layers to produce a laminate movable element, which can be desirable particularly when the size of the movable element is increased such as for switching light beams in an optical switch. The materials for such layer or layers could also comprise alloys of metals and dielectrics or compounds of metals and nitrogen, oxygen or carbon (particularly the transition metals). Some of these alternative materials are disclosed in U.S. Provisional Patent Application 60/228,007, the subject matter of which is incorporated herein by reference.

Figure 2D:
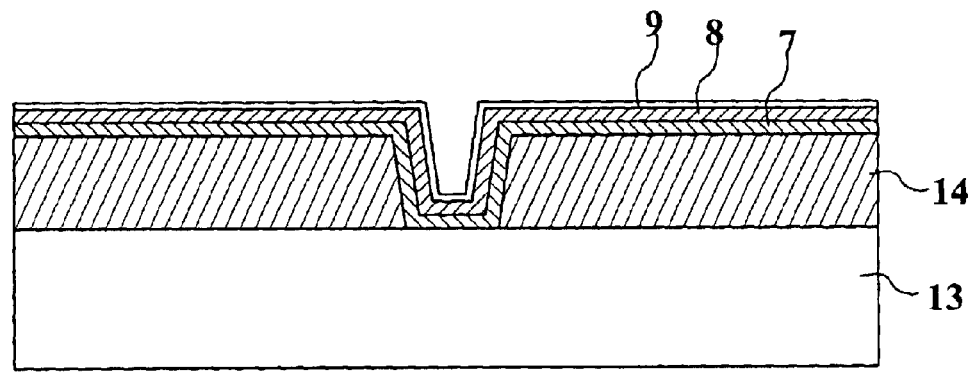

As can be seen in FIG. 2D, a reflective layer 9 is deposited. The reflective material can be gold, silver, titanium, aluminum or other metal, or an alloy of more than one metal, though it is preferably aluminum deposited by PVD. The thickness of the metal layer can be from 50 to 2000 Å, preferably around 500 Å. An optional metal passivation layer (not shown) can be added, e.g., a 10 to 1100 Å silicon oxide layer deposited by PECVD on top of layer 9. Other metal deposition techniques can be used for depositing metal layer 9, such as chemical fluid deposition and electroplating. After depositing layer 9, photoresist is spun on and patterned, followed by etching of the metal layer with a suitable metal etchant. In the case of an aluminum layer, a chlorine (or bromine) chemistry can be used (e.g., a plasma/RIE etch with $Cl_2$ and/or $BCl_3$ (or Cl2, CCl4, Br2, $CBr_4$, etc.) with an optional preferably inert diluent such as Ar and/or He). It should be noted that the reflective layer need not be deposited last, but rather could be deposited directly upon the sacrificial layer 14, between other layers defining the micromirror element, or as the only layer defining the micromirror element. However, in some processes it may be desirable to deposit a metal layer after a dielectric layer due to the higher temperature at which many dielectrics are deposited.

Figure 2E:
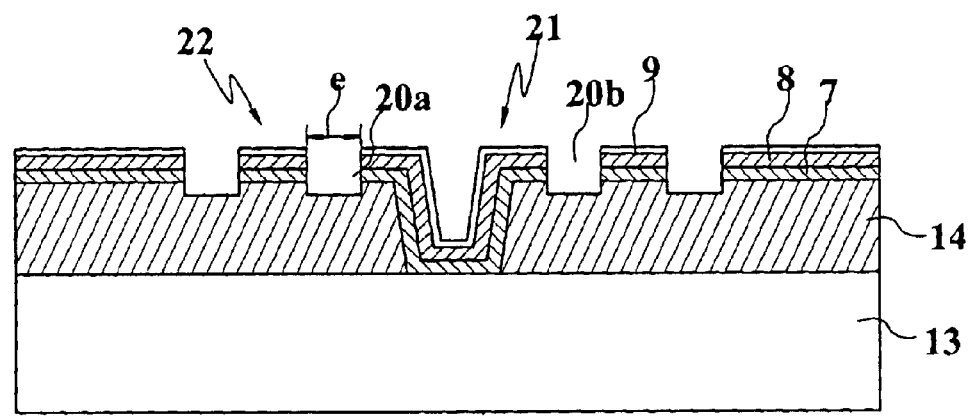

Relating to FIG. 2E, the first and second layers 7, 8 can be etched subsequent to the reflective layer with known etchants or combinations of etchants (depending upon the material used and level of isotropy desired). For example, the first and second layers can be etched with a chlorine chemistry or a fluorine (or other halide) chemistry (e.g., a plasma/RIE etch with $F_2$, $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$ all possibly with one or more optional inert diluents). Of course, if different materials are used for the first layer and the second layer, then a different etchant can be employed for etching each layer (plasma etching chemistry known in the art depending upon the materials used). If the reflective layer is deposited before the first and second layers, the etching chemistries used would be reversed. Or, depending upon the materials used, all layers could be etched together. Gaps 20a and 20b having a width "e" shown in FIG. 2E are for separating the post 21 from the micromirror body 22.

Figure 3A:
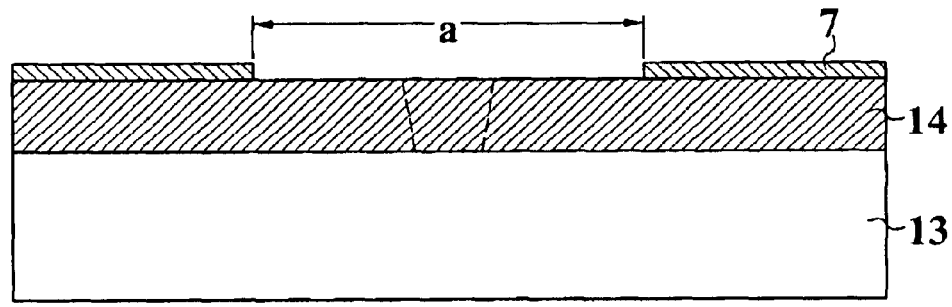
FIGS. 3A to 3D are cross sectional views of the same method shown in FIGS. 2A to 2E, but taken along line 3—3 of FIG. 1.
Figure 3B:
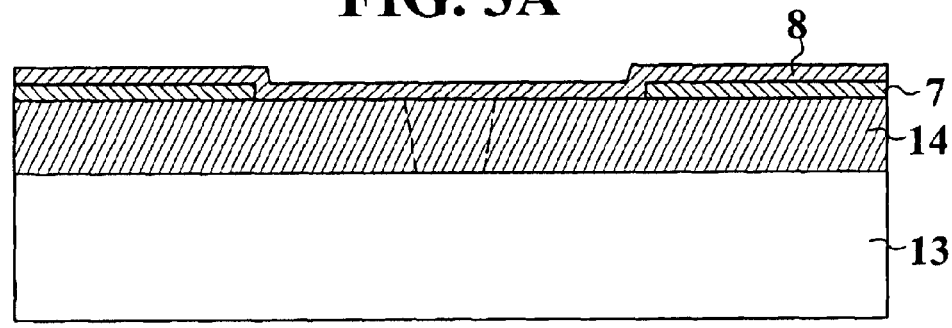
Figure 3C:
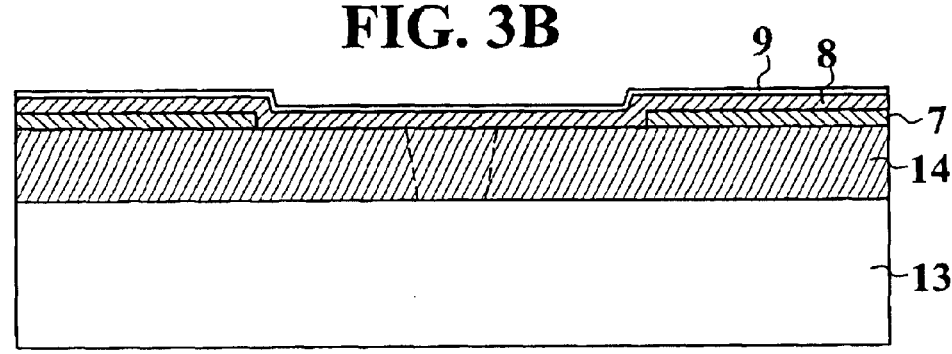
Figure 3D:
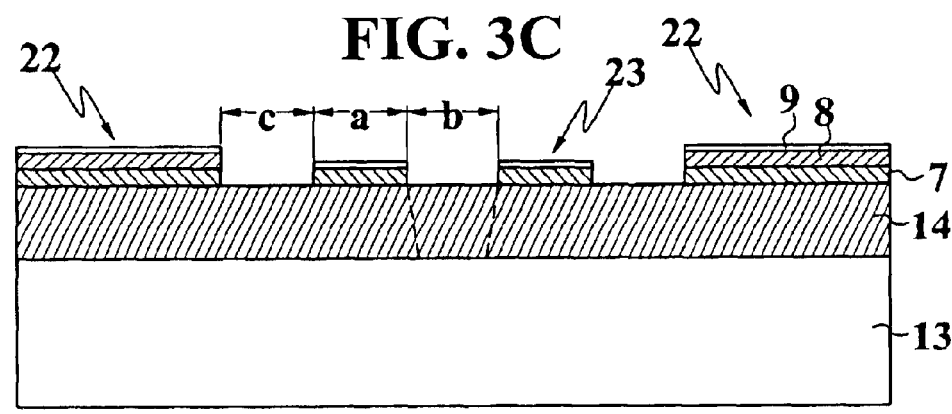

FIGS. 3A to 3D illustrate the same process taken along a different cross section (cross section 3—3 in FIG. 1) and show the light transmissive substrate 13, on which is deposited a sacrificial layer 14. On sacrificial layer 14 is deposited structural layer 7. As can be seen in FIGS. 3B and 3C, a part of layer 7 is removed prior to adding layers 8 and 9. This portion removed is in the area where the hinge is to be formed, and allows for increased flexibility in the hinge area. This "thinning" of the hinge area in this way, is set forth in U.S. Provisional Patent Application 60/178,902 to True et al., filed Jan. 28, 2000, and in U.S. patent application Ser. No. 09/767,632 to True et al filed Jan. 22, 2001, the subject matter of each incorporated herein by reference. After removing portions of layer 7, layers 8 and 9 are added, followed by patterning of layers 7, 8 and 9 as set forth above. As can be seen in FIG. 3D, hinges 23 have width "a" that can be from 0.1 to 10 um, preferably around 0.7 um. The hinges 23 are separated from each other by a gap "b" and from adjacent micromirror plates by gaps "c" that also can be from 0.1 to 10 um, preferably around 0.7 um.

The process steps mentioned generally above, can be implemented in a number of ways. For example, a glass wafer (such as a Corning 1737F, Eagle 2000, quartz or sapphire wafer) can be provided and coated with an opaque coating, such as a Cr, Ti, Al, TaN, polysilicon or TiN or other opaque coating at a thickness of 2000 angstroms (or more depending upon the material) on the backside of the wafer, in order to make the transparent substrate temporarily opaque for handling. Then, in accordance with FIGS. 1–4, after an optional adhesion layer is deposited (e.g., a material with dangling silicon bond such as SiNx—or SiOx, or a conductive material such as vitreous carbon or indium tin oxide) then a sacrificial material of hydrogenated amorphous silicon is deposited (gas SiH4 (200 sccm), 1500 sccm of Ar, power=100 W, pressure=3.5T, temp=380 C, electrode spacing=350 mil; or gas=150 sccm of SiHy, 100 sccm of Ar, power=55 W, pressure=3 Torr, temp=380 C, electrode spacing=350 mil; or gas=200 sccm SiH4,1500 sccm Ar, power=100 W, temp=300 C, pressure 3.5 T; or other process points in between these settings) on the transparent wafer at a thickness of 5000 Angstroms in a plasma enhanced chemical vapor deposition system such as an Applied Materials P5000. Or, the sacrificial material could be deposited by LPCVD at 560 C, along the lines set forth in U.S. Pat. No. 5,835,256 to Huibers et al., incorporated herein by reference. Or, the sacrificial material could be deposited by sputtering, or could be a non-silicon containing material such as an organic material (to be later removed by, e.g., plasma oxygen ash). The a-Si is patterned (photoresist and etched by a chlorine chemistry, e.g., Cl2, BCl3 and N2), so as to form holes for attachment of the micromirror to the glass substrate. A first layer of silicon nitride, for creating stiffness in the micromirror and for connecting the micromirror to the glass, is deposited by PECVD (RF power=150 W, pressure=3 Torr, temp=360 C, electrode spacing=570 mils, gas=N2/SiH4/NH3 (1500/25/10); or RF power=127 W, pressure=2.5 T, temp=380 C, gas =N2SiH4/NH3 (1500/25/10 sccm), electrode spacing=550 mil, or other process parameters could be used, such as power at 175 W and pressure at 3.5 Torr) at a thickness of 900 Angstroms and is patterned (pressure=800 mT, RF power=100 to 200 W, electrode spacing=0.8 to 1.1 mm, gas=CF4/CHF3/Ar (60 or 70/40 to 70/600 to 800 sccm, He=0 to200 sccm), so as to remove the silicon nitride in areas in which the micromirror hinges will be formed. Next, a second layer of silicon nitride is deposited by PECVD (RF power=127 W, pressure=2.5 T, temp=380 C, gas=N2/SiH4/NH3 (1500/25/10 sccm), electrode spacing=550 mil) at a thickness of 900 Angstroms. Then, Al is sputtered onto the second silicon nitride layer at a thickness of 500 Angstroms at a temp of from 140 to 180 C, power =2000 W, Ar=135 sccm. Or, instead of Al, the material could be an aluminum alloy (Al—Si (1%), Al—Cu (0.5%) or AlSiCu or AlTi), as well as an implanted or target doped aluminum. The aluminum is patterned in the P5000 with a chlorine chemistry (pressure=40 mT, power=550 W, gas=BCl3/Cl2/N2=50/15/30 sccm). Then, the SiN layers are etched (pressure=100 mT, power=460 W, gas=CF4/N2 (9/20 sccm)), followed by ashing in a H2O+O2+N2 chemistry in plasma. Next, the remaining structures are ACT cleaned (acetone+DI wafer solution) and spun dry. (This clean can also be done with EKC Technology's EKS265 photoresist residue remover or other solvent based cleaner). After resist coating the frontside of the wafer having the microstructures thereon, the backside TiN is etched in a BCl3/Cl2/CF4 chemistry in plasma (or other metal etchant from CRC Handbook of Metal Etchants)—or polished or ground off using CMP, or removed with acid vapor such as HF—followed by a second ACT clean (acetone+DI wafer solution) and a second spin dry. The wafer is singulated into individual die and each die is exposed to 300 W CF4 plasma (pressure=150 Torr, 85 sccm for 60 seconds, followed by 300 sec etch in a mixture of He, XeF2 and N2 (etch pressure 158 Torr). The etch is performed by providing the die in a chamber of N2 at around 400 Torr. A second area/chamber has therein 3.5 Torr XeF2 and 38.5 Torr He. A barrier between the two areas/chambers is removed, resulting in the combined XeF2, He and N2 etching mixture.

Or, the transparent wafer (e.g., Corning 1737 F) is coated with TiN at a thickness of 2000 angstroms on the backside of the glass wafer. Then, in accordance with FIGS. 1–4, without an adhesion layer, a sacrificial material of hydrogenated amorphous silicon is deposited (power=100 W, pressure=3.5 T, temp=300 C, SiH4=200 sccm, Ar=1500 sccm, or pressure=2.5 Torr, power=50 W, temp=360 C, electrode spacing=350 mils, SiH4 flow=200 sccm, Ar flow=2000 sccm) on a glass wafer at a thickness of 5300 Angstroms in an Applied Materials P5000. The a-Si is patterned (photoresist and etched by a chlorine chemistry, e.g., Cl2, BCl3 and N2–50 W), so as to form holes for attachment of the micromirror to the glass substrate. A first layer of silicon nitride, for creating stiffness in the micromirror and for connecting the micromirror to the glass, is deposited by PECVD (pressure=3 Torr, 125 W, 360 C, gap=570, SiH4=25 sccm, NH3=10 sccm, N2=1500 sccm)) at a thickness of 900 Angstroms and is patterned (CF4/CHF3), so as to remove the silicon nitride in areas in which the micromirror hinges will be formed. Next, a second layer of silicon nitride is deposited by PECVD (same conditions as first layer) at a thickness of 900 Angstroms. Then, Al is sputtered (150 C) onto the second silicon nitride layer at a thickness of 500 Angstroms. The aluminum is patterned in the P5000 with a chlorine chemistry (BCl3, Cl2, Ar). Then, the SiN layers are etched (CHF3, CF4), followed by ashing in a barrel asher (O2, CH3OH at 250 C). Next, the remaining structures are cleaned with EKC Technology's EKS265 photoresist residue remover. After resist coating the frontside of the wafer having the microstructures thereon, the backside TiN is etched in a SF6/Ar plasma, followed by a second clean and a second spin dry.

After depositing the sacrificial and structural layers on a wafer substrate, the wafer is singulated and each die then is placed in a Drytek parallel plate RF plasma reactor. 100 sccm of CF4 and 30 sccm of O2 flow to the plasma chamber, which is operated at about 200 mtorr for 80 seconds. Then, the die is etched for 300 seconds at 143 Torr etch pressure (combined XeF2, He and N2). The etch is performed by providing the die in a chamber of N2 at around 400 Torr. A second area/chamber has therein 5.5 Torr XeF2 and 20 Torr He. A barrier between the two areas/chambers is removed, resulting in the combined XeF2, He and N2 etching mixture. The above could also be accomplished in a parallel plate plasma etcher with power at 300 W CF4 (150 Torr, 85 sccm) for 120 seconds. Additional features of the second (chemical, non-plasma) etch are disclosed in U.S. patent application Ser. No. 09/427,841 to Patel et al. filed Oct. 26, 1999, and U.S. patent application Ser. No. 09/649,569 to Patel et al. filed Aug. 28, 2000, the subject matter of each being incorporated herein by reference.

Figure 11A:
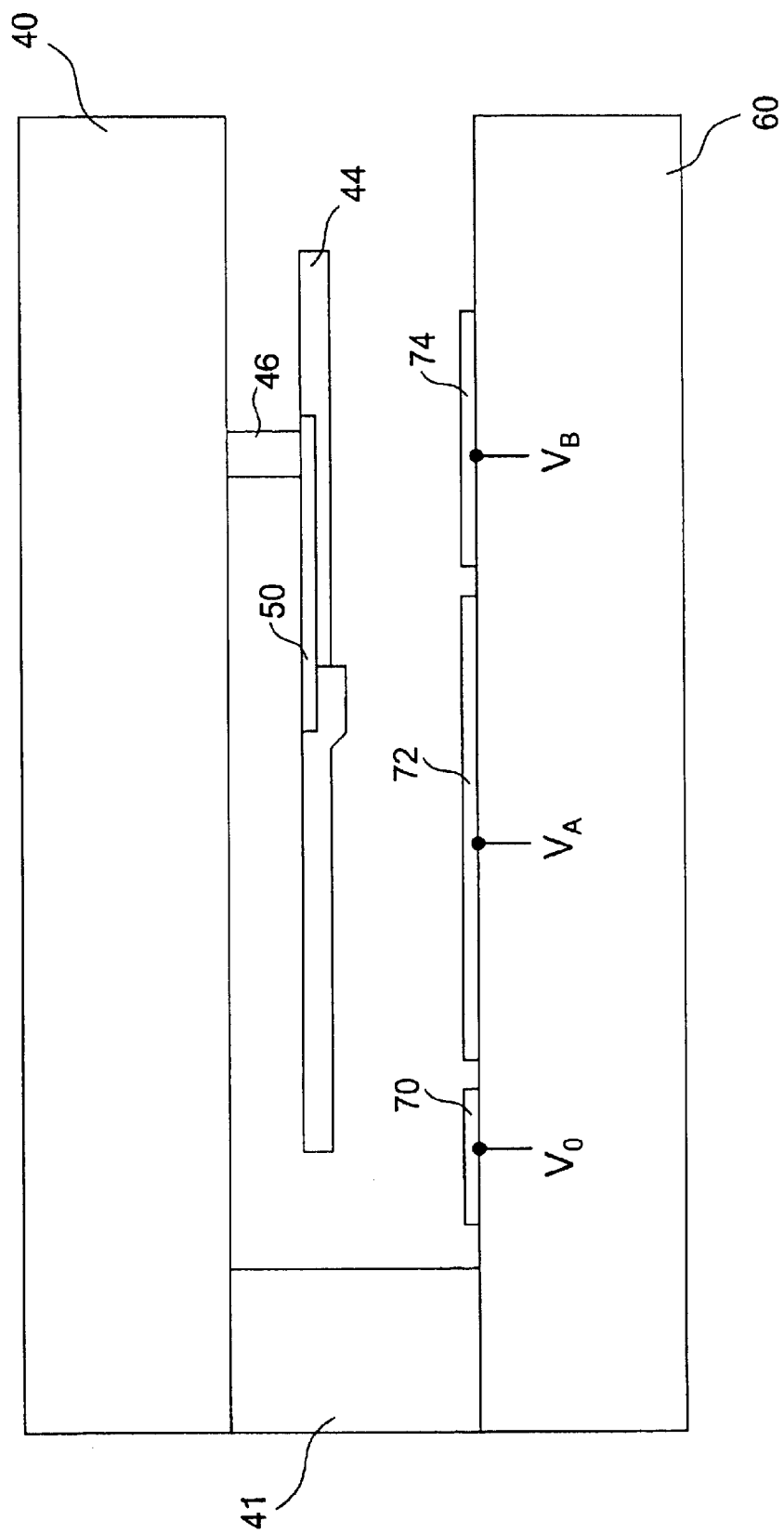
FIGS. 11A to 11C are cross sectional views showing actuation of a micromirror made in accordance with the method illustrated in FIGS. 10A to 10D.

Though the hinge of each micromirror can be formed essentially in the same plane as the micromirror element (layers 7, 8 and 9 for the micromirror body vs. layers 8 and 9 for the micromirror hinge in FIG. 3D) as set forth above, they can also be formed separated from and parallel to the micromirror element in a different plane and as part of a separate processing step (after deposition of a second sacrificial material). This superimposed type of hinge is disclosed in FIGS. 8 and 9 of the previously-mentioned U.S. Pat. No. 6,046,840, and in more detail in U.S. patent application Ser. No. 09/631,536 to Huibers et al., filed Aug. 3, 2000, the subject matter of which being incorporated herein by reference. Whether formed with one sacrificial layer as in the Figures, or two (or more) sacrificial layers as for the superimposed hinge, such sacrificial layers are removed as will be discussed below, with a preferably isotropic etchant. This "release" of the micromirrors can be performed immediately following the above-described steps, or immediately prior to assembly with the circuitry on the second substrate. If the circuitry, electrodes and micromirrors are not formed on the same substrate, then after forming the micromirrors on a light transmissive substrate as set forth above, a second substrate is provided that contains a large array of electrodes on a top metal layer (e.g., metal 3) of the substrate (e.g., a silicon wafer). As can be seen in FIG. 11A, a light transmissive substrate 40 with an array of micromirrors 44 formed thereon as discussed above, is bonded to a second substrate 60 having circuitry and electrodes at voltages $V_0$, $V_A$ and $V_8$ formed as a last layer thereon (a single electrode per micromirror could also be used for a micromirror embodiment with a single direction of movement such as that illustrated in FIG. 1). The micromirrors 44 are kept spaced apart from the electrodes on substrate 60 by spacers 41 (e.g., photoresist spacers adjacent every micromirror and/or spacers deposited within epoxy when bonding substrate 40 to substrate 60. One or more electrodes on the circuit substrate electrostatically control a pixel (one micromirror on the upper optically transmissive substrate) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. patent application Ser. No. 09/564,069 to Richards, the subject matter of which is incorporated herein by reference. The assembly of the first and second substrates is set forth in more detail in the Ilkov et al. patent applications referred to previously. Many different types of wafer bonding are known in the art, such as adhesive, anodic, eutectic, fusion, microwave, solder and thermocompression bonding.

The release of the micromirrors of the present invention can be a single or multi-step process, with the type of process depending upon the type of sacrificial material used. In one embodiment of the invention, the first etch is performed that has relatively low selectivity (e.g., less than 200:1, preferably less than 100:1 and more preferably less than 10:1), and a second etch follows that has higher selectivity (e.g., greater than 100:1, preferably greater than 200:1 and more preferably greater than 1000:1). Such a dual etching is set forth further in U.S. patent application Ser. No. 60/293,092 to Patel et al., filed May 22, 2001, incorporated herein by reference. Of course other release methods could be used, depending upon the sacrificial material. For example, if a photoresist or other organic material is the sacrificial material, oxygen plasma ashing or a supercritical fluid release could be used. Plasmas containing pure oxygen can produce species that attack organic materials to form H2O, CO and CO2 as products and do not etch SiO2, Al or Si. Or, if the sacrificial material is SiO2, then an etchant such as an isotropic dry etchant (CHF3+O2, NF3 or SF6) could be used. If the sacrificial material is silicon nitride, then fluorine atoms could be used to isotropically etch the silicon nitride (e.g., CF4/O2, CHF3/O2, CH2F2 or CH3F plasmas). If the sacrificial material is amorphous silicon, then fluorine atoms in the form of XeF2, BrF3 or BrCl3 could be used. If the sacrificial layer is aluminum, then a chlorine chemistry (BCl3, CCl4, SiCl4) could be used. Of course any etchant (and sacrificial material) would be selected at least in part based upon the amount of undercut etching needed.

Figure 4A:
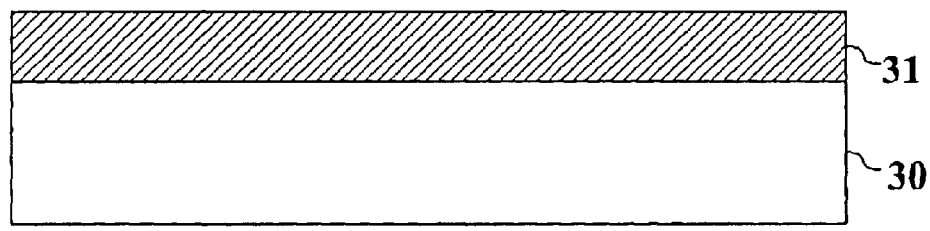
FIGS. 4A to 4J are cross sectional views illustrating a further method for making micromirrors for the present invention.
Figure 4B:
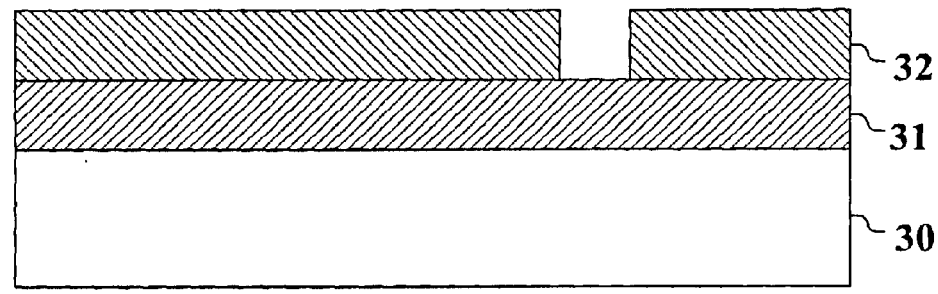
Figure 4C:
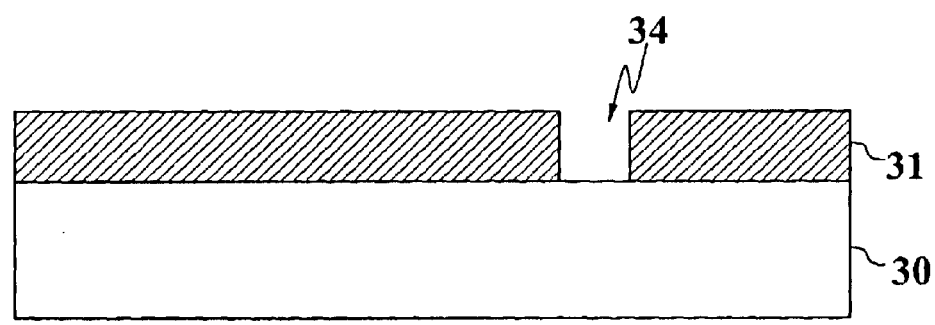
Figure 4D:
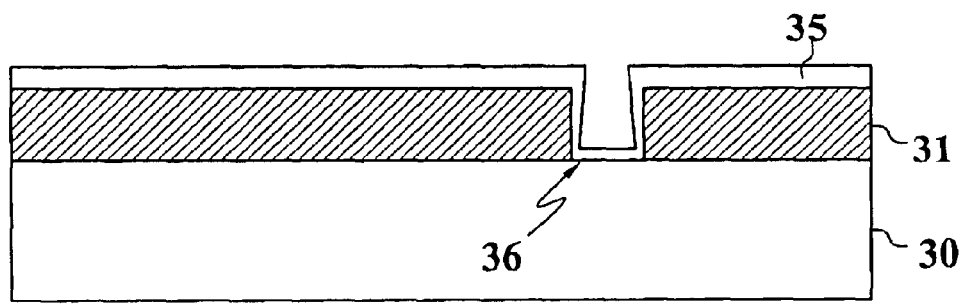

Another process for forming micromirrors illustrated in FIGS. 4A to 4J. As can be seen in FIG. 4A, a substrate 30 (this can be any suitable substrate, such as a glass/quartz substrate or a semiconductor circuit substrate) that has deposited thereon a sacrificial material 31. Any suitable sacrificial material can be used, preferably one that has a large etching selectivity ratio between the material being etched and the sacrificial material. One possible sacrificial material is an organic sacrificial material, such as photoresist, or other organic materials such as set forth in U.S. patent application Ser. No. 60/298,529 filed Jun. 15, 2001 to Reid et al. Depending upon the exact make-up of the structural layer(s), other known MEMS sacrificial materials, such as amorphous silicon or PSG could be used. If the sacrificial material is not directly patternable, then a photoresist layer 32 is added and developed to form one or more apertures (FIG. 4B). Then, as can be seen in FIG. 4C, apertures 34 are etched into the sacrificial material 31 and the photoresist 32 is removed. As can be seen in FIG. 4D, a (preferably conductive) layer 35 is deposited that will ultimately form at least the flexible portions for the MEMS device (in this example a micromirror structure). Layer 35 can also form the posts 36 for attaching the micromirror to the substrate, or even all or part of the micromirror body. As will be discussed further herein, the conductive layer 35 in a preferred embodiment of the invention comprises a metal-Si,Al,B-nitride, preferably the metal is a transition metal, in particular a late transition metal. Layer 35 could also be a plurality of (preferably conductive) layers, or one conductive layer among many other types of layers (structural dielectric layers, reflective layers, anti-stiction layers, etc.). Layer 35 need not be conductive, and depending upon the exact method, target material and atmosphere used in the deposition process, layer 35 could also be insulating.

Figure 4E:
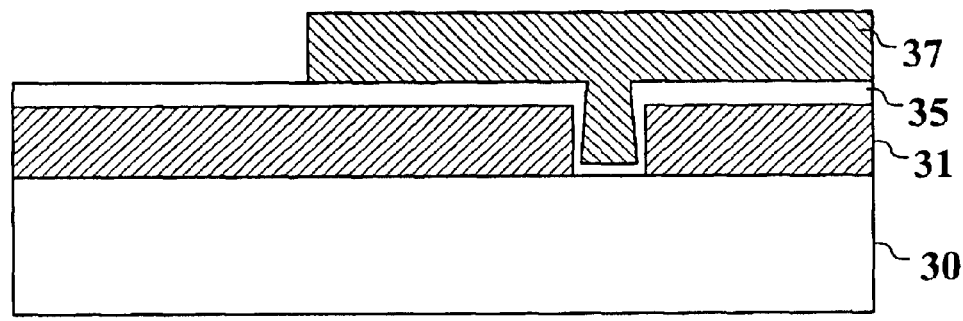
Figure 4F:
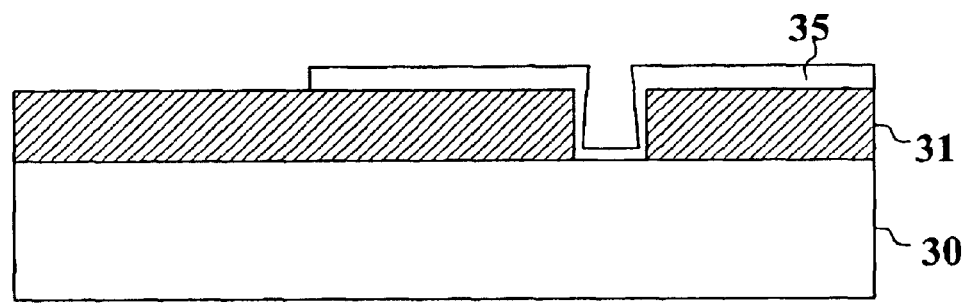
Figure 4G:
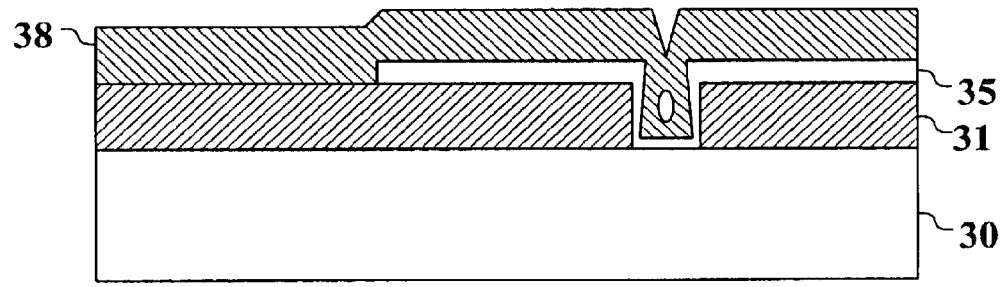
Figure 4H:
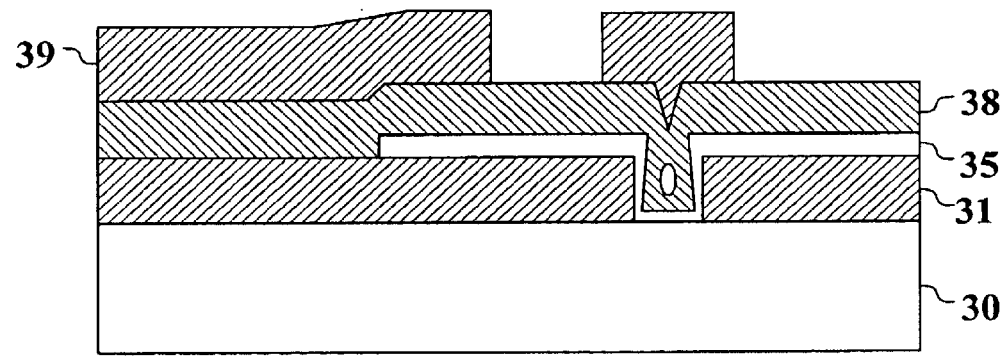
Figure 4I:
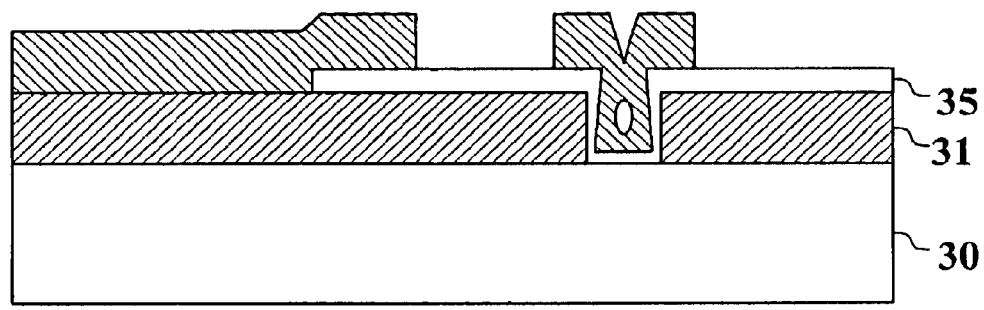
Figure 4J:
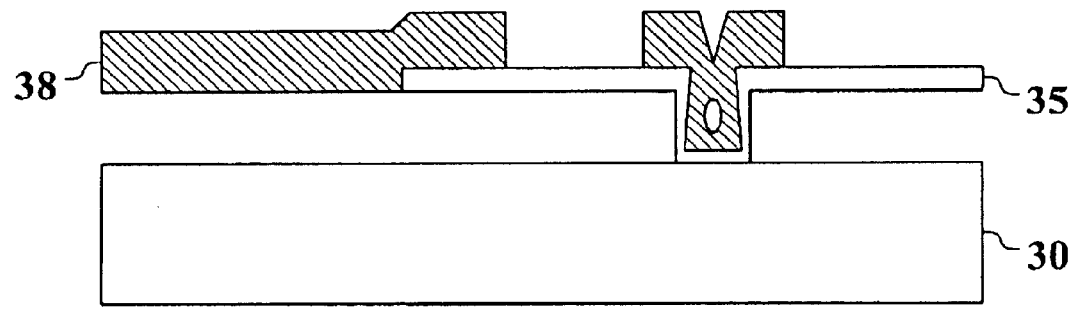

FIG. 4E shows the addition of photoresist 37 (patterned) followed by etching of a portion of the nitride layer(s) 35 and removal of the photoresist (FIG. 4F). Then, as can be seen in FIG. 4G, micromirror structural material layer 38 is deposited. The material can be conductive or insulating, and can be a plurality of layers. If the material is a single layer, it is preferably reflective (e.g., an aluminum or gold layer or metal alloy layer). Then, as can be seen in FIG. 4H, photoresist 39 is added and developed followed by (FIG. 4I) etching/removing portions of the layer 38 (such as in the area of the parts that will flex in operation). Finally, as can be seen in FIG. 4J, the sacrificial layer is removed to release the MEMS device so as to be free standing on the substrate. Not shown in FIG. 4 is circuitry that is formed on or in substrate 30 (if the substrate is a circuit substrate) or a light blocking layer on substrate 30 for improving automated handling of the substrate (if the substrate is a light transmissive substrate such as glass, quartz, sapphire, etc.).

As can be seen from FIGS. 4A to 4J, a free standing MEMS structure is created where layer 35 forms a flexible portion of the MEMS device, whereas layer 38 forms the structure that moves due to the flexible nature of layer 35. Layer 38, as can be seen, forms both the movable portion as well as the post or wall that holds the MEMS structure on the substrate 30. The movable element can be formed as a laminate of layers 38 and 35 (as well as additional layers if desired), or solely from layer 38, or even solely from layer 35. The make-up of the movable and flexible elements depend upon the ultimate stiffness or flexibility desired, the ultimate conductivity desired, the MEMS device being formed, etc.

The micromirrors formed in accordance with FIGS. 1 to 4 are preferably formed on a light transmissive substrate and have a non-deflected 'off' state and a deflected 'on' state. However, the micromirrors can be formed on the same substrate as micromirror actuation circuitry and electrodes. Also, both the 'on' and 'off' states of the micromirror can be a position other than a flat non-deflected state. In the embodiment illustrated in FIGS. 5–9, the micromirrors are formed on the same substrate as electrodes and circuitry for moving the micromirrors. And, the micromirrors not only have deflected 'on' and 'off' states, but the angle of deflection is different between 'on' and 'off'. As is illustrated in FIGS. 5A to 5G, a semiconductor substrate with circuitry and electrodes formed thereon (or therein) can be the starting substrate for making micromirrors in accordance with the present invention.

As can be seen in FIG. 5A, a semiconductor substrate 10 with circuitry for controlling the micromirror, has a patterned metal layer formed into discrete areas 12a to 12e thereon—typically aluminum (e.g., the final metal layer in a semiconductor process). A sacrificial layer 14 is deposited thereon, as can be seen in FIG. 5B. As in the previous embodiments, the sacrificial material can be selected from many materials depending upon the adjacent structures and etchant desired. In the present example, the sacrificial material is a novolac photoresist. As can also be seen in FIG. 5B, apertures 15a and 15b are formed in the sacrificial material by standard patterning methods for a novolac photoresist, so as to form apertures 15a to 15c connecting to metal areas 12a to 12c. After forming apertures 15a to 15c, as can be seen in FIG. 5C, plugs or other connections 16a to 16c are formed in accordance with standard plug forming methods. For example, Tungsten (W) could be deposited by CVD by a) silicon reduction: $2WF6+3Si \rightarrow 2W+3SiF4$ (This reaction is normally produced by allowing the WF6 gas to react with region of exposed solid silicon on a wafer surface at a temperature of about 300 C), b) hydrogen reduction: $WF6+3H2 \rightarrow W+6HF$ (This process is carried out at reduced pressures, usually at temperatures below 450 C), or c) silane reduction: $2WF6+3SiH4 \rightarrow 2W+3SiF4+6H2$ (This reaction (LPCVD at around 300 C) is widely used to produce a W nucleation layer for the hydrogen reaction). Other conductive materials, particularly other refractory metals, could be used for plugs 16a to 16c. After depositing a layer of the plug material, chemical mechanical polishing (CMP) is performed down to the sacrificial layer so as to form the plugs as shown in FIG. 5C. For some plug materials, it may be desirable to first deposit a liner in order to avoid peeling (e.g., for a tungsten plug, a TiN, TiW or TiWN liner could be deposited to surround the tungsten in the hole in the sacrificial material and later after release of the sacrificial layer).

As can be seen in FIG. 5D, a conductive layer is deposited and patterned so as to result in discrete metal areas 18a to 18c, each electrically connected to underlying metal areas 12a to 12c, respectively, via plugs 16a to 16c, respectively. The conductive layer can be any suitable material (aluminum, alloys of aluminum, alloys of other metals, conductive ceramic compounds, etc.) that is deposited by suitable methods such as physical vapor deposition or electroplating. The material should preferably have both conductive properties as well as a proper combination of hardness, elasticity, etc. (as will be seen, area 18c will act as a hinge for the micromirror being formed). Of course discrete areas 18a to 18c need not be formed at the same time if different materials or properties are desired from one discrete area to the next (likewise with the other areas formed in the device, such as areas 12a to 12e and plugs 18a to 18c). Naturally fewer process steps are involved if each discrete area within a layer is of the same material deposited at the same time. In a preferred embodiment, this conductive layer is either an aluminum alloy or a conductive binary or ternary (or higher) compound such as those disclosed in U.S. patent application Ser. No. 60/228,007 to Reid filed Aug. 23, 2000 and U.S. patent application Ser. No. 60/300,533 to Reid filed Jun. 22, 2001, both incorporated herein by reference, deposited by reactive sputtering. The appropriate etching chemistry is used to pattern the conductive layer (e.g., a chlorine chemistry for aluminum) so as to form discrete conductive areas 18a to 18c.

Figure 5E:
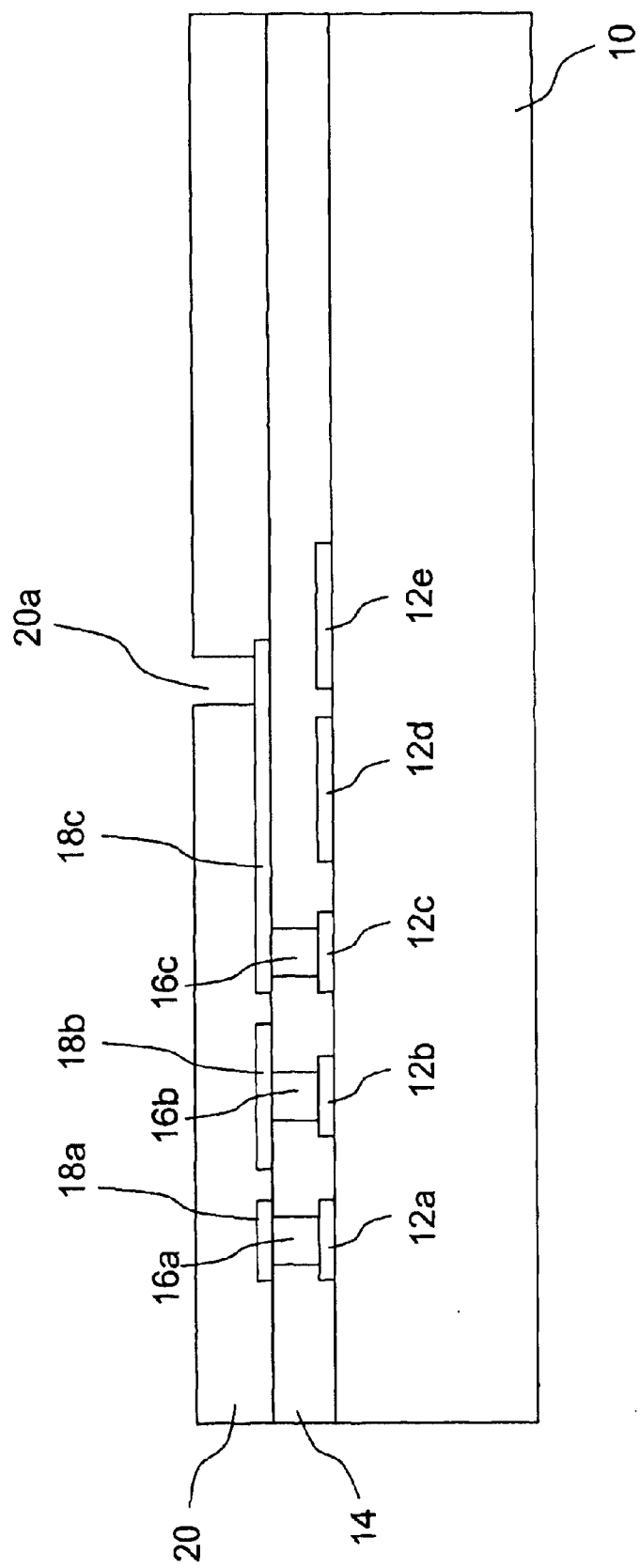
Figure 5F:
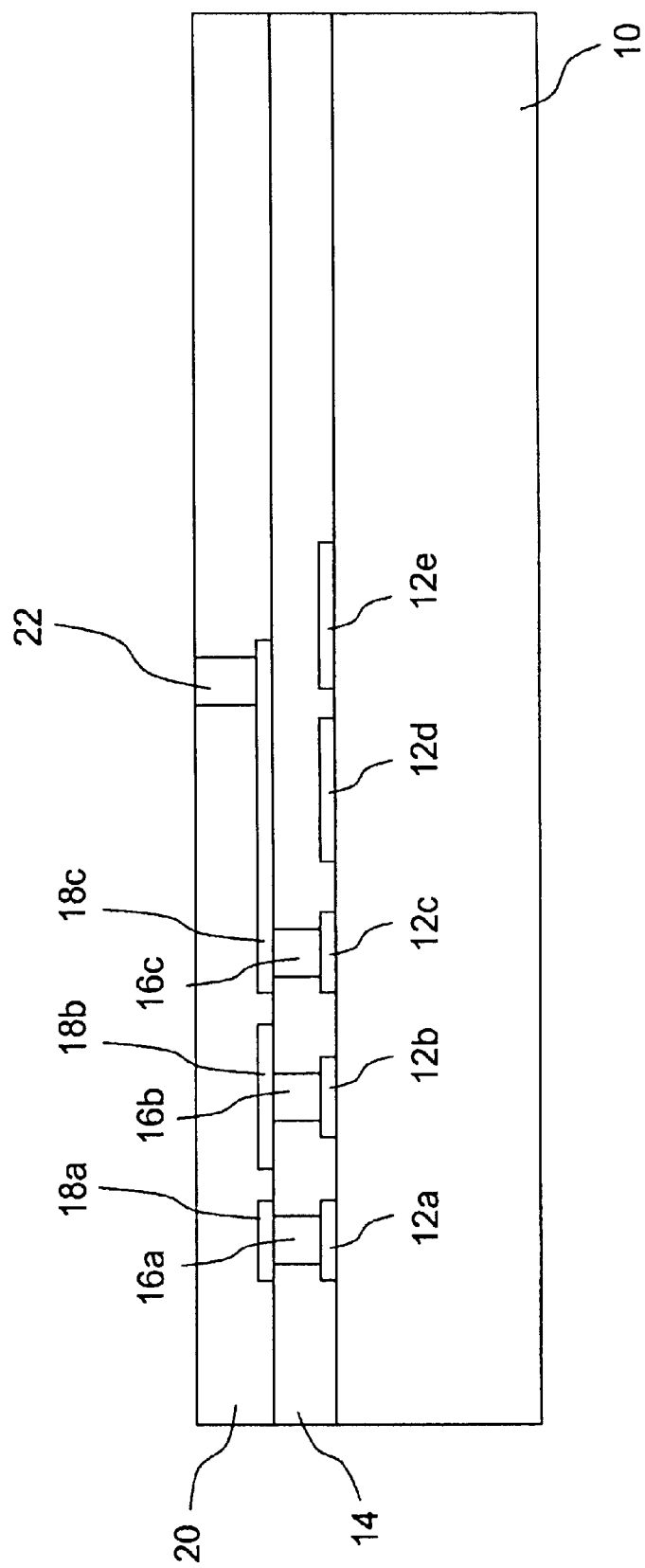
Figure 5G:
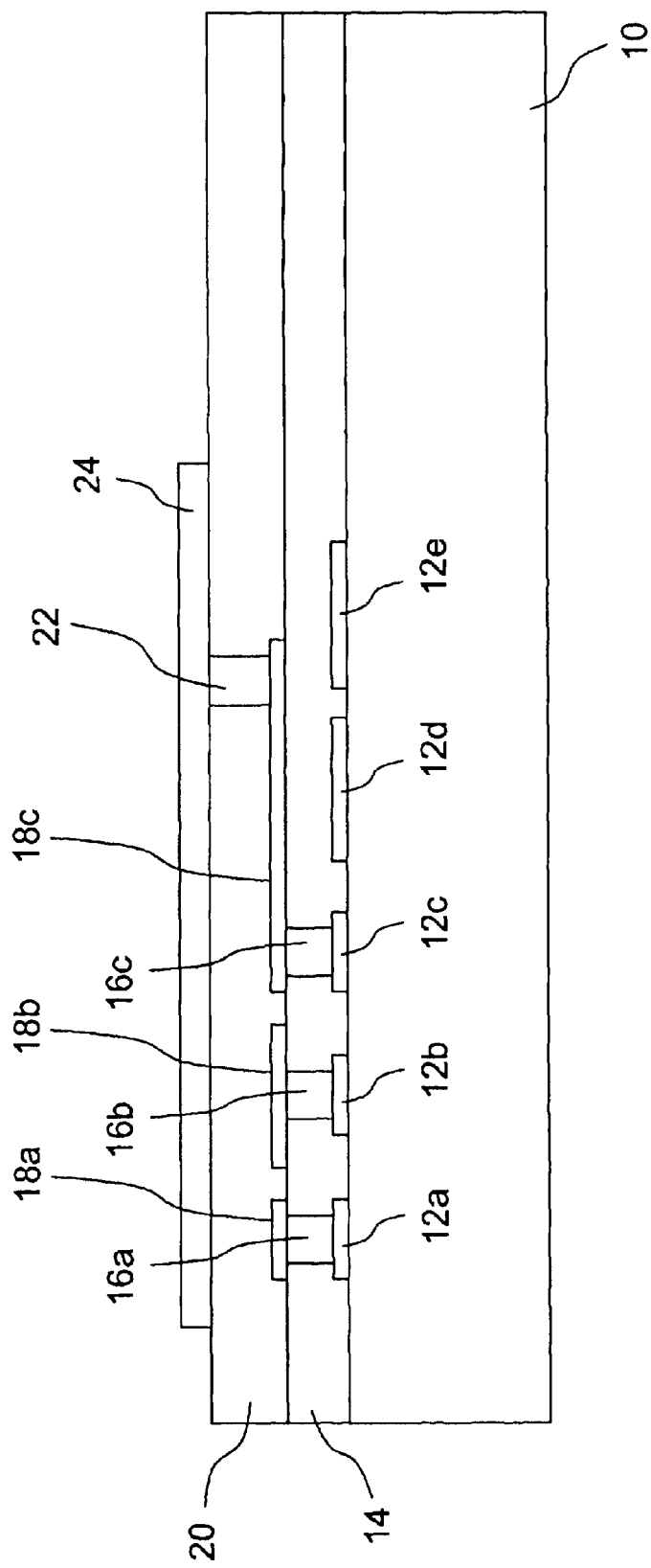
Figure 6C:
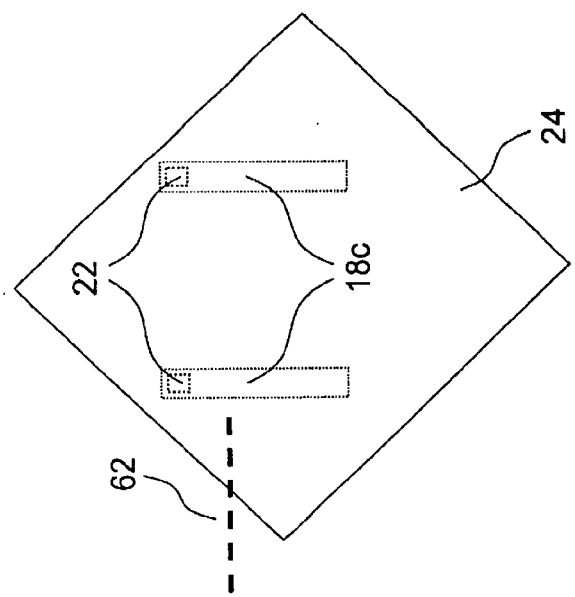
FIGS. 6A to 6C are plan views of different micromirror shape and hinge combinations.
Figure 6B:
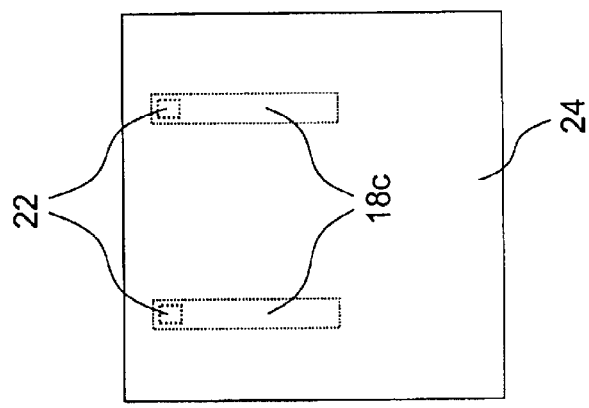
Figure 6A:
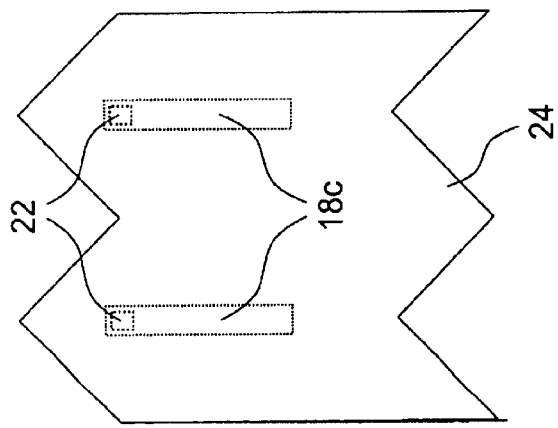
Figure 7:
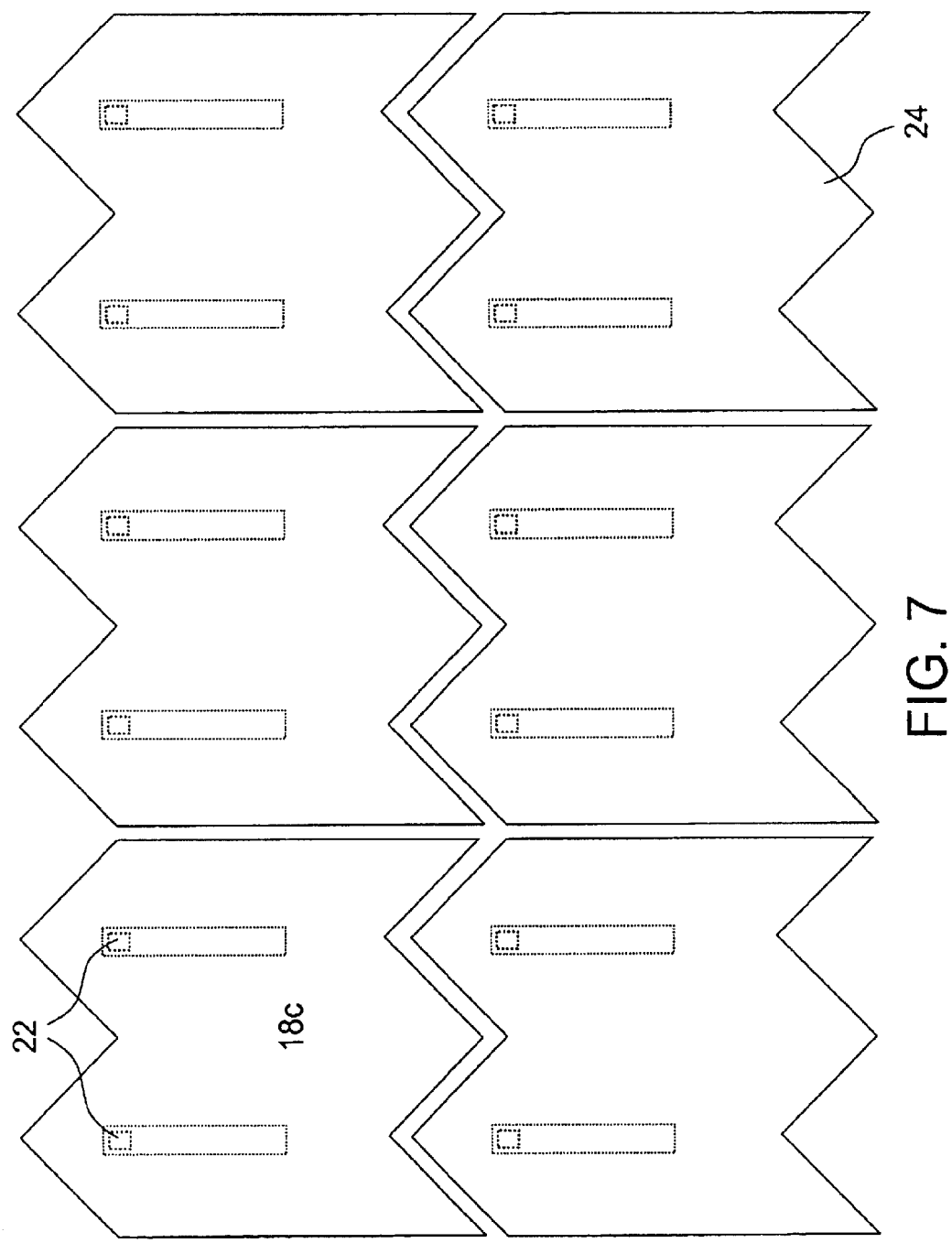
FIG. 7 is a plan view of a portion of a micromirror array with multiple micromirrors the same as in FIG. 6A.

As further illustrated in FIG. 5E, a second layer of sacrificial layer 20 is deposited that could be the same or different from the sacrificial material of layer 14 (preferably the material is the same so that both layers can be removed simultaneously). Then, layer 20 is patterned so as to form aperture 20a down to area 18c. As with forming apertures in sacrificial layer 14, this can be done with an additional layer of photoresist or layer 20 can be directly patterned if the material is a photoresist or other directly patternable material. As can be seen in FIG. 5F a plug or connection 22 is formed by depositing a preferably electrically conductive material on sacrificial layer 20, followed by chemical mechanical polishing, leaving plug 22 connected to discrete area ("hinge") 18c. Then, as can be seen in FIG. 5G, micromirror body 24 is formed by depositing a (preferably conductive) layer followed by patterning into the desired shape of the micromirror. Many micromirror shapes are possible, such as that illustrated in FIG. 6A, and as will be discussed in further detail herein. However, the micromirror shape in accordance with this example of the invention can have any shape, including square or diamond as shown in FIGS. 6B and 6C. Of course, those shapes that allow for tight packing of micromirrors and thus a high fill factor are preferred (such as the shape of the micromirror in FIG. 6A illustrated in a close fitting array in FIG. 7). Dotted line 62 in FIG. 6C (and later in FIG. 12) is the axis or rotation of the micromirror.

Figure 8:
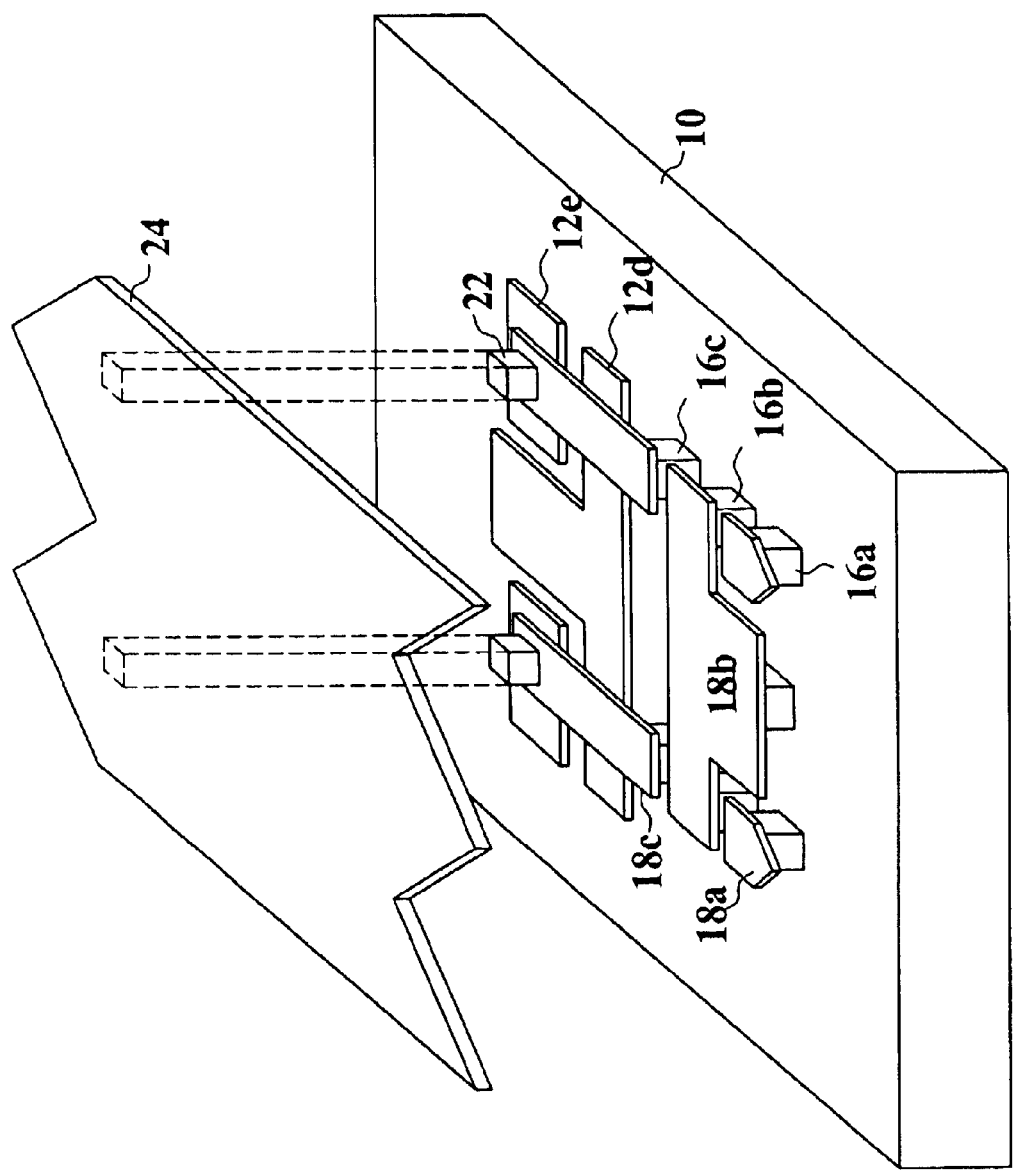
FIG. 8 is a partially exploded isometric view of a micromirror of one embodiment of the invention.

For various layers used in making the micromirror in accordance with FIGS. 5A to 5G are illustrated as single layers, however, each layer (whether structural or sacrificial) could be provided as a laminate e.g., one layer of the laminate having improved mechanical performance and another layer having improved conductivity. Also, though in the preferred embodiment the structural materials are conductive, it is possible to make micromirror element 24 (or a layer within a laminate 24) conductive, as well as actuation electrodes 12d and 18b (and layers/materials connecting electrodes 12d and 18b to the semiconductor substrate). Furthermore, the materials disclosed above (metal, metal alloys, metal-ceramic alloys, etc.) need not contain any metal, but could, for example be silicon (e.g., polycrystalline silicon) or a compound of silicon (e.g., Si3N4, SiC, SiO2, etc.). If Si3N4 is used as a structural material and amorphous silicon is used as the sacrificial material, xenon difluoride could be utilized as a gas phase etchant in order to remove the sacrificial amorphous silicon. If desired, the silicon or silicon compound (or other compound) used as a structural material could be annealed before and/or after removing the sacrificial layer to improve the stress characteristics of the structural layer(s). FIG. 8 is an exploded view of the micromirror formed in accordance with FIGS. 5A to 5G.

Figure 9C:
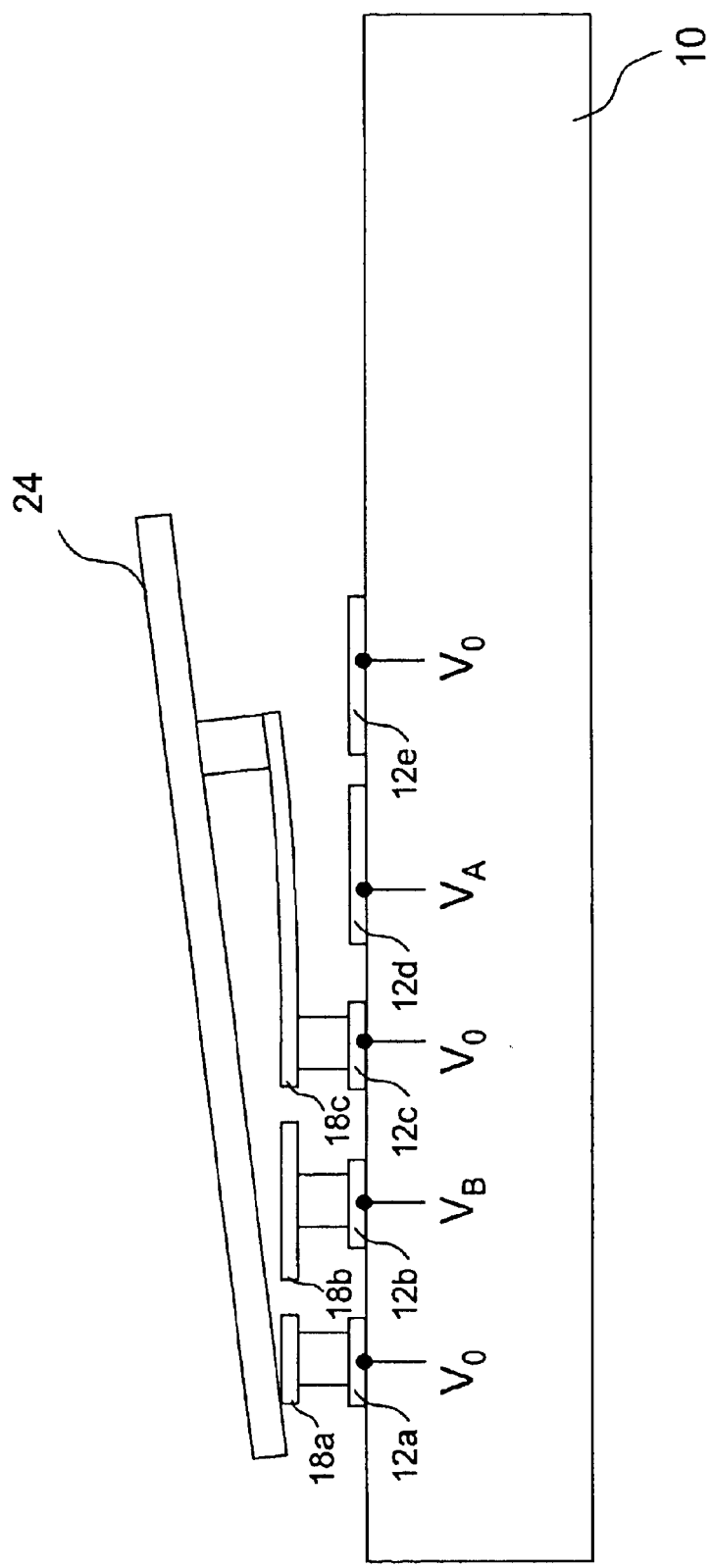

One of the final steps in making the micromirror is removing sacrificial layers 14 and 20. FIG. 9A is an illustration of the micromirror after removal of the two sacrificial layers, showing micromirror 24 connected to substrate 10 via post 22, hinge 18c, post 16c and metal areas 12c. The micromirror as shown in FIG. 9A is not moved or deflected, as no voltages are applied to any underlying electrodes (discrete metal areas formed in the above-described process) e.g., electrodes 18b or 12d. This non-deflected position is not the 'off' position for the micromirror, which for projection systems is generally the furthest angle away from the 'on' position (in order to achieve the best contrast ratio for the projected image). The 'on' state of the micromirror, that is, the position of the micromirror that deflects light into the acceptance cone of the collection optics, is illustrated in FIG. 9B. A voltage $V_A$ is applied to electrode 12d in order to electrostatically pull down micromirror plate 24 until the edge of plate 24 impacts electrode 12e. Both micromirror plate 24 and electrode 12e are at the same potential, in this example at a voltage of $V_0$. As illustrated in FIG. 9C, when a voltage $V_B$ is applied to electrode 18b, micromirror plate 24 deflects in an opposite direction, with its movement being stopped by electrode 18a. Both electrode 18a and micromirror plate 24 are at the same potential (in this example a $V_0$ voltage). Depending upon the size of electrode 18b vs. electrode 12d, and the distance between these electrodes and the micromirror plate 24, the voltages applied to electrodes 18b and 12d need not be the same. This deflected position illustrated in FIG. 9C is the 'off' position, and deflects light furthest away from the collection optics.

As can be seen by comparing FIGS. 9B and 9C, the off position forms a lower angle (with the substrate) than the on position. Hereafter, when referring to the on and off angles (or such angles relative to the substrate or a non-deflected micromirror position), a sign of the angle will be used (positive or negative relative to the substrate or non-deflected position). The sign is arbitrary, but signifies that the micromirrors rotate in one direction to an 'on' position and in an opposite direction to an 'off' position. The benefits of such asymmetry will be discussed in further detail below. In one example of the invention, the on position is from 0 to +30 degrees and the off position is from 0 to −30, with movement to the on position being greater than movement to the off position. For example, the on position could be from +10 to +30 degrees (or +12 to +20 degrees or +10 to +15 degrees) and the off position could be greater than 0 and between 0 and −30 degrees (or within a smaller range of between 0 and −10 or −12, or from −1 to −12, or −1 to −10 or −11 degrees, or −2 to −7 degrees). In another example, the micromirrors are capable of rotating at least +12 degrees to the on position and between −4 and −10 degrees to the off position. Depending upon the materials used for the hinges, greater angles could be used achieved, such as an on rotation from +10 to +35 degrees and an off rotation from −2 to −25 degrees (of course materials fatigue and creep can become an issue at very large angles). Not taking into account the direction of rotation, it is preferred that the on and off positions are at angles greater than 3 degrees but less than 30 degrees relative to the substrate, preferably the on position is greater than +10 degrees, and that the mirrors rotate 1 degree (or more) further in the on direction than in the opposite off direction.

FIGS. 10A to 10D illustrate a further method and micromirror structure. Variability in materials, layers, sacrificial etching, depositing of structural layers, etc. are as above with respect to the previously described processes. For the method illustrated in FIGS. 10A to 10D, the substrate 40 could be either a light transmissive substrate (to later be joined to a second substrate with circuitry and electrodes) or a semiconductor substrate already having circuitry and electrodes thereon. In the present example as will be seen in FIGS. 11A to 11B, the circuitry and electrodes are formed on a separate substrate.

Figure 10C:
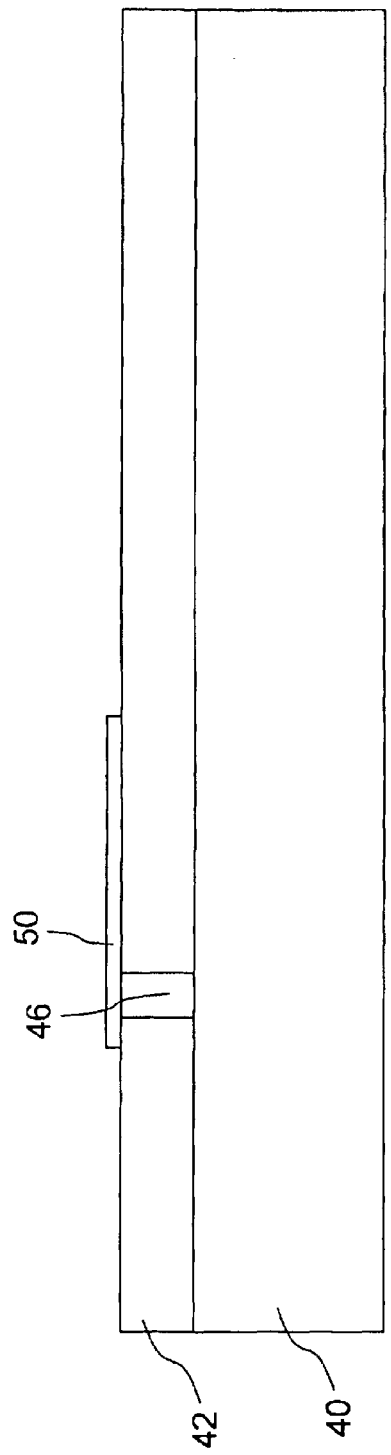
Figure 10D:
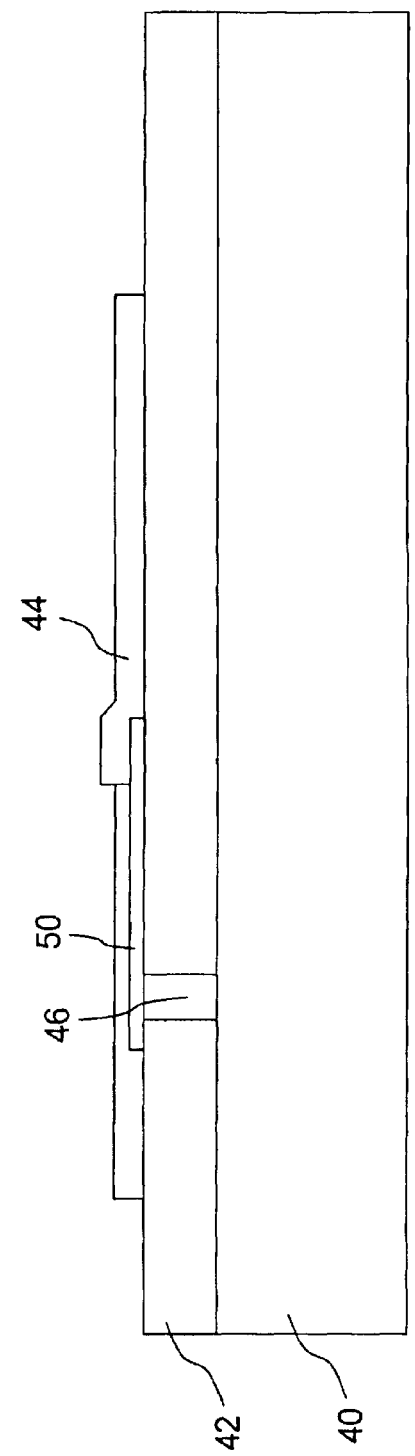

In FIG. 10A, a sacrificial layer 42 is deposited and patterned so as to form aperture 43. Then, as illustrated in FIG. 10B, plug 46 is formed (preferably as in the process of FIGS. 5A to 5G—deposit a metal, metal alloy or other conductive layer and planarize (e.g., by CMP) to form the plug). Then, as can be seen in FIG. 10C, a hinge 50 is formed by depositing an electrically conductive material (having suitable amorphousness, elasticity, hardness, strength, etc.). In the present example, the hinge (and/or micromirror) is an early transition metal silicon nitride such as Ta—Si—N, a late transition metal silicon nitride such as Co—Si—N or a metal or metal-ceramic alloy such as a titanium aluminum alloy, or a titanium aluminum oxide alloy. After depositing such a material, a photoresist is deposited and patterned so as to allow for etching/removal of all areas except for the hinge areas 50. Then, as can be seen in FIG. 10D, micromirror plate 44 is formed by first protecting the hinges with photoresist and then depositing and patterning a hinge structure layer so as to form micromirror plate 44 partially overlapping and therefore connecting with hinge 50. As in the other embodiments, an array of thousands or millions of such micromirrors is formed at the same time in an array.

Figure 11B:
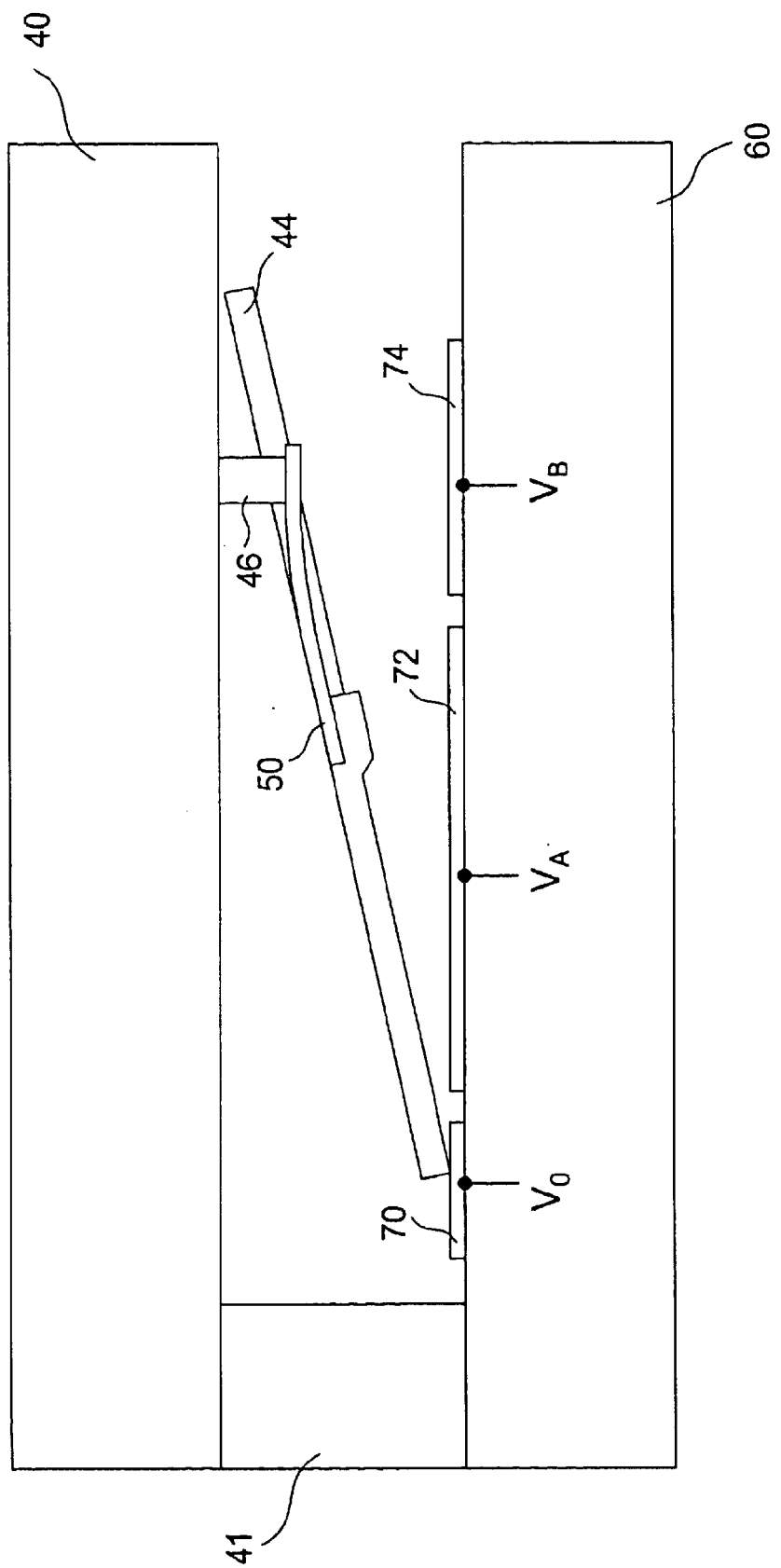
Figure 11C:
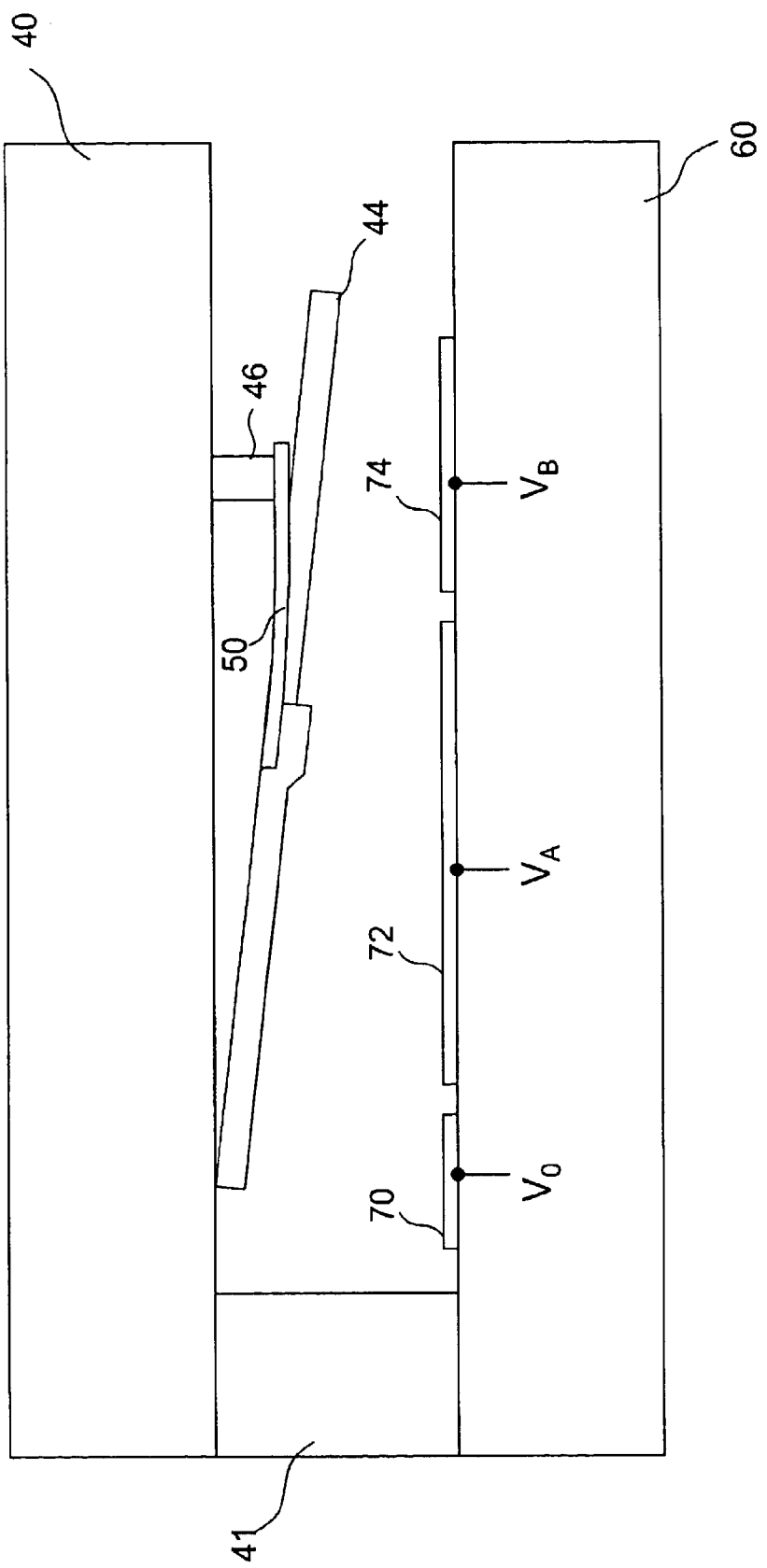
Figure 12:
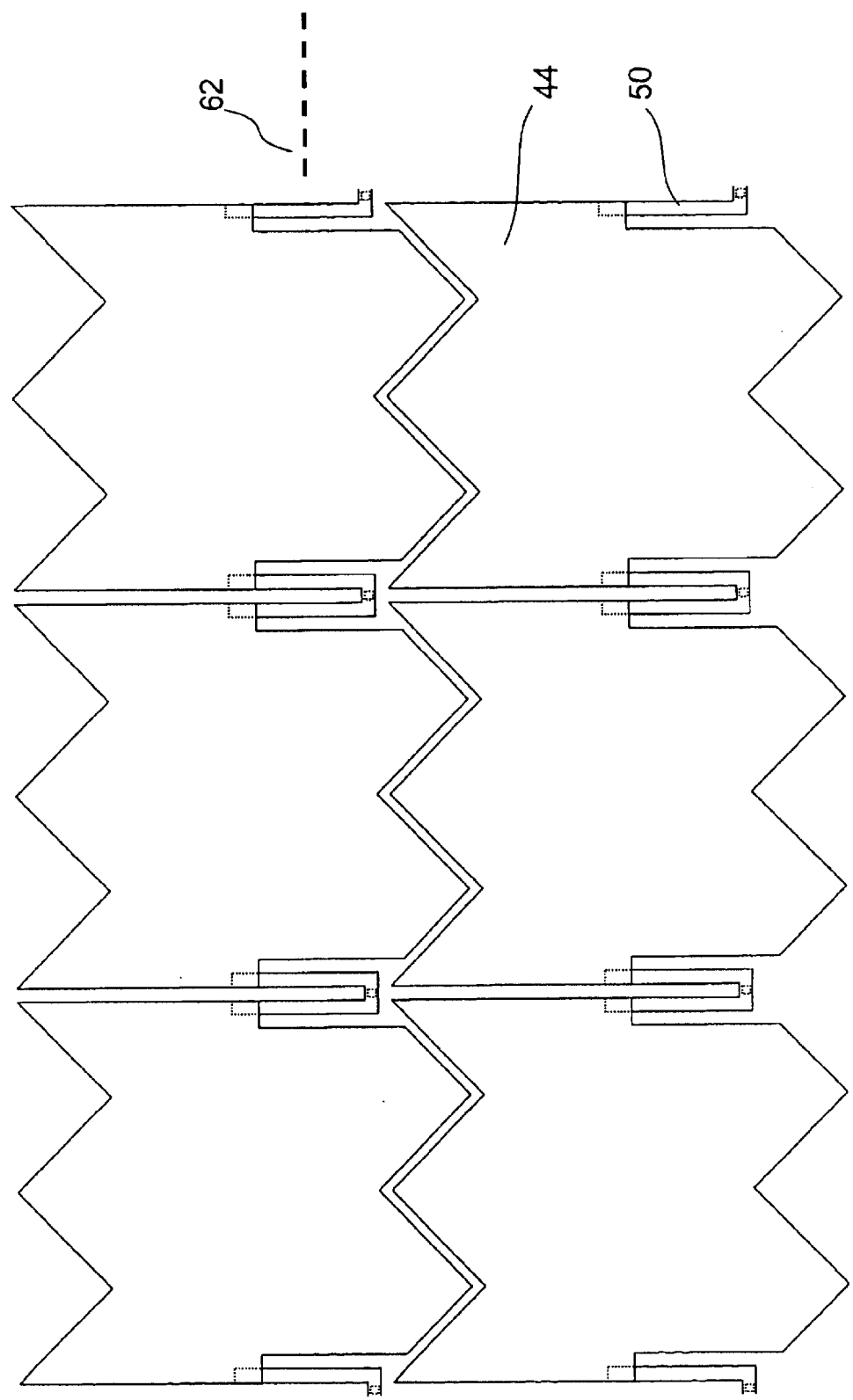
FIG. 12 is a plan view of multiple micromirrors in a micromirror array formed in accordance with the method of FIGS. 11A to 11C.
Figure 13:
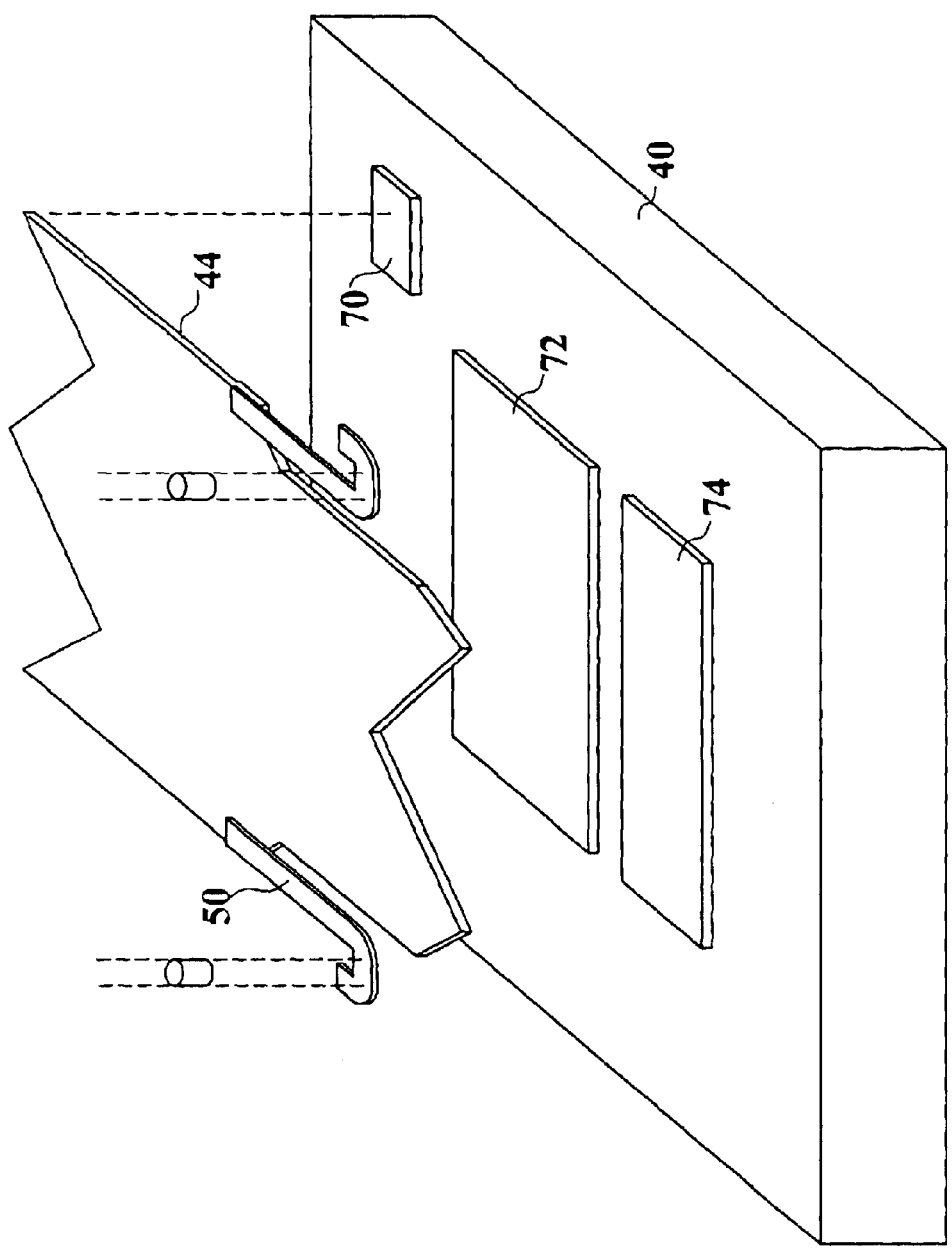
FIG. 13 is a partially exploded isometric view of the micromirror of FIG. 12.

Then, whether at the wafer or die level, the substrate with micromirrors is attached to a substrate with actuation circuitry and electrodes. There should be at least two electrodes per micromirror in the present example, one for each direction of deflection, and preferably a third for allowing the micromirror to stop movement (in one of the directions) by hitting a material at the same potential as the micromirror itself. The second substrate 60 with electrodes 72 and 74 for deflecting the micromirror, and a landing pad or electrode 70, is illustrated in FIG. 11A. The micromirror is in a non-deflected position in FIG. 11A. When a voltage $V_A$ is applied to electrode 72, micromirror 44 is deflected until it impacts electrode 70 (FIG. 11B). This is the 'on' position of the micromirror that allows light to enter into the collection optics of the system. It is possible to design the gap between the substrates so that the ends of micromirror plate 44 impact electrode 70 and substrate 40 at the same time. When a voltage $V_B$ is applied to electrode 74, micromirror plate 44 deflects in the opposite direction until the end of the micromirror impacts substrate 40. This is the 'off' position of the micromirror (FIG. 11C). Due to the position of the hinge 50 and post 46, the angle of the micromirror in this 'off' position is less than the angle of the micromirror in the 'on' position. An array of such micromirrors is illustrated in FIG. 12, and an exploded view of a micromirror made in accordance with the process of FIGS. 10A to 10D is shown in FIG. 13.

Figure 14A:
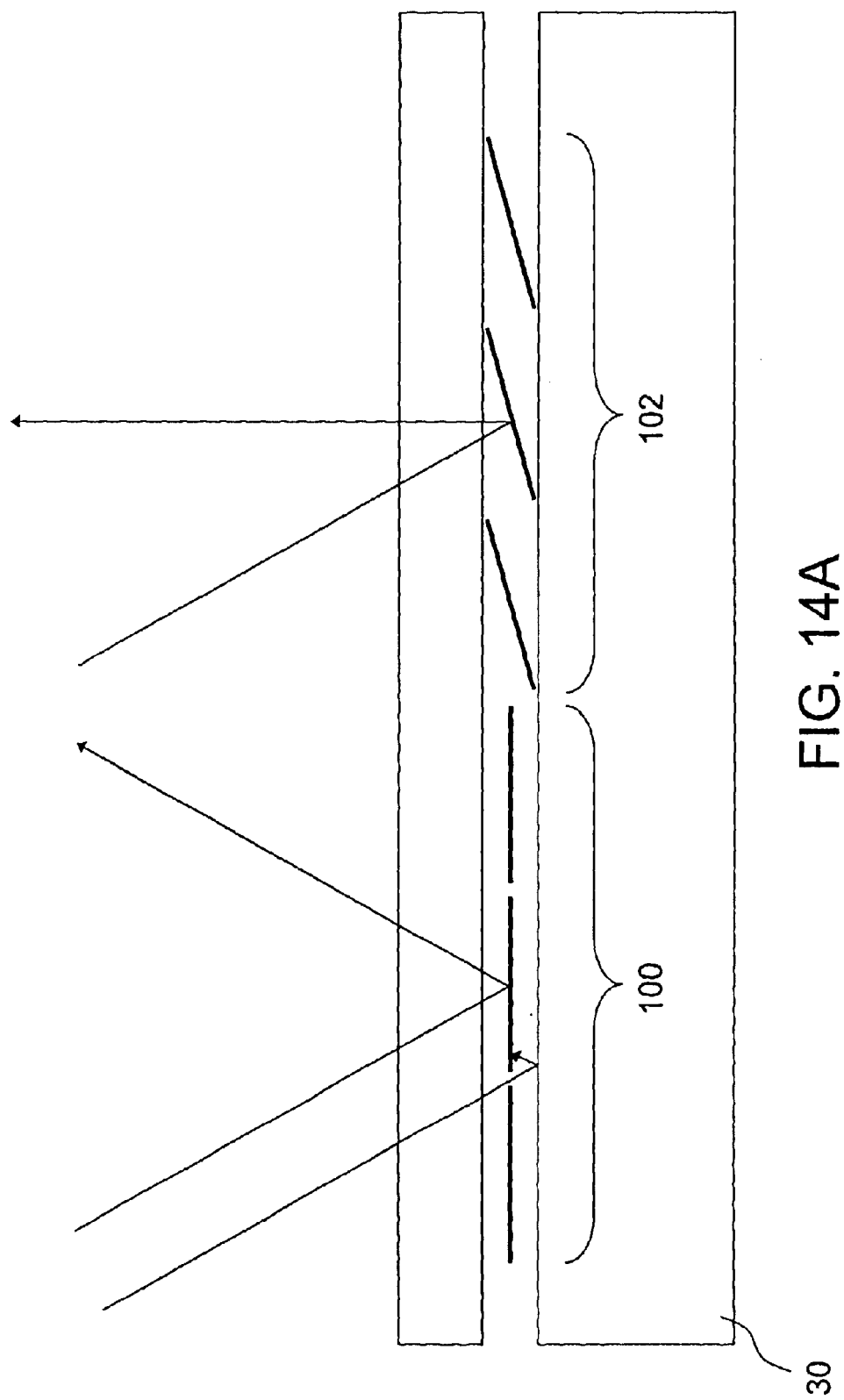
Figure 14B:
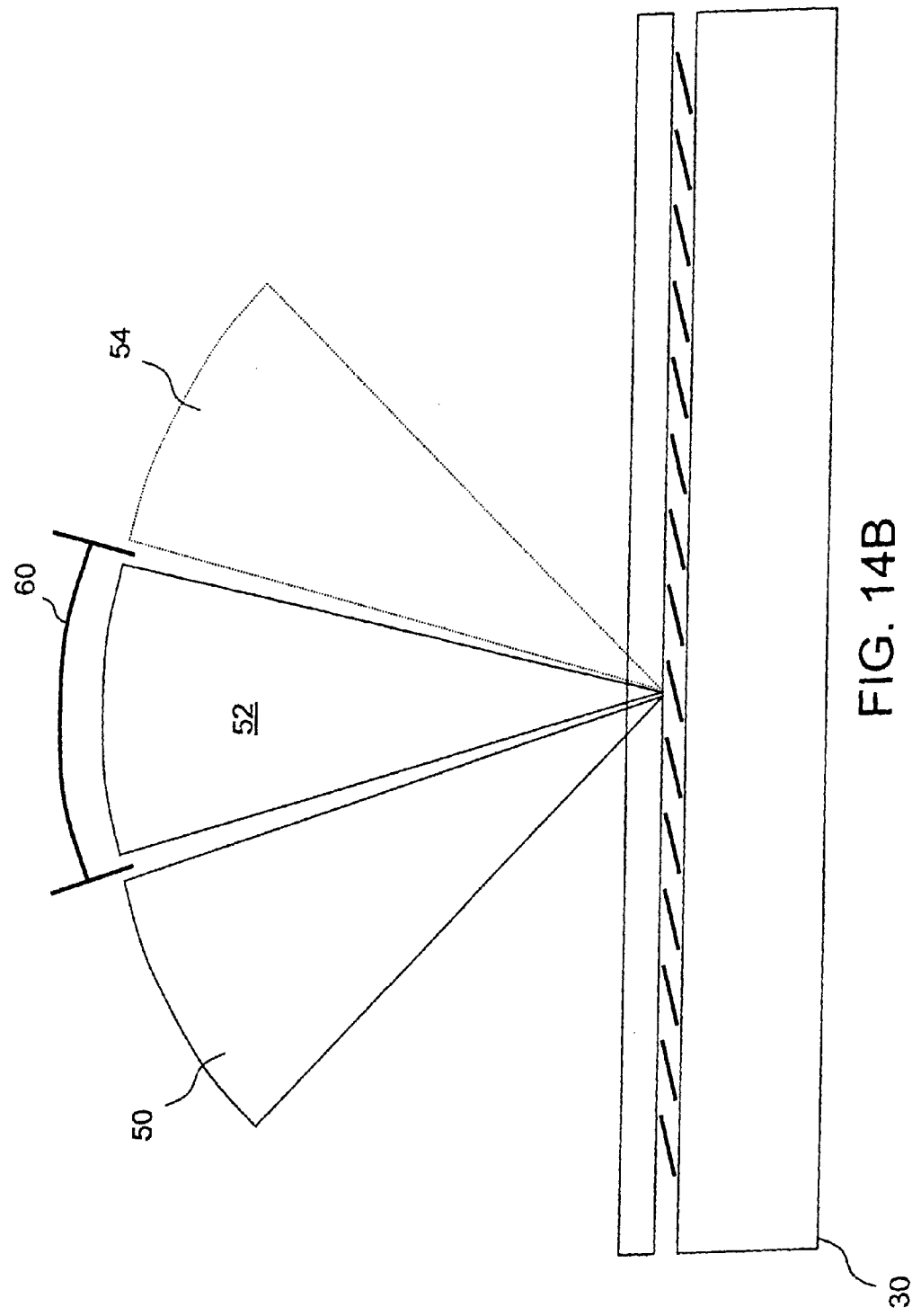

FIG. 14A is a cross sectional view of multiple micromirrors within an array where micromirrors in their 'off' state are not deflected (group 100) whereas micromirrors in their 'on' state (group 102) are moved from the flat state so as to project light where the light can be viewed (directly, on a target within a unitary device, across a room onto a screen, etc.). Such a micromirror array arrangement is better illustrated in FIGS. 14B and 14C. As can be seen in FIG. 14B, in the micromirrors' 'on' state, an incoming cone of light 50 is reflected off of the micromirrors (all micromirrors are 'on' in this figure) and light is projected away as a cone of light 52 into output aperture 60, and in most cases will proceed to an imaging system (e.g., a projection lens or lenses). Cone 54 represents specular reflection from the transparent cover. FIG. 14C is an illustration of the micromirrors in their 'off' state, where cone 52 represents light reflected from the micromirrors in this 'off' state. The incident and reflected cones of light will narrow onto the entire array, though in these figures, for ease of illustration, the cones of light are shown as tapering onto an individual micromirror.

The arrangement of FIGS. 14B and 14C has the benefit that when the micromirrors are in their 'off' (non-deflected) state, little light is able to travel through the gaps between the micromirrors and cause undesirable "gap scatter". However, as shown in FIG. 14C, diffracted light is caused by the repeating pattern of the micromirrors (light 61a and 61b that extends beyond the cone of reflected 'off' light 52). This undesirable light is caused by scattering or diffraction from the edges of the micromirrors ("edge scatter"). In particular, because the incoming cone of light (and thus the outgoing cones of light) is made as large as possible so as to increase efficiency, diffraction light such as light 61a that extends beyond the cone of reflected 'off' light can enter the output aperture 60 (e.g., collection optics) and undesirably decrease contrast ratio.

Figure 15B:
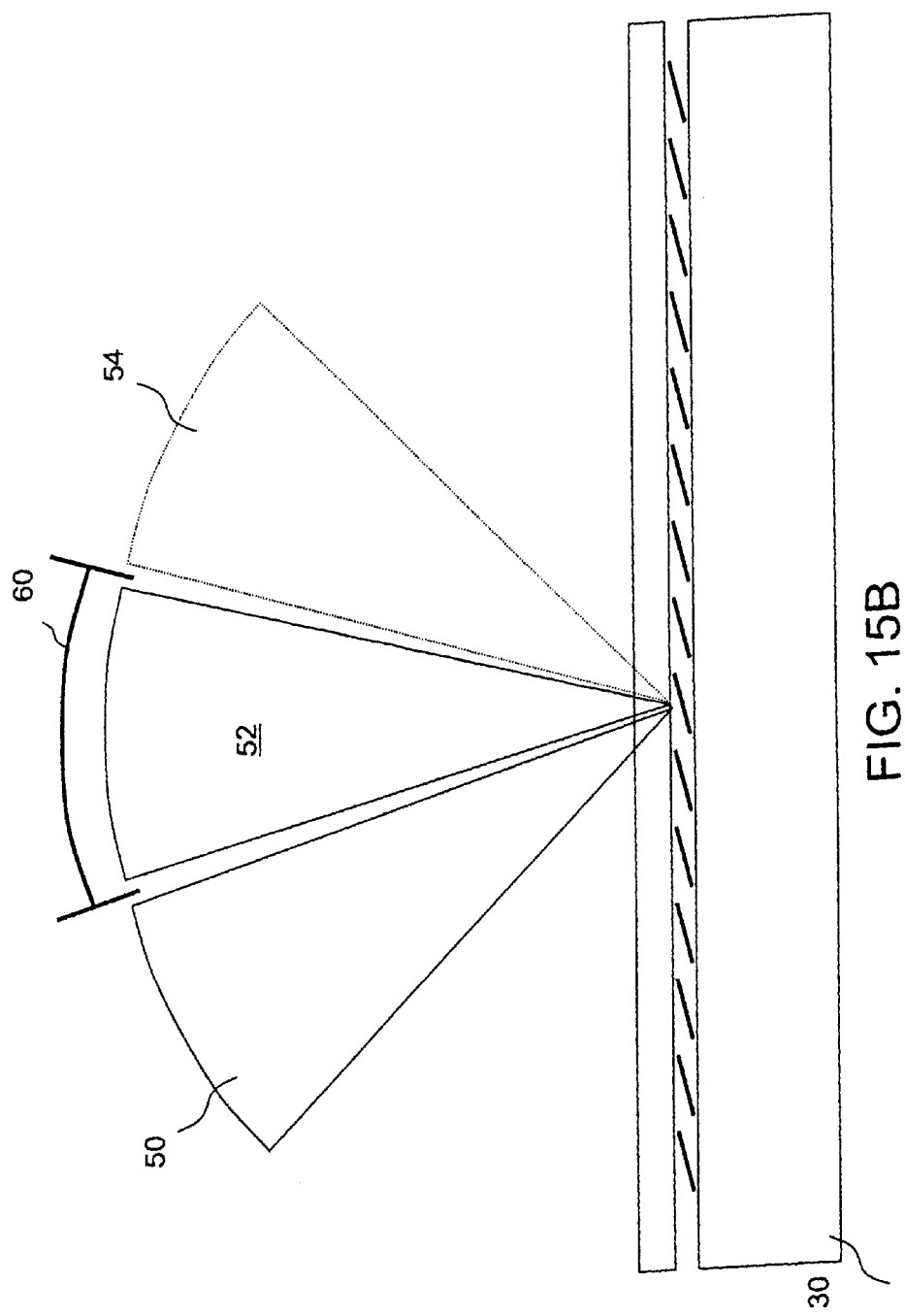
Figure 15C:
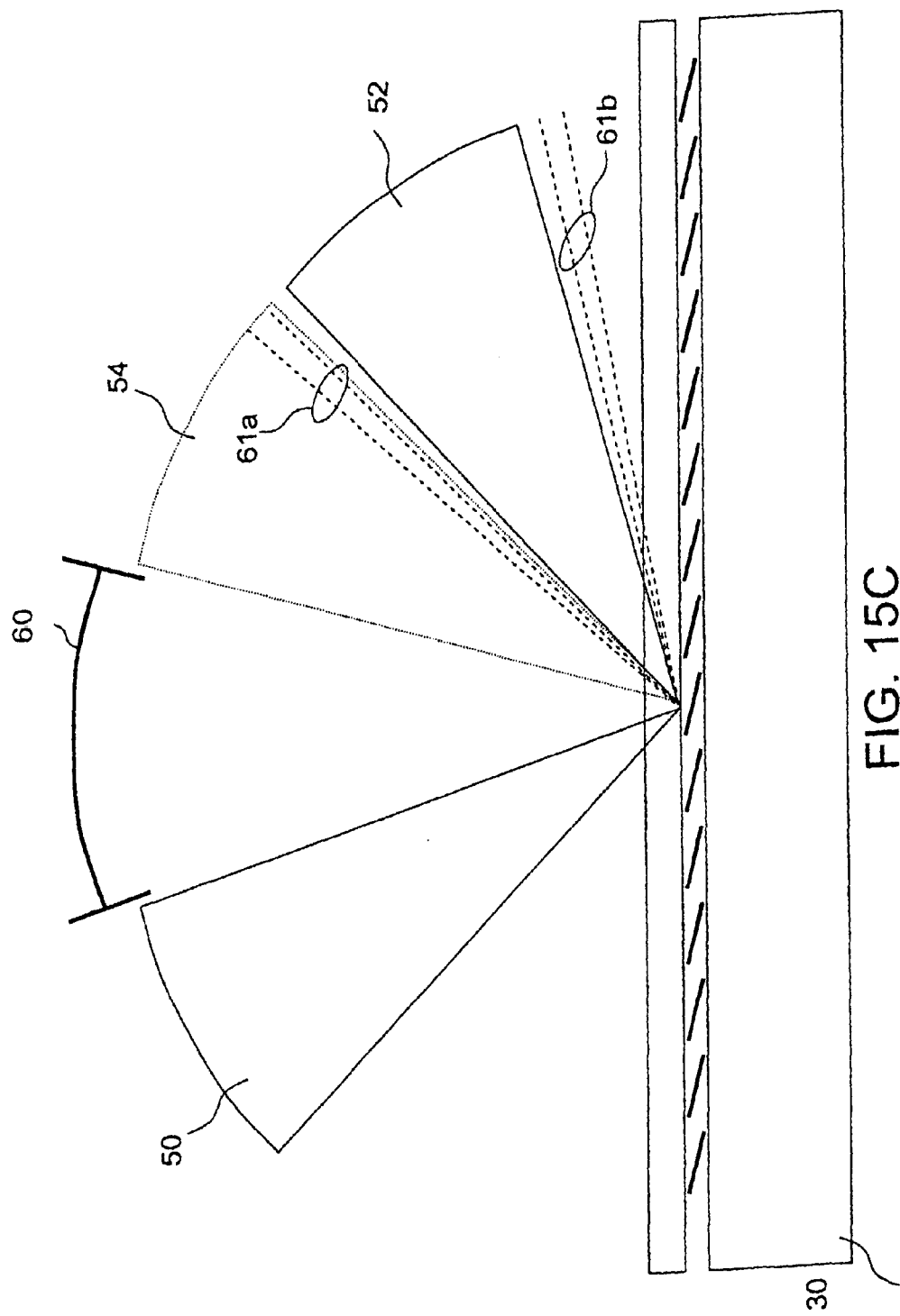

In order to avoid this "overlap" of 'off' state light (including diffraction light) and 'on' state light that decreases contrast ratio, the 'off' state light and 'on' state light can be separated further from each other by deflecting micromirrors for both the 'on' and 'off' states. As can be seen in FIG. 15A, if the micromirror is deflected in its 'off' state as illustrated in this figure, some light will be properly reflected off of the micromirrors far away from the 'on' state direction (e.g., collection optics) as shown as ray 116. Other light 112 will not hit on a micromirror, but will scatter on the top surface of the lower substrate (e.g., on lower circuitry and electrodes) and enter into the collection optics even though the adjacent micromirror is in the 'off' state. Or, as can be seen by ray 114, the incoming light could hit a micromirror, yet still result in gap scatter rather than being properly directed in the 'off' angle like ray 116. This 'on' arrangement as illustrated in FIG. 15B is the same as in FIG. 14B. However, as illustrated in FIG. 15C, the 'off' state along with diffraction 61a caused by micromirror periodicity, is moved further away from the 'on' angle so as to result in improved contrast ratio due to diffraction/edge scatter (though decreased contrast ratio due to gap scatter, as mentioned above).

An improved micromirror array would maximize the distance between the 'off' light cone and the 'on' light cone (minimize edge scatter into the acceptance cone), yet minimize gaps between adjacent micromirrors (minimize gap scatter). One solution that has been tried has been to provide a micromirror array with micromirrors that deflect in opposite directions for the 'on' and 'off' states as in FIGS. 15A to 15C, and provide a light absorbing layer under the micromirrors so as to decrease gap scatter. Unfortunately, this increases process complexity, or absorbs light onto the micromirror array assembly (onto the light valve), which increases the temperature of the light valve and causes problems due to thermal expansion, increased fatigue or droop of micromirror structures, increased breakdown of passivation films, self assembled monolayers and/or lubricants, etc.

Figure 16C:
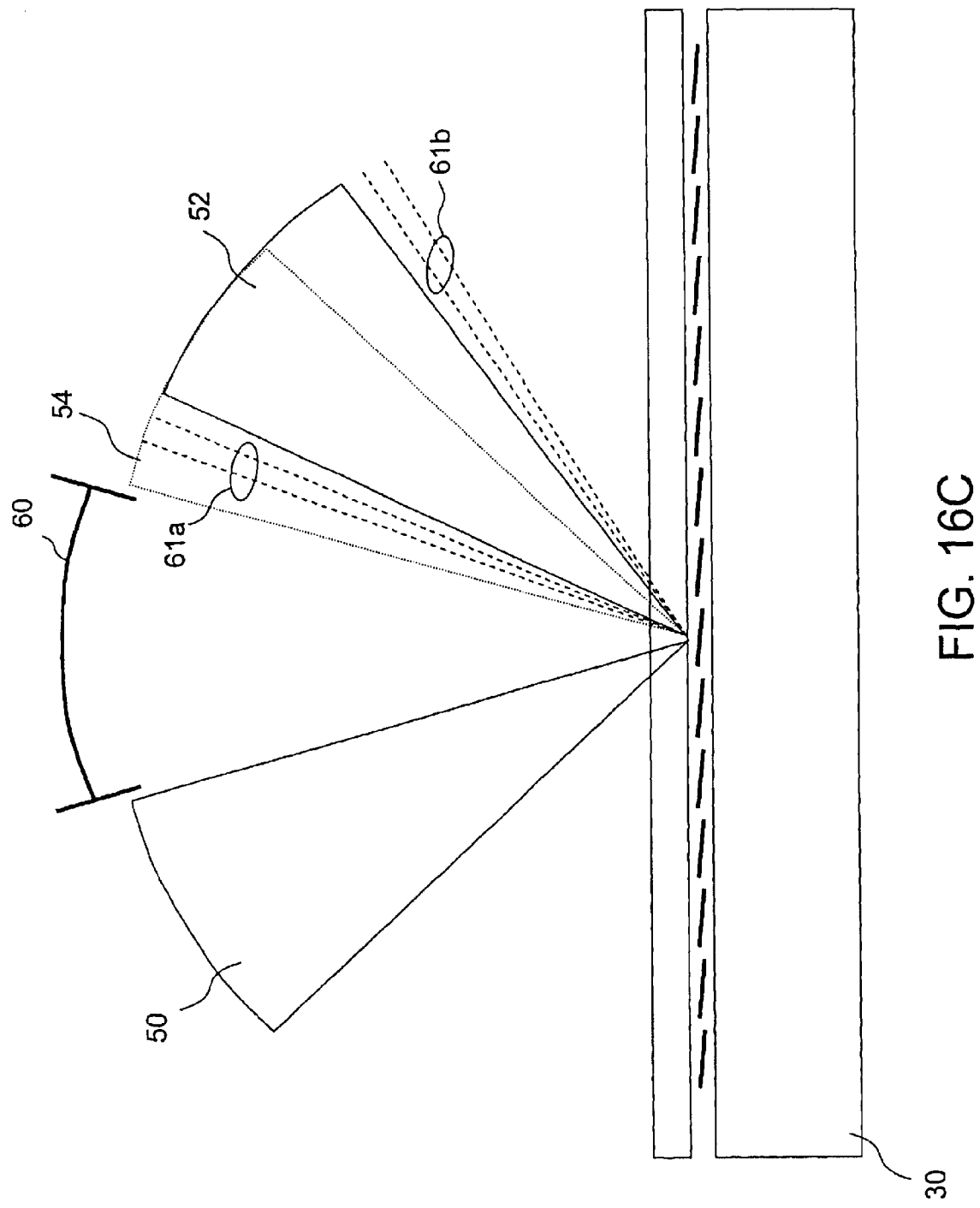

As can be seen in FIGS. 16A to 16C micromirrors are provided that are deflected in both their 'on' and 'off' states, yet at different deflection angles. As can be seen in FIG. 16A micromirrors 100 are deflected in an 'off' state that is at a deflection angle less than micromirrors 102 in their 'on' state (deflected in an opposite direction from the flat or nondeflected position). As can be seen in FIG. 16B, the 'on' state is unchanged (incoming light 50 projected as outgoing light 52 into output aperture 60), with some specular reflection 54. In FIG. 16C, micromirrors are in their 'off' state in a sufficiently deflected position such that edge scattering light 61a that passes into output aperture 60 is minimized, yet deflected only so much as to keep such edge scattering light out of the acceptance cone so as to minimize gap scattering light from under the micromirrors due to a large off state deflection angle.

An additional feature of the invention is in the packaging of the device. As mentioned above, reflection off of the light transmissive substrate can result in specular reflection. As can be seen in FIG. 17A, incoming light cone 50 reflects off of micromirrors in their on position, illustrated as reflected cone 52. Specular light reflected from a surface of the light transmissive substrate 32 is illustrated as light cone 54. It is desirable in making a projection system, to increase the distended angle of the cone so as to increase etendue and projection system efficiency. However, as can be seen in FIG. 17A, increasing the distended angle of cone 50 will result in increases in the distended angles of cones 52 and 54 such that specular reflection light from cone 54 will enter the output aperture 60, even if the micromirrors are in their 'off' state (thus reducing contrast ratio).

Figure 17B:
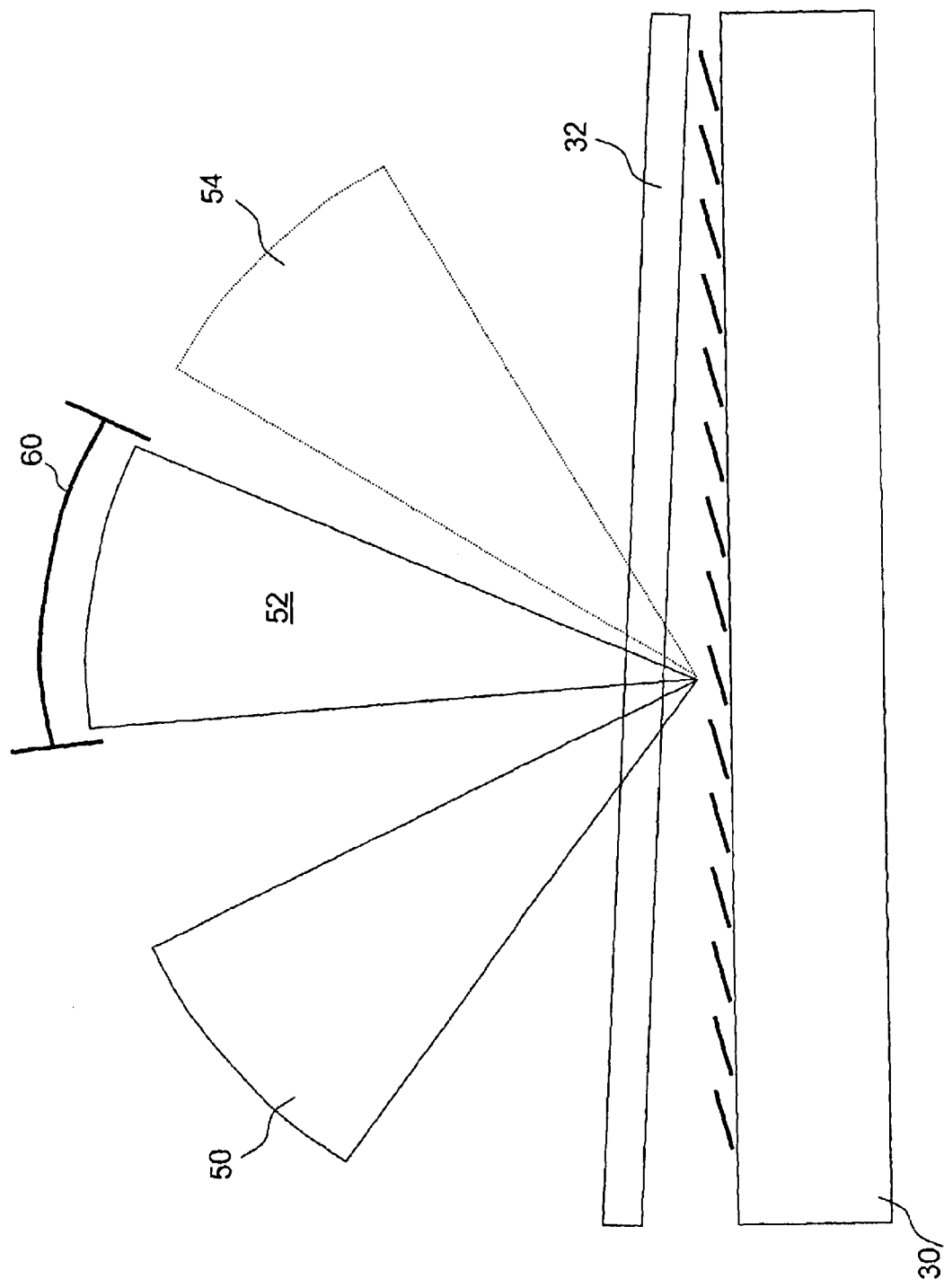
Figure 17C:
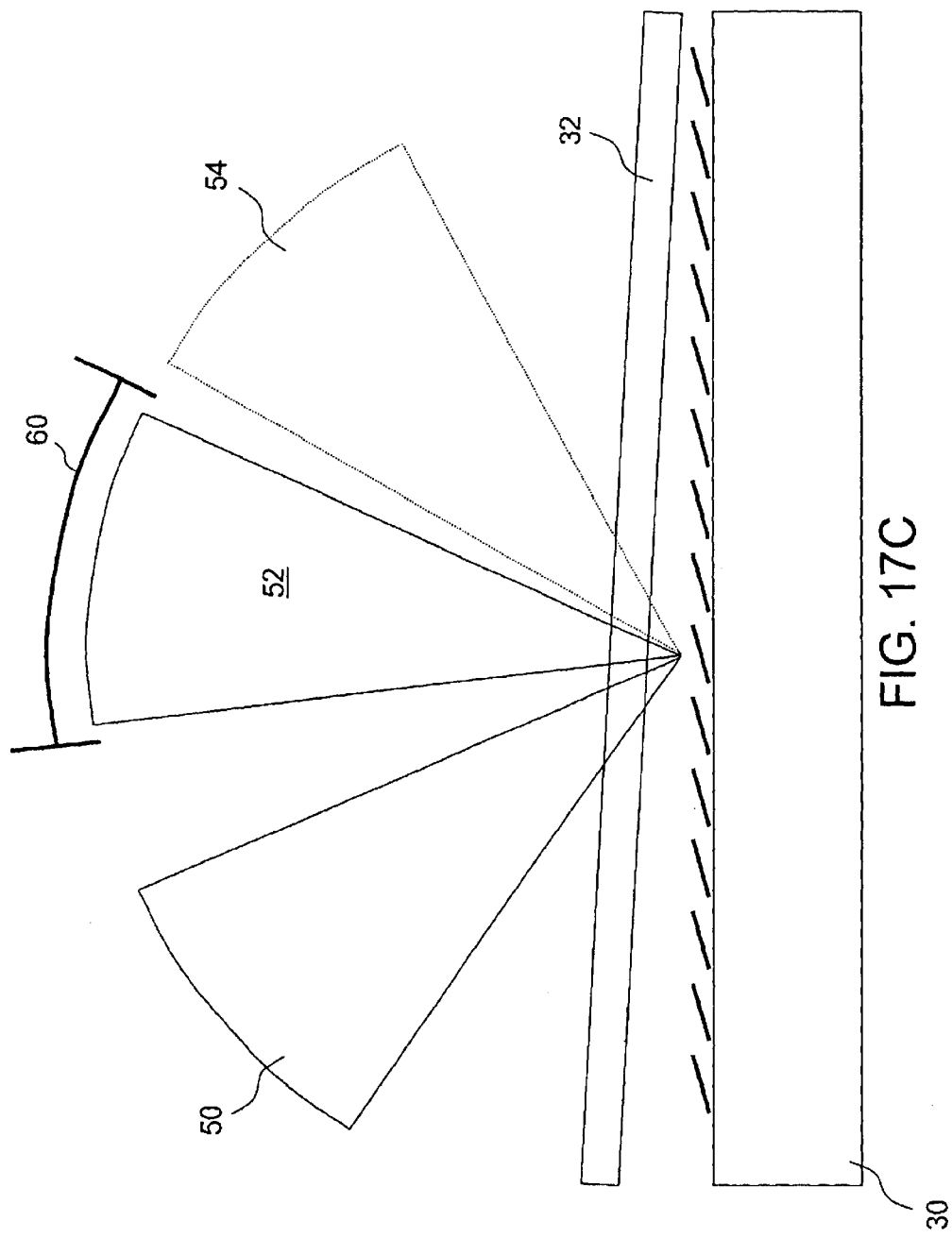

In order to allow for larger distended angles of cones of light yet avoid specular reflection entering the output aperture, as can be seen in FIG. 17B, light transmissive substrate 32 is placed at an angle relative to substrate 30. In many cases, substrate 30 is the substrate upon which the micromirrors (or other optical MEMS elements) are formed, whereas substrate 32 is a light transmissive window in a package for the optical MEMS device. The angle of the window is greater than −1 degree (the minus sign in keeping with the directions of the angles or the micromirrors). In one example, the window is at an angle of from −2 to −15 degrees, or in the range of from −3 to 10 degrees. In any event, the window is at an angle relative to the micromirror substrate that is preferably in the same "direction" as the off position of the micromirrors (relative to the micromirror substrate and/or package bottom). As can be seen in FIG. 17B, when the micromirrors are in the 'on' state, there is a gap between the light reflected as light from 'on' micromirrors (light reflectance cone 52) and specular reflection light (light cone 54). This "gap" is due to specular reflection cone 54 being reflected at a greater distance due to the angled light transparent substrate. This arrangement allows, as can be seen in FIG. 17C, for increasing the distended angle of the incident light cone (and the corresponding reflectance light cones) from the 'on' micromirrors (cone 52) and the light transparent substrate (cone 54). (For ease of illustration, the reflectance point of the light cones is midway between the micromirror and the light transmissive substrate, though in reality light cone 52 reflects from the micromirror(s) and specular reflection cone 54 reflects from the substrate 32.) The angled light transmissive window as illustrated in FIGS. 17B and 17C allow for larger throughput, greater system efficiency, greater light value etendue (etendue=solid angle times area). A light valve such as illustrated in FIGS. 17B and 17C is capable of modulating a larger etendue light beam and can pass through more light from a light source and is thus more efficient).

Figure 17D:
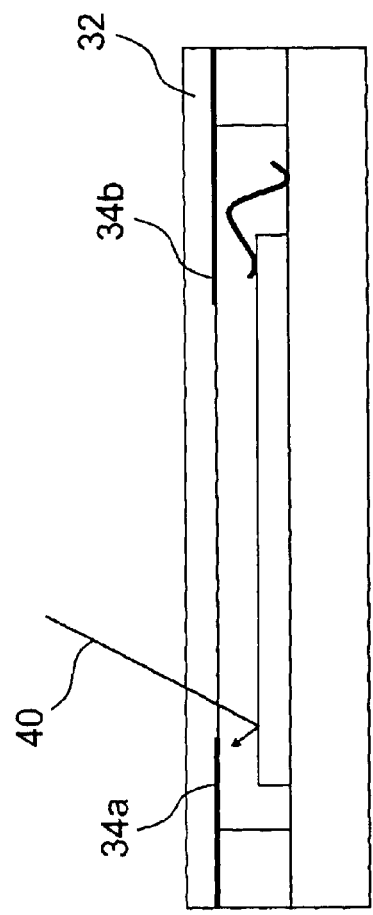
Figure 17E:
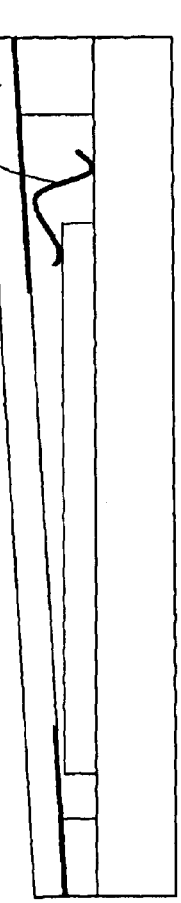

A packaged device is illustrated in FIGS. 17D and 17E. As can be seen in FIG. 17D, incoming light 40 (this view is reversed from previous views) is incident on the array and reflected therefrom. As can be seen in FIG. 17E, an angled light transmissive substrate 32 (with mask areas 34a and 34b) not only allows for increased light cone distended angles as noted above, but in addition a gap between the mask of window 32 and the micromirror array is minimized, thus reducing light scattering and temperature build-up in the package. The angle of the light transmissive window is from 1 to 15 degrees relative to the substrate, preferably from 2 to 15 degrees, or even from 3 to 10 degrees. As can be seen in FIGS. 17D to 17E, bond wires 37 at one end of the substrate in the package (electrically connecting the substrate to the package for actuation of the micromirrors—or other micromechanical element) are disposed where the angled window is at a greater distance than at an opposite end of the substrate. Thus, the angled window allows for the presence of bond wires, yet allows for a minimized distance between the light transmissive window and the micromirror substrate at an end of the substrate where there are no bond wires. Note that light is incident on the micromirror array from a side of the package corresponding to the position of the bond wires and elevated side of the angled window. Additional components that could be present in the package are package adhesives, molecular scavengers or other getters, a source of stiction reducing agent (e.g. chlorosilanes, perfluorinated n-alkanoic acids, hexamethyldisilazane, etc.).

Figure 18:
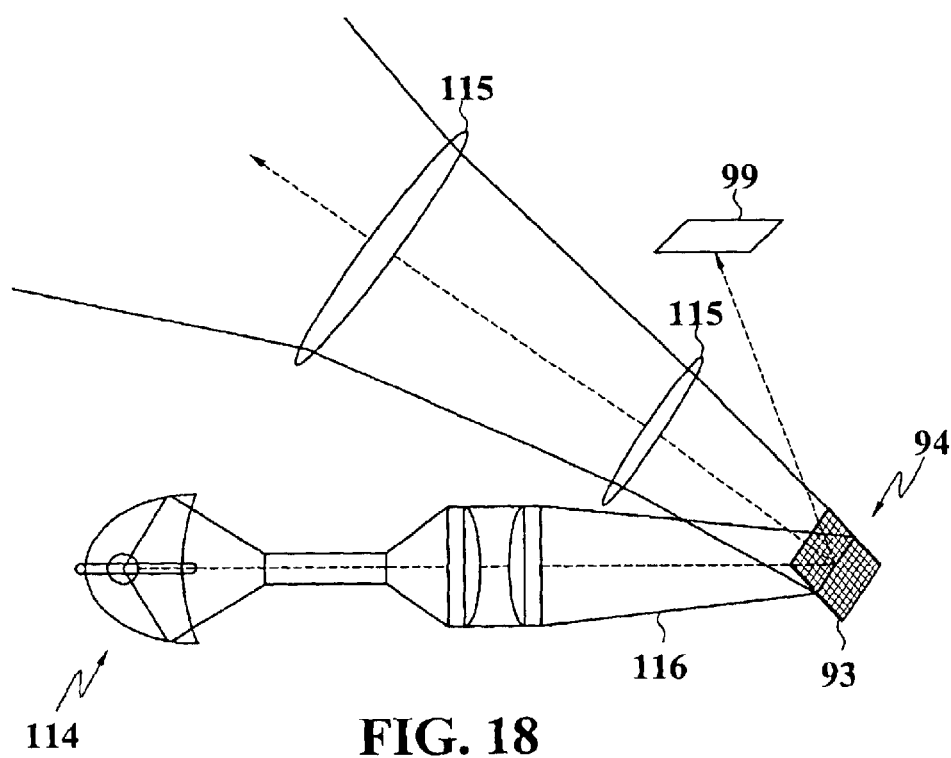
FIG. 18 is an illustration of the illumination system for the micromirror array of the present invention.

If the micromirrors of the present invention are for a projection display, there should be a suitable light source that illuminates the array and projects the image via collection optics to a target. The arrangement of light source and incident light beam to the array, and to each micromirror, which allows for the improved contrast ratio while minimizing projection system footprint, in the present invention, can be seen in FIGS. 18 and 19a to 19c. As can be seen in FIG. 18, a light source 114 directs a beam of light 116 at a 90 degree angle to the leading side 93 of the active area of the array (the active area of the array illustrated as rectangle 94 in the figure). The active area 94 would typically have from 64,000 to about 2,000,000 pixels in a usually rectangular array such as illustrated in FIG. 18. The active area 94 reflects light (via 'on' state micromirrors) through collection optics 115 to a target to form a corresponding rectangular image on the target (e.g., wall or screen). Of course, the array could be a shape other than rectangular and would result in a corresponding shape on the target (unless passed through a mask). Light from light source 114 reflects off of particular micromirrors (those in the 'on' state) in the array, and passes through optics 115 (simplified as two lenses for clarity). Micromirrors in their 'off' state (in a non-deflected "rest" state), direct light to area 99 in FIG. 18. FIG. 18 is a simplification of a projection system that could have additional components such as TIR prisms, additional focusing or magnification lenses, a color wheel for providing a color image, a light pipe, etc. as are known in the art. Of course, if the projection system is for maskless lithography or non-color applications other than one for projection of a color image (e.g. front or rear screen projection TV, a computer monitor, etc.), then a color wheel and different collection optics could be used. And, a target may not be a screen or photoresist, but could be a viewer's retina as for a direct view display. As can be seen in FIG. 18, all 'on' micromirrors in the array direct light together to a single collection optic, which can be one lens or a group of lenses for directing/focusing/projecting the light to a target.

Figure 19A:
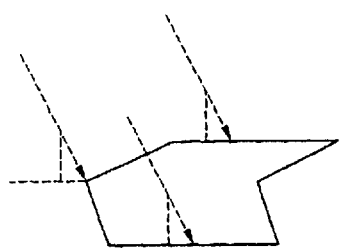
FIGS. 19A to 19E illustrate the relationship between angle of incident light, micromirror sides, and active area sides.
Figure 19B:
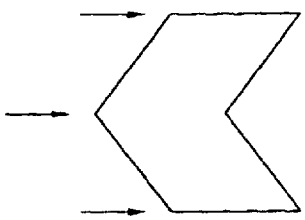
Figure 19C:
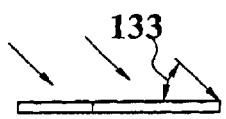

Whether the viewed image is on a computer, television or movie screen, the pixels on the screen image (each pixel on the viewed or projected image corresponding to a micromirror element in the array) have sides that are not parallel to at least two of the four sides defining the rectangular screen image. As can be seen in one example of a micromirror element in FIGS. 19A–E, the incident light beam does not impinge perpendicularly on any sides of the micromirror element. FIG. 19A is a perspective view of light hitting a single micromirror element, whereas FIG. 19B is a top view and FIG. 19C is a side view. The incident light beam may be from 10 to 50 degrees (e.g., 20 degrees) from normal (to the micromirror/array plane). See angle 133 in FIG. 19C.

Figure 19D:
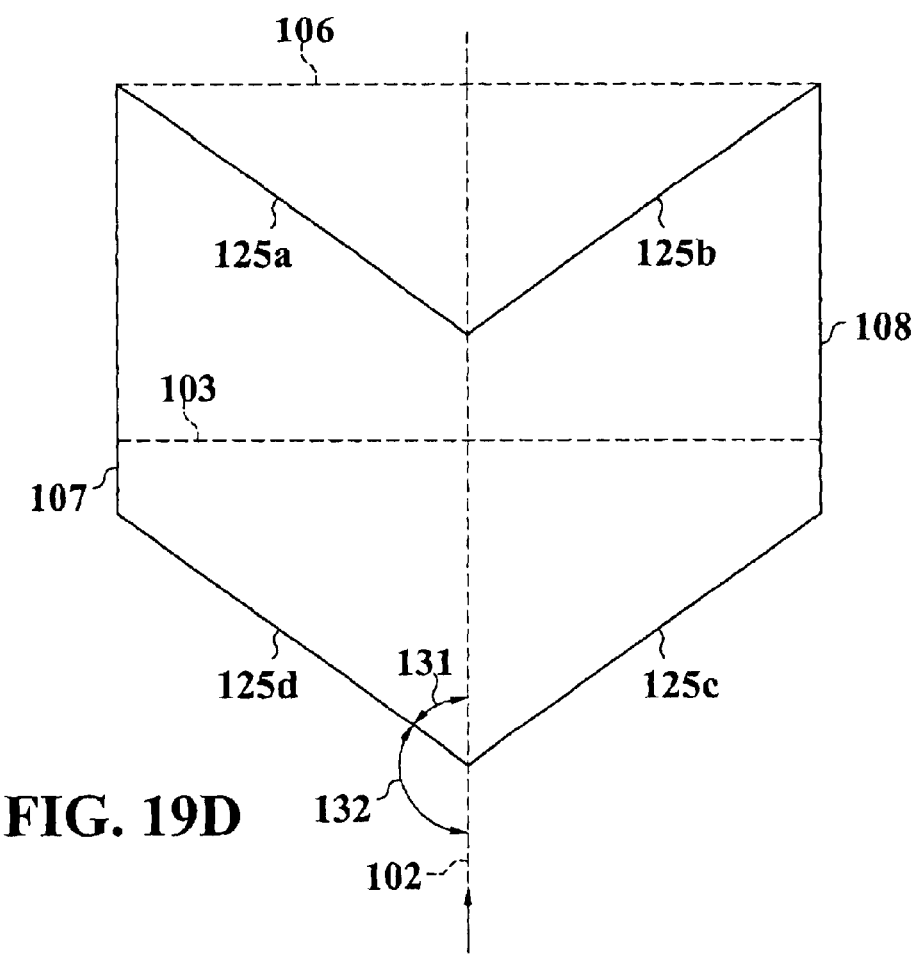
Figure 19E:
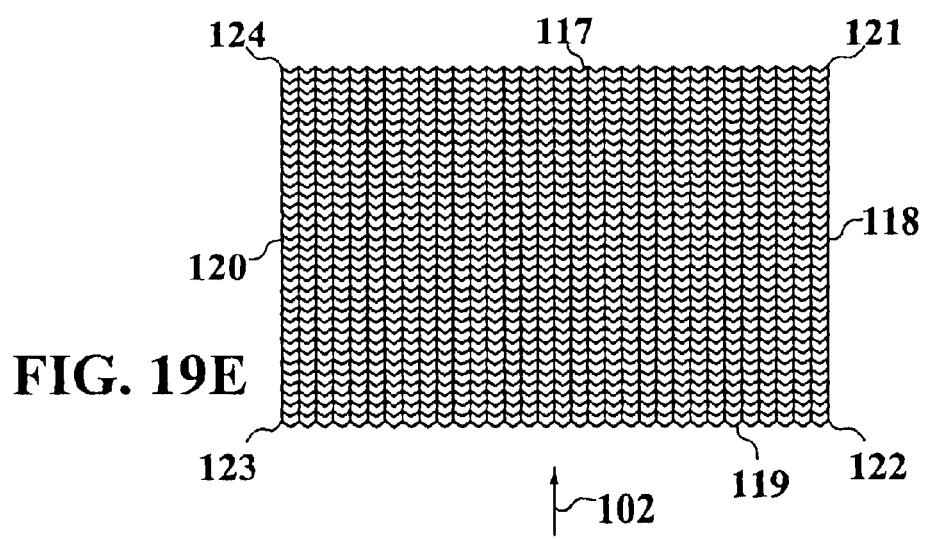

Regardless of the angle of the incident light beam from the plane of the micromirror, no micromirror sides will be perpendicular to the light beam incident thereon (see FIG. 19D). In a preferred embodiment, the micromirror sides should be disposed at an angle (131) less than 80 degrees or preferably 55 degree or less in relation to the incident light beam axis projection on the micromirror plane (102), more preferably 45 degrees or less, and most preferably 40 degrees or less. Conversely, angle 132 should be 100 degrees or more, preferably 125 degrees or more, more preferably 135 degrees or more, and most preferably 140 degrees or more. The switching (i.e., rotational) axis of the micromirror is labeled as dotted line 103 in FIG. 19D. This switching axis could be in other places along the micromirror, e.g., line 106, depending upon the type of hinges utilized. As can be seen in FIG. 19D, the switching axis (e.g., 103 or 106) is perpendicular to the incident light beam 102 as projected onto the plane of the micromirror. FIG. 19E, like 19D, is a top view—however an array of micromirrors are illustrated in FIG. 19E along with an incident light beam 102 onto the 2-D array of micromirrors. Note that each micromirror in FIG. 19E has the shape of the micromirror illustrated in FIGS. 19A–D. As can be seen in FIG. 19E, the overall shape of the micromirror array is a rectangle. Each of the four sides of the array, 117–120, is defined by drawing a line between the most remote pixels in the last row and column of the active area (121–124) (e.g., side 119 being defined by a line intersecting corner pixels 123 and 122). Though it can be seen in FIG. 19E that each of the "leading" (closest to the light source) and "trailing" (furthest from the light source) active area sides 119, 117 is "jagged" due to the shape of the micromirrors in the active area, it should be remembered that there could be up to about 3,000,000 micromirrors or more in an area of from 1 cm² to 1 in². Therefore, unless under extreme magnification, the active area will be essentially rectangular, with active area sides 118 and 120 (or 117 and 119) parallel to micromirror sides 107 and 108 in FIG. 19D (the micromirror in FIG. 19D being one of the micromirror elements within the active area of FIG. 19E); with active area sides 117 and 119 (or 118 and 120) being parallel to the switching axis 103 (or 106) of each micromirror (see FIG. 19D); and with active area sides 117 and 119 (or 118 and 120) being non-perpendicular to leading or trailing sides 125a–d of the micromirrors (see FIG. 19D). FIG. 19E could also be seen as the projected image comprising a large number of projected pixels (each projected pixel having the shape illustrated in FIG. 19D). In accordance with the above, therefore, the projected image sides 118 and 120 (or 117 and 119) are parallel to projected pixel sides 107 and 108, and projected image sides 117 and 119 (or 118 and 120) being non-perpendicular to projected pixel sides 125a–d.

Figure 20:
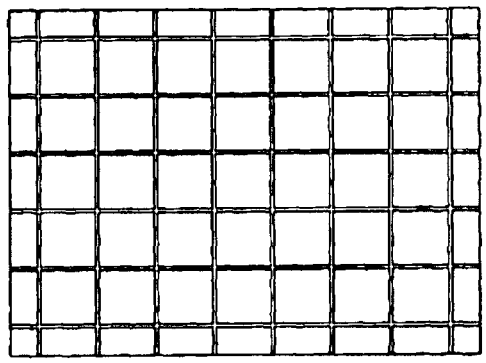
FIG. 20 is an illustration of a prior art micromirror array.
Figure 21:
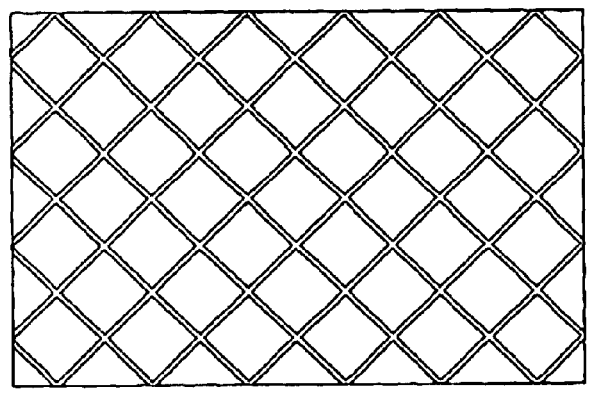
FIGS. 21 and 22 are illustrations of an embodiment of the invention where square micromirrors are at an angle to the active area sides.

FIG. 20 is an illustration of a 2-D micromirror array (of course with many fewer pixels than within the typical active area). For ease of illustration (in FIG. 20 as well as FIGS. 21–26 and 29–32) fewer than 60 micromirrors/pixels are illustrated, though a typical display would have from 64K pixels (320×200 pixels) to 1,920K pixels (1600×1200 pixels=UXGA), or higher (e.g., 1920×1080=HDTV; 2048×1536=QXGA). Due to the very small size of each pixel in the present invention, the resolution that can be achieved is essentially without limit. As can be seen in FIG. 20, the sides of each pixel are parallel to corresponding sides of the active area. Thus, each micromirror side is either perpendicular or parallel to the sides of the active area. In contrast, as illustrated in FIG. 21, the micromirror sides are neither parallel nor perpendicular to the active area sides. As will be seen below, in other embodiments, some of the sides are neither parallel nor perpendicular to active area sides, and some sides can be parallel to active area sides (as long as also parallel to the direction of a line superimposed on the plane of the micromirror from the incident light beam).

Figure 22:
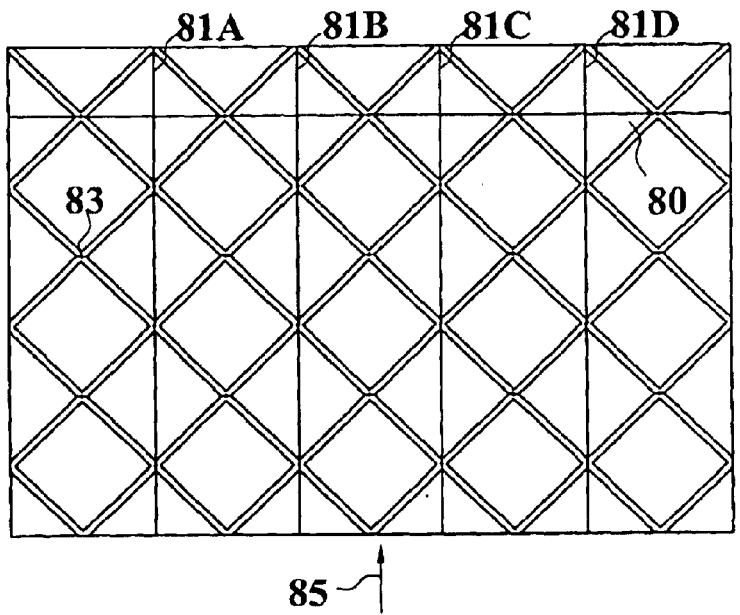

The micromirror array as illustrated in FIG. 22 achieves high contrast ratio. However, the micromirror arrangements such as illustrated in FIGS. 23–29 simplify the addressing scheme. More particularly, FIGS. 23–29 have the advantage of not positioning the pixels on a lattice aligned at an angle to the X and Y axes of the array. As typical video image sources provide pixel color data in an X-Y grid, the arrangement of pixels in FIGS. 23–29 avoids non-trivial video preprocessing to render an acceptable image on a display. Also the arrangement of FIGS. 23–29 avoids a more complicated layout of the display backplane (in relation to FIGS. 13 and 14, which could require twice as many row or column wires to the pixel controller cells). Horizontal line 80 in FIG. 22 connects the top row of micromirror elements, and vertical lines 81A–D extend from each of these top row micromirrors (these horizontal and vertical lines corresponding to addressing rows and columns in the array). As can be seen in FIG. 22, only every other micromirror is connected in this way. Thus, in order for all micromirrors to be addressed, twice as many rows and columns are needed, thus resulting in added complexity in addressing the array. FIG. 22 also shows support posts 83 at the corners of the micromirrors that support posts connect to hinges (not shown) below each micromirror element (the "superimposed hinges" discussed hereinabove) and to an optically transmissive substrate (not shown) above the micromirror elements.

Figure 23:
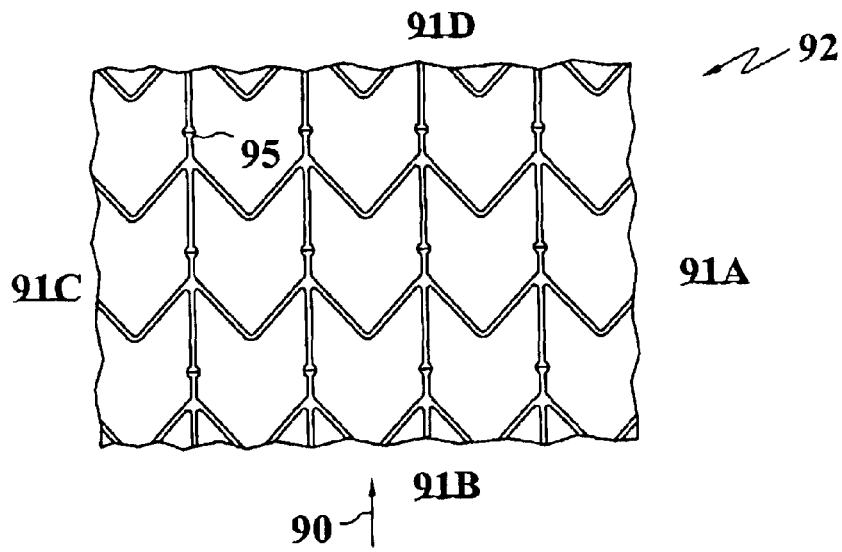
FIGS. 23 to 25 illustrate micromirrors where "leading" and "trailing" edges of the micromirrors are not perpendicular to the incident light beam.

In a more preferred embodiment of the invention as shown in FIG. 23, an array 92 is provided. A light beam 90 is directed at the array such that no micromirror sides are perpendicular to the incident light beam. In FIG. 23, the leading sides of the micromirrors (relative to incident light beam 90) are at an angle of about 135 degrees to the incident light beam (90). It is preferred that this angle be greater than 100 degrees, preferably greater than 130 degrees. The contrast ratio is further improved if the angle between the incident light beam and the leading side is 135 degrees or more, and can even be 140 degrees or more. As can be seen in FIG. 23, the micromirror elements' orientation does not result in addressing issues as discussed above with respect to FIG. 22. Posts 95 connect to hinges (not shown) below each micromirror element in FIG. 23. The hinges extend perpendicularly to the direction of the incident light beam (and parallel to the leading and trailing sides 91B and 91D of the active areas). The hinges allow for an axis of rotation of the micromirrors that is perpendicular to the incident light beam.

Figure 24:
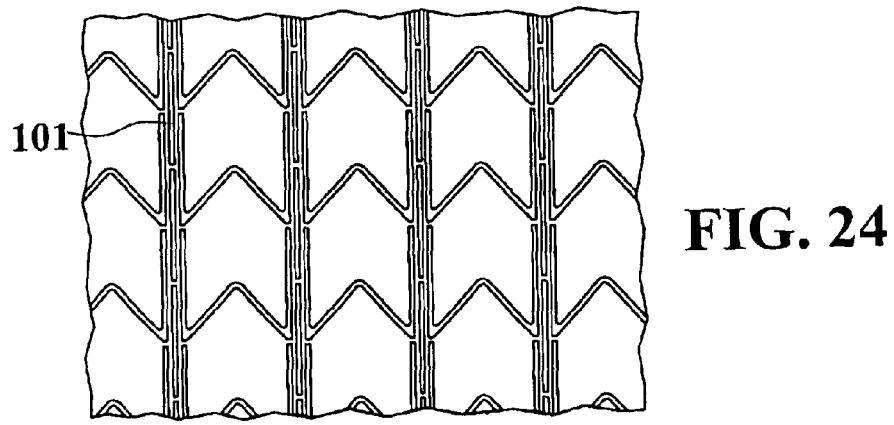
Figure 25:
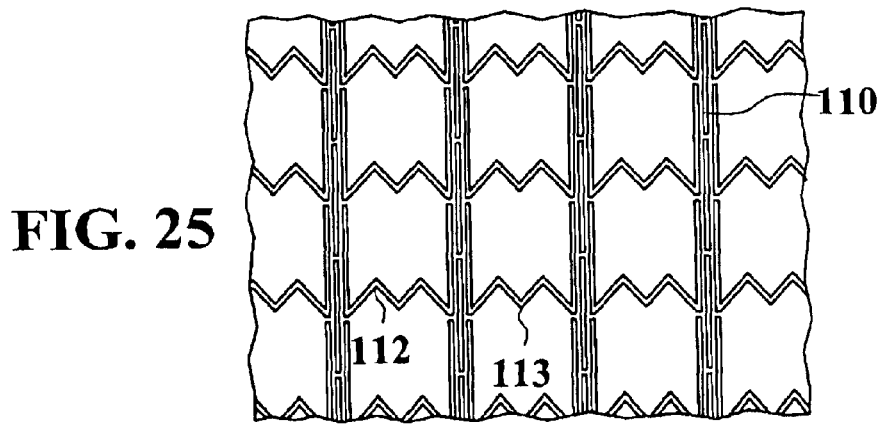
Figure 26A:
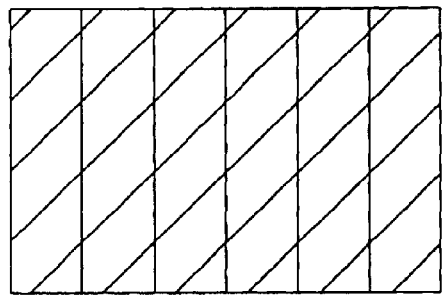
FIGS. 26A to 26F and 27A to 27F are illustrations of micromirrors having the shapes of one or more parallelograms.
Figure 26B:
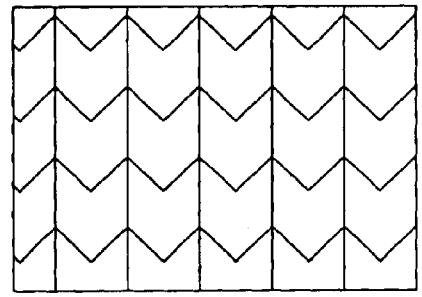
Figure 26C:
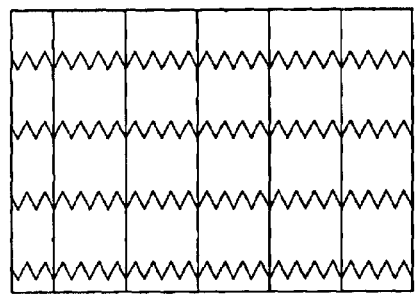
Figure 26D:
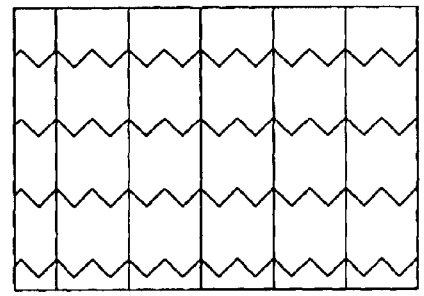
Figure 26E:
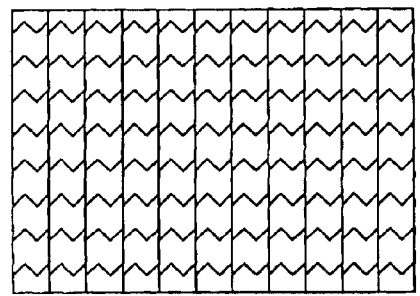
Figure 26F:
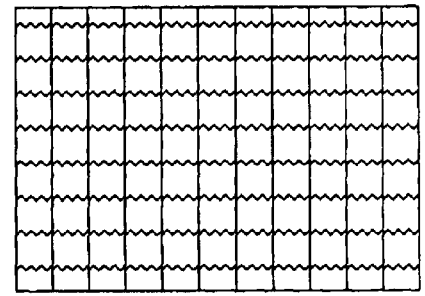

FIG. 24 is an illustration of micromirrors similar to that shown in FIG. 23. In FIG. 24, however, the micromirror elements are "reversed" and have their "concave" portion as their leading side. Even though the micromirrors in FIG. 24 are reversed from that shown in FIG. 23, there are still no sides of the micromirrors that are perpendicular to the incident light beam. FIG. 24 illustrates a hinge 101 disposed in the same plane as the micromirror element to which the hinge is attached. Both types of hinges are disclosed in the '840 patent mentioned above. FIG. 25 likewise illustrates a hinge 110 in the same plane as the micromirror array, and shows both "convex" portions 112 ("protrusions") and "concave" portions 113 ("cut-outs") on the leading side of each micromirror. Due to the concave or cut-out portion of each micromirror, each micromirror is in a shape of a concave polygon. Though the micromirrors can be convex polygons (if no sides of the convex polygonal micromirrors are parallel to the leading side of the active area), it is preferred that the micromirrors have a concave polygon shape. Convex polygons are known as polygons where no line containing a side can go through the interior of the polygon. A polygon is concave if and only if it is not a convex polygon. The concave polygon shape can be in the form of a series of (non-rectangular) parallelograms, or with at least one concave and a matching at least one convex portion (for fitting within the concave portion of the adjacent micromirror), though any concave polygon shape is possible. Though less preferred, as mentioned above, the micromirror shape could also be that of a single (non-rectangular) parallelogram. Though not illustrated, the matching one or more protrusions and one or more cut-outs need not be composed of straight lines (nor any of the micromirror sides for that matter), but instead could be curved. In one such embodiment, the protrusion(s) and cut-out(s) are semicircular, though the illustrated angular protrusions and cut-outs are preferred.

Figure 29:
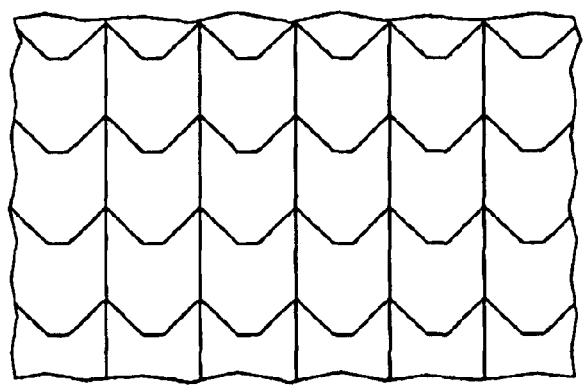
FIG. 29 is an illustration of a micromirror array having part of the leading and trailing sides perpendicular to the incident light beam, and another part at a 45 degree angle to the incident light beam.

FIGS. 26A to 26F illustrate further embodiments of the invention. Though the shape of the micromirrors are different in each figure, each is the same in that none has any sides perpendicular to the incident light beam. Of course, when a micromirror side changes direction, there is a point, however small, where the side could be considered perpendicular, if only instantaneously. However, when it is stated that there are no sides perpendicular, it is meant that there are no substantial portions which are perpendicular, or at least no such substantial portions on the leading side and trailing side of the micromirrors. Even if the direction of the leading sides changed gradually (or a portion of the leading side is perpendicular to the incident light beam, such as illustrated in FIG. 29), it is preferred that there would never be more than ½ of the leading side that is perpendicular to the incident light beam, more preferably no more than ¼, and most preferably 1/10 or less. The lower the portion of the leading side an side that is perpendicular to the incident light beam, the greater the improvement in contrast ratio.

Figure 27C:
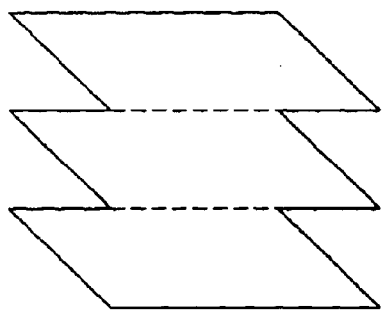
Figure 27B:
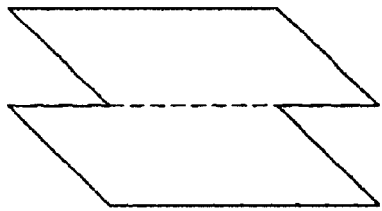
Figure 27A:
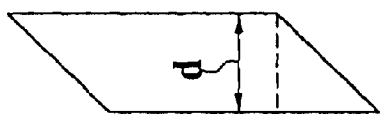
Figure 27F:
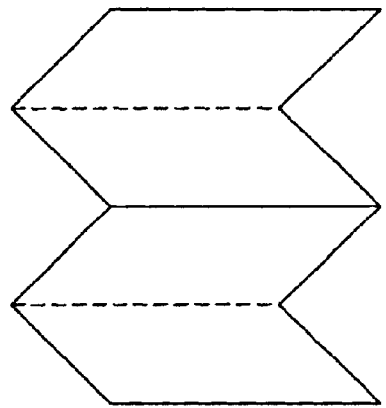
Figure 27E:
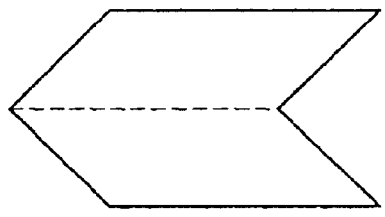
Figure 27D:
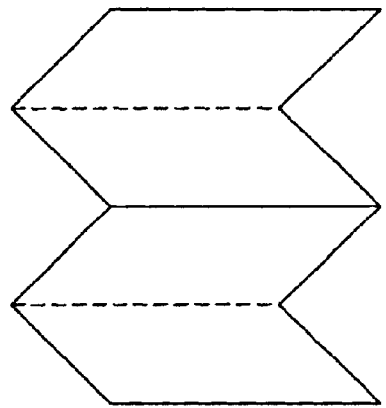

Many of the micromirror embodiments can be viewed as an assembly of one or more parallelograms (e.g., identical parallelograms). As can be seen in FIG. 27A, a single parallelogram is effective for decreasing light diffraction as it has no sides perpendicular to the incident light beam (the light beam having a direction from the bottom to the top of the page and starting from out of the plane of the page). FIG. 27A illustrates a single parallelogram with a horizontal arrow indicating width "d" of the parallelogram. The switching axis for the micromirror in FIG. 27A (and FIGS. 27B to 27F) is also in this horizontal direction. For example, the switching axis could be along the dotted line in FIG. 27A. FIGS. 27B and 27C show both two and three parallelogram micromirror designs, where each subsequent parallelogram has the same shape, size and appearance as the one before. This arrangement forms a "saw-tooth" leading and trailing side of the micromirror element. FIGS. 27D to 27F illustrate from 2 to 4 parallelograms. However, in FIGS. 27D to 27F, each subsequent parallelogram is a micromirror image of the one before, rather than the same image. This arrangement forms a "jagged side" on the leading and trailing sides of the micromirror elements. It should be noted that the parallelograms need not each be of the same width, and a line connecting the tips of the saw-tooth or jagged sides need not be perpendicular to the incident light beam. The width of each parallelogram, if they are constructed to be of the same width, will be "d"=M/N, where M is total micromirror width, N is the number of parallelograms. With an increasing number of parallelograms, the width "d" is decreasing (assuming constant micromirror width). However, width "d" should preferably be much larger than the wavelength of the incident light. In order to keep the contrast ratio high, the number of parallelograms N (or the number of times the leading micromirror side changes direction) should be less than or equal to 0.5 M/λ, or preferably less than or equal to 0.2 M/λ, and even less than or equal to 0.1 M/λ, where λ is the wavelength of the incident light. Though the number of parallelograms is anywhere from 1 to 4 in FIG. 27, any number is possible, though 15 or fewer, and preferably 10 or fewer result in better contrast ratio. The numbers of parallelograms in FIG. 27 are most preferred (4 or fewer).

Figure 28:
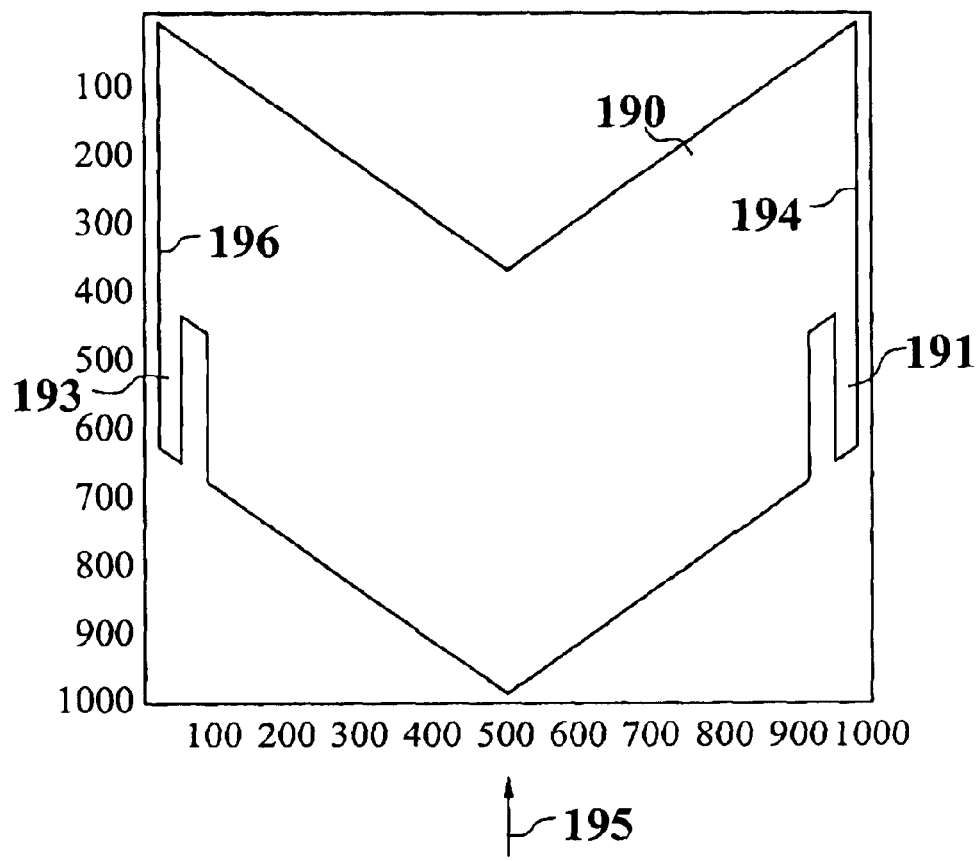
FIG. 28 is an illustration of a single micromirror.

As can be seen in FIG. 28, hinges (or flexures) 191, 193 are disposed in the same plane as micromirror element 190. Incident light beam 195 from a light source out of the plane of FIG. 28 impinges on leading sides of micromirror 190, none of which are perpendicular. It is preferred that no portion of the hinges be perpendicular to the incident light beam, so as to decrease light diffraction in direction of micromirror switching.

Figure 30:
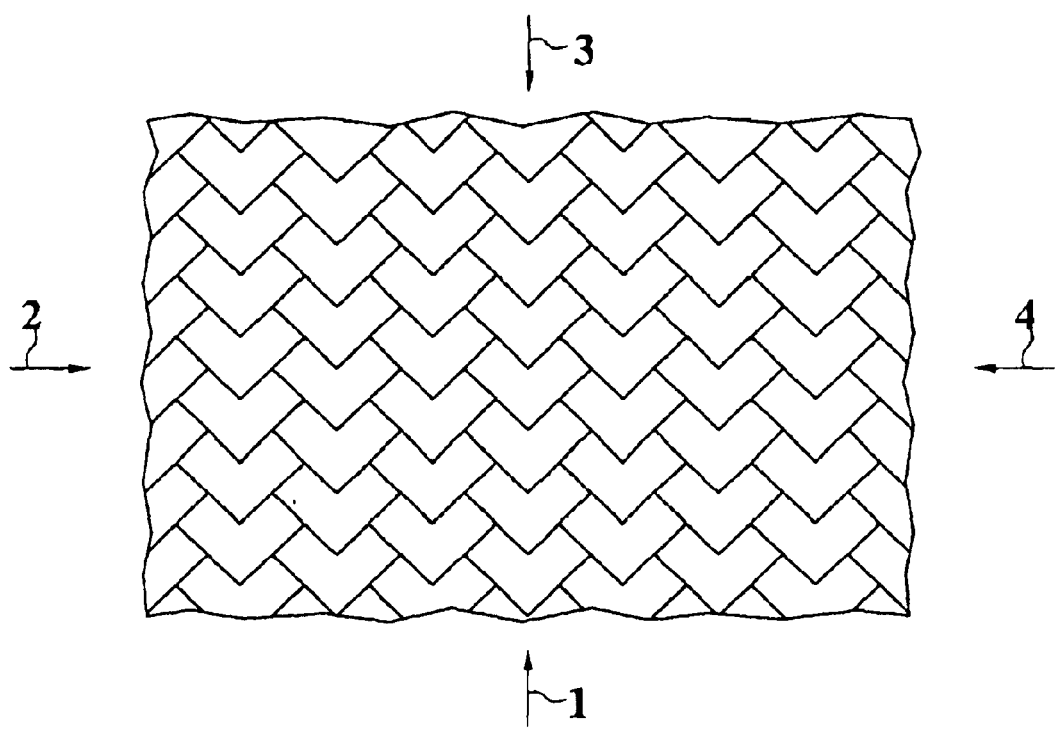
FIGS. 30 and 31 are illustrations of micromirror arrays where the micromirrors have no sides parallel or perpendicular to the incident light beam or the sides of the active area of the array.
Figure 31:
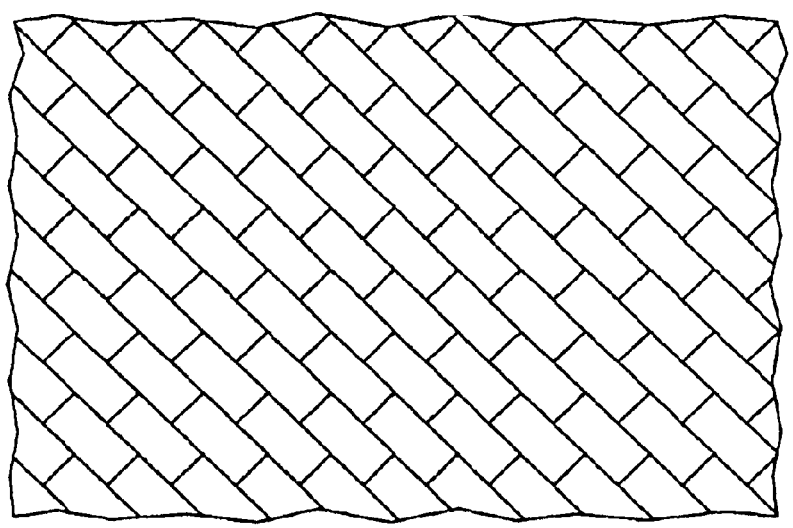

Also, it should be noted that the "straight" micromirror sides that are illustrated as being parallel to active area sides (e.g., micromirror sides 194, 196 in FIG. 28) can have other shapes as well. FIG. 21 above is one example where there are no micromirror sides parallel to incident light beam 85. FIGS. 30 and 31 are further examples where no micromirror sides are perpendicular or parallel to the incident light beam, yet do not have the increased addressing complexity as that of FIG. 22. Incident light can be directed substantially perpendicularly to any of the four active area sides in FIG. 30 (see arrows 1–4) and not be incident perpendicularly on any micromirror sides. This unique feature is also present in the array illustrated in FIG. 31. It is also possible to have part of the leading edge of each micromirror perpendicular to the incident light beam and part not perpendicular as can be seen in FIG. 29.

Figure 32A:
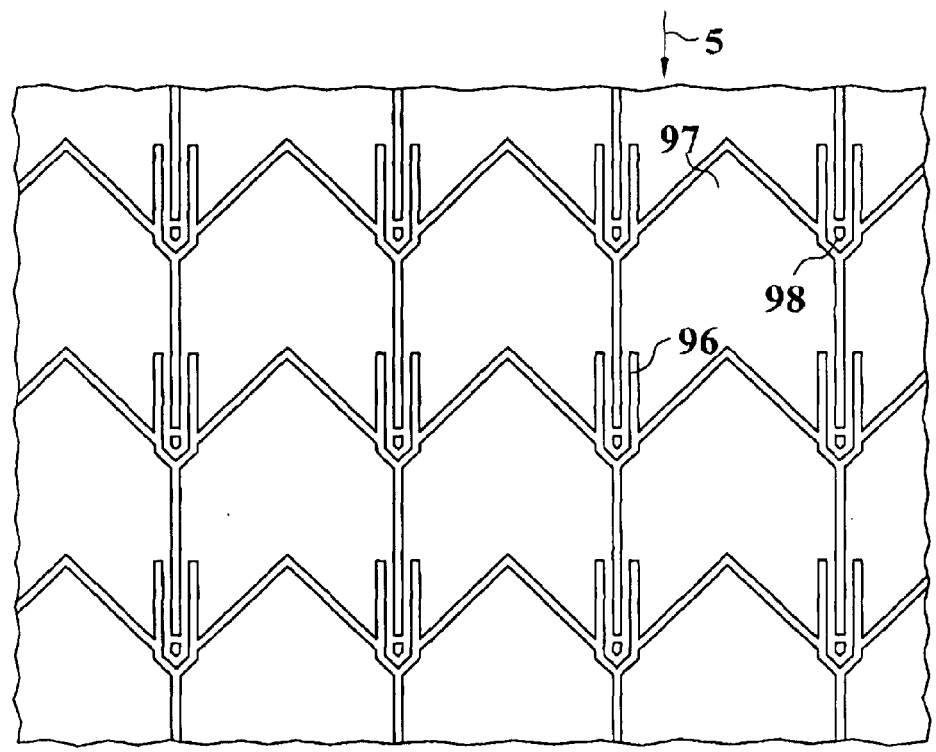
FIGS. 32A to 32J are illustrations of micromirrors with corresponding hinge structures.
Figure 32B:
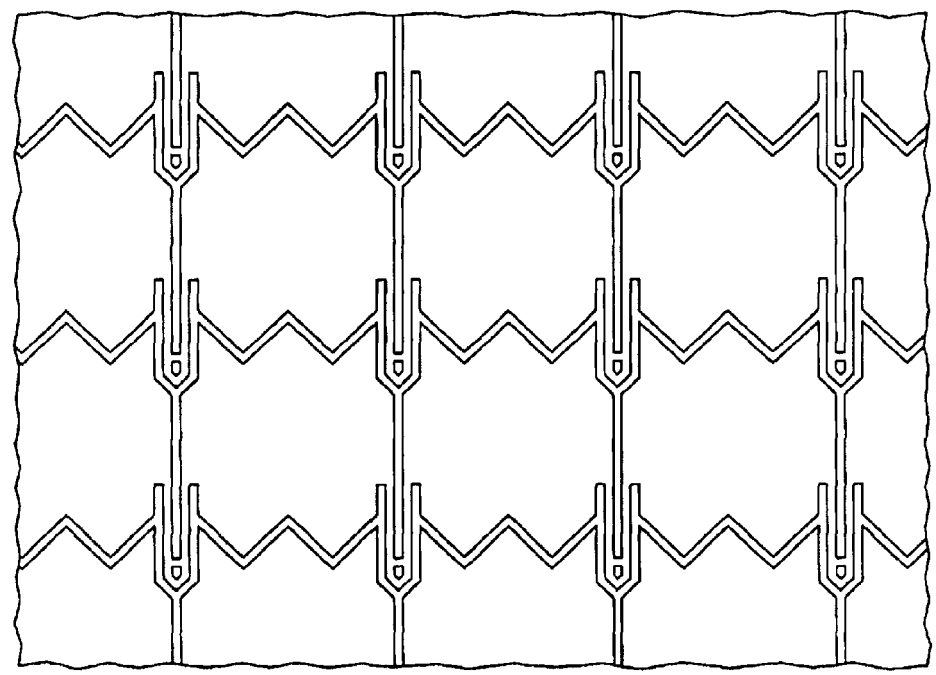
Figure 32C:
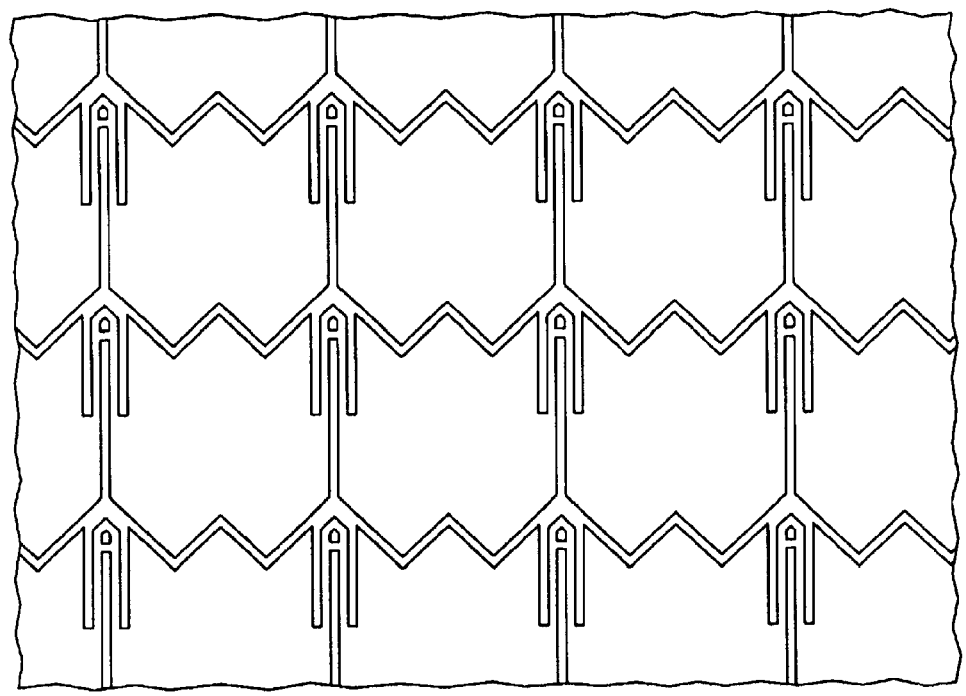
Figure 32D:
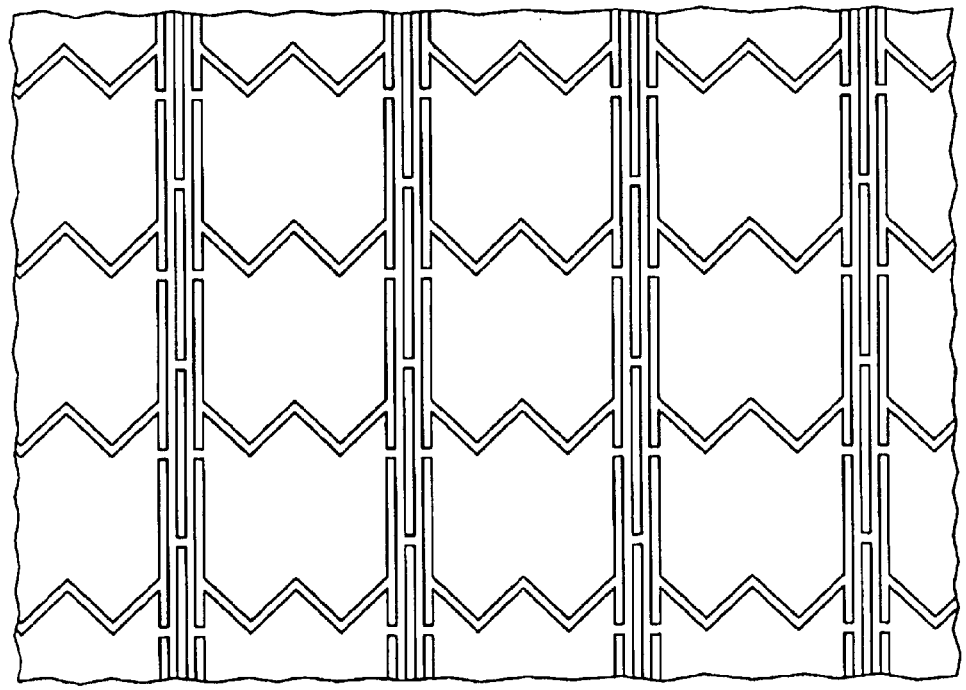
Figure 32E:
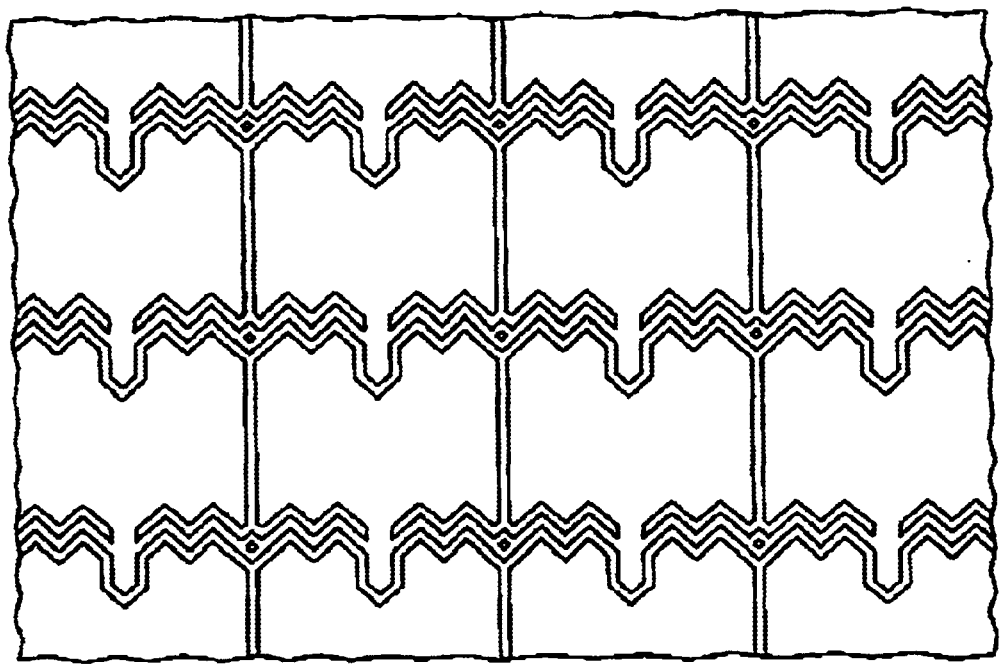
Figure 32F:
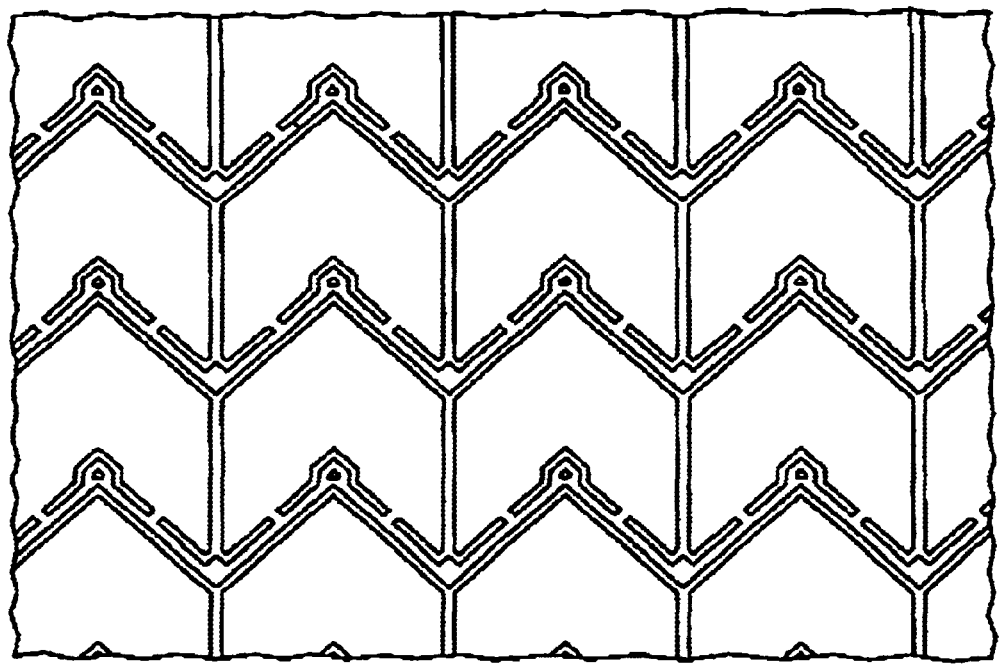
Figure 32G:
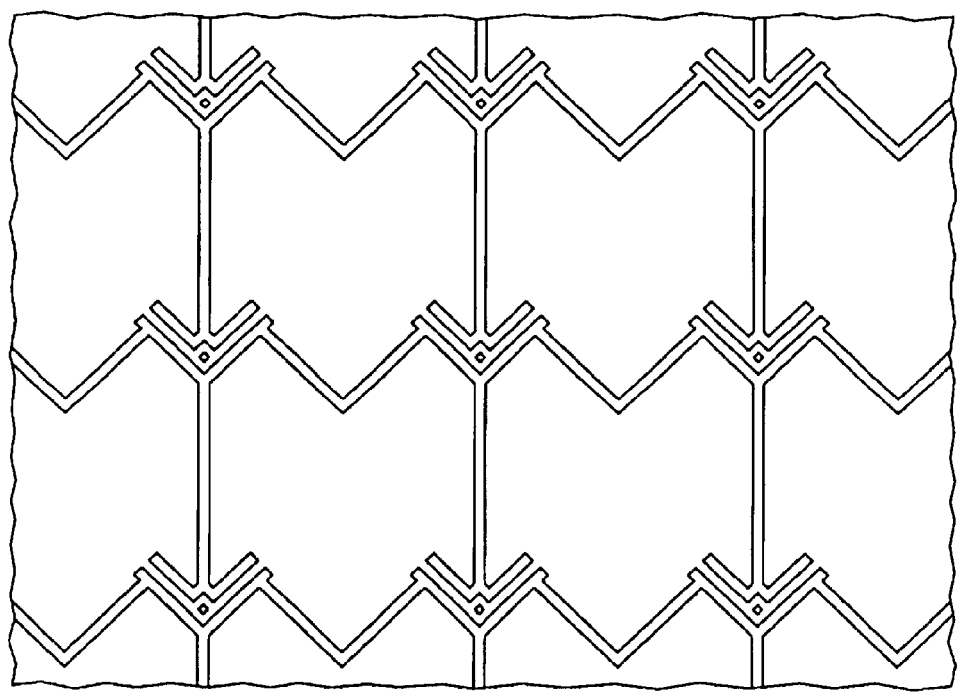
Figure 32H:
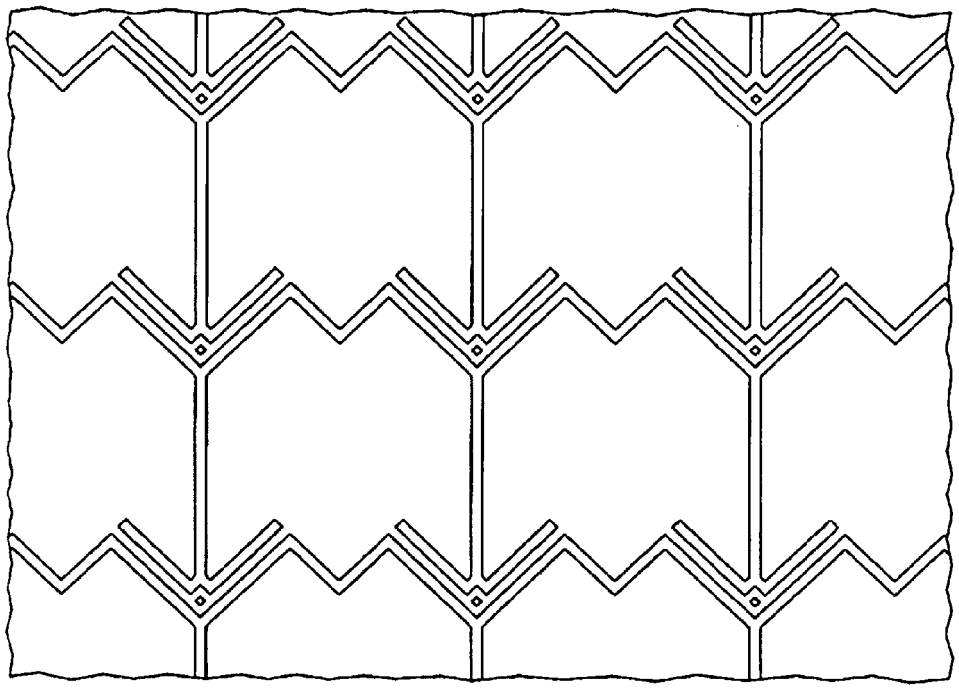
Figure 32I:
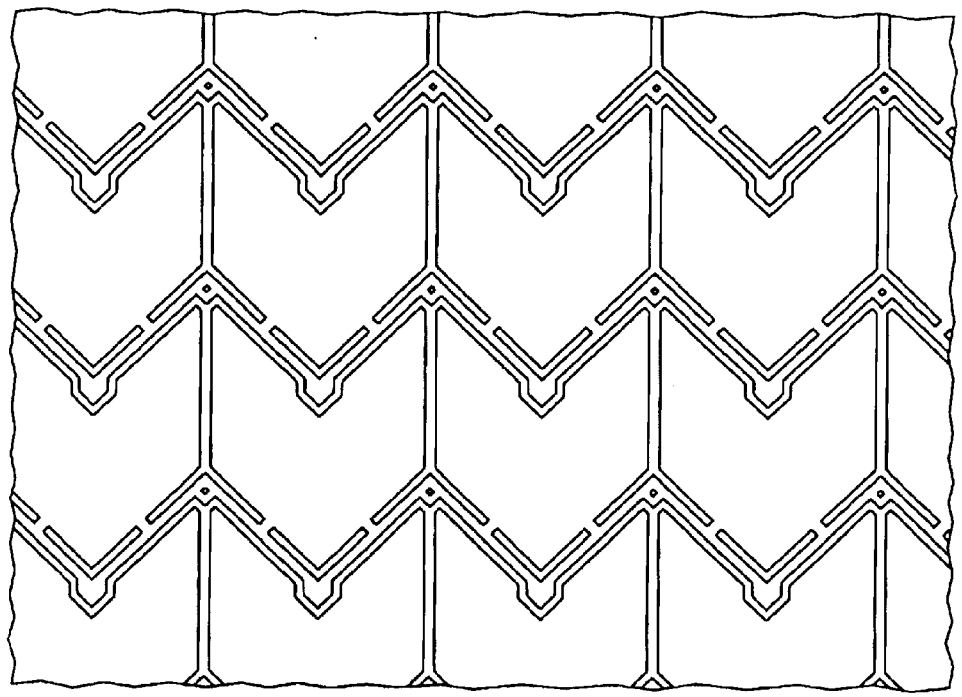
Figure 32J:
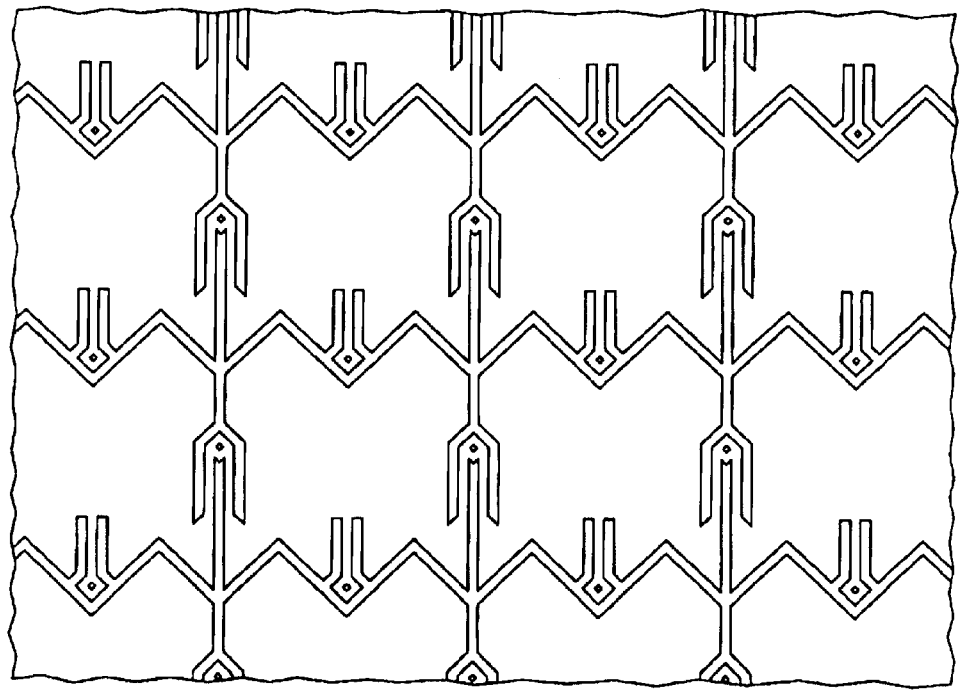

FIGS. 32A to 32J illustrate possible hinges for the micromirrors of the present invention. Similar to FIG. 24, FIG. 32A illustrates micromirrors with flexures 96 extending parallel to the incident light beam (when viewed as a top view as in this figure) and connecting micromirror 97 to support post 98 which holds the micromirror element on the substrate. Incident light could be directed at the array in the direction of arrows 5 or 6 in FIG. 32A (as viewed from above). Of course the incident light would originate out of plane (see FIGS. 11A to 11E). Such incident light would be the same for FIGS. 32B to 32L. FIGS. 32C to 32E are further embodiments of this type of hinge. FIGS. 32F to 32L are illustrations of further hinge and micromirror embodiments where, except for FIG. 32J, the hinges do not extend parallel to the incident light beam (or leading active area side) and yet can still result in the micromirrors rotating around an axis of rotation perpendicular to the incident light beam.

Figure 33A:
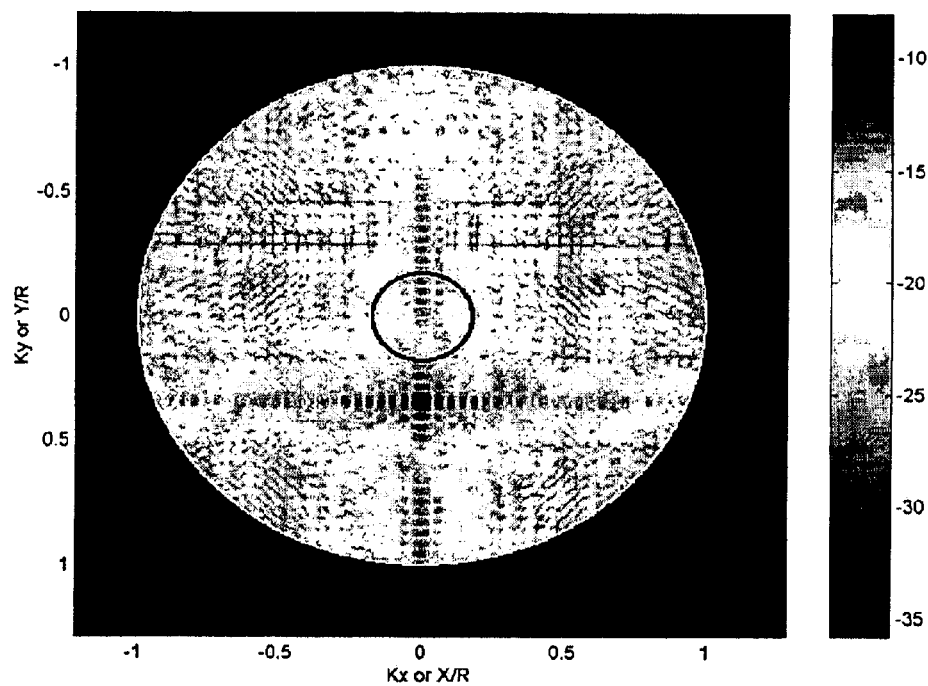
FIGS. 33A to 33C are illustrations of diffraction patterns having a diffraction line passing through the acceptance cone of the collection optics (33A) and avoiding the acceptance cone (33B and 33C).
Figure 33B:
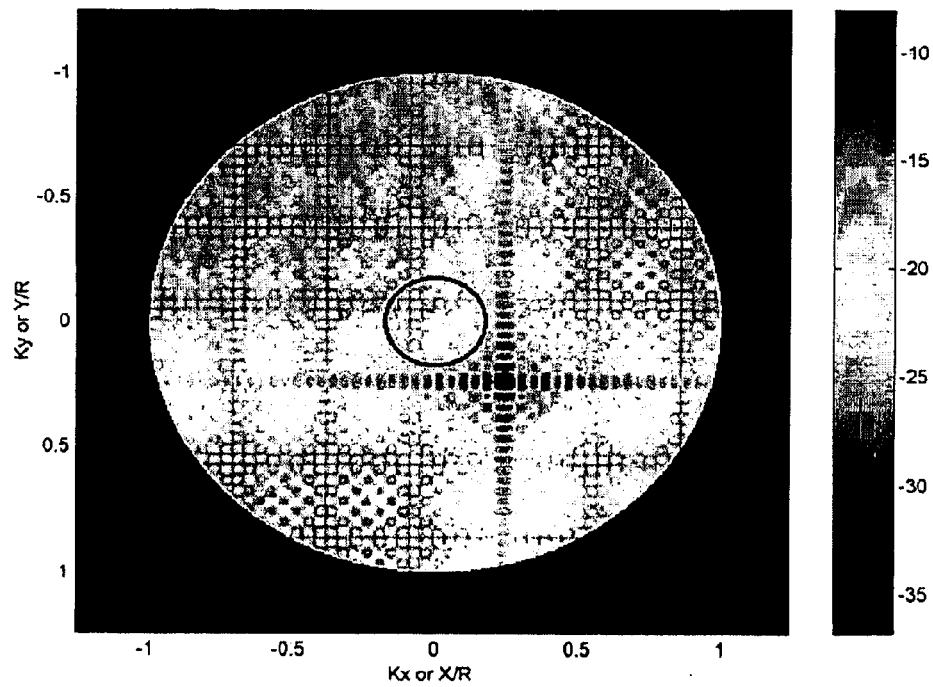

When micromirror sides that are parallel to the rotation axis of the micromirror (and perpendicular to the incident light beam) are not minimized, light diffracted by such micromirror sides, will pass through the collection optics even if the micromirror is in 'off' state, thus reducing the contrast ratio. As can be seen in FIG. 33A, a diffraction pattern (caused by illuminating an array of substantially square micromirrors such as that of FIG. 20 at an angle of 90 degree to the leading side of the array) in the shape of a "+" intersects the acceptance cone (the circle in the figure). The diffraction pattern can be seen in this figure as a series of dark dots (with a corresponding lighter background) that form one vertical and one horizontal line, and which cross just below the acceptance cone circle shown as a circular solid black line superposed onto the diffraction pattern). Though not shown, in the micromirror's 'on' state, the two diffraction lines would cross within the acceptance cone circle. Therefore, as can be seen in FIG. 33A, the vertical diffraction line will enter the acceptance cone of the collection optics even when the micromirror is in the 'off' state, thus harming the contrast ratio. FIG. 33B is a diffraction pattern caused by illuminating an array of square micromirrors at a 45 degree angle. As can be seen in FIG. 33B, diffraction light passing into the acceptance cone (the small solid black circle in FIG. 33B) is reduced compared to FIG. 33A. However, as mentioned above, though diffraction can be reduced by such an illumination, other problems arise.

Figure 33C:
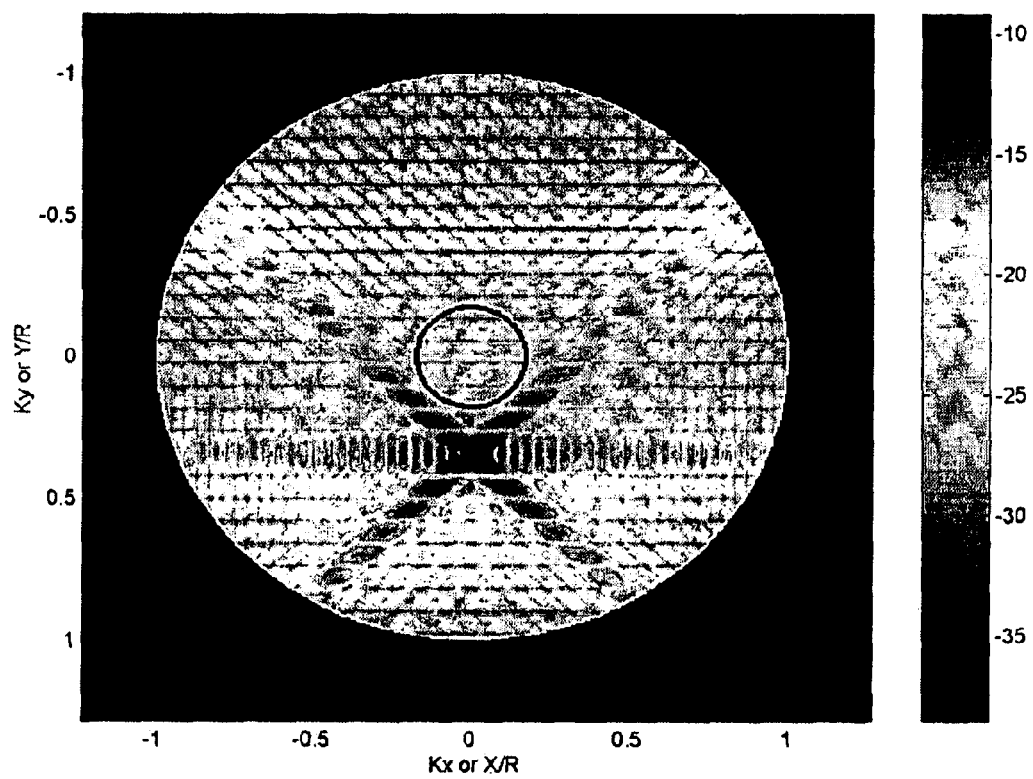

In contrast, as can be seen in FIG. 33C, the diffraction pattern of the present invention (micromirror from FIG. 28 in 'off' state) does not have a diffraction line extending though the collection optics acceptance cone, or otherwise to the spatial region where light is directed when the micromirror is in the 'on' state. Thus substantially no diffracted light is passed to the area where light is passed when the micromirror is in the 'on' state. A micromirror array producing such a diffraction pattern, with illumination light orthogonal to the sides of the active area of the array (and/or orthogonal to the columns or rows) is new. Likewise, the micromirror designs, hinges therefore, and arrangement of light source to the micromirrors, active area sides and/or addressing rows and columns are also new.

The invention has been described in terms of specific embodiments. Nevertheless, persons familiar with the field will appreciate that many variations exist in light of the embodiments described herein. For example, the micromirror shapes of the present invention could be used for micromirrors in an optical switch (e.g., such as disclosed in U.S. patent application Ser. No. 09/617,149 to Huibers et al. filed Jul. 17, 2000, and U.S. Provisional Patent Application 60/231,041 to Huibers filed Sep. 8, 2000, both incorporated herein by reference) in order to decrease diffraction in the switch. In addition, the micromirrors of the present invention can be made in accordance with structures and methods, such as those set forth in U.S. patent application Ser. No. 09/767,632 to True et al. filed Jan. 22, 2001, U.S. patent application Ser. No. 09/631,536 to Huibers et al. filed Aug. 3, 2000, U.S. patent application Ser. No. 60/293,092 to Patel et al. filed May 22, 2001, and U.S. patent application Ser. No. 06/637,479 to Huibers et al. filed Aug. 11, 2000. Also, though a standard red/green/blue or red/green/blue/white color wheel could be used in a projection display incorporating the micromirrors of the present invention, other color wheels could be used, such as disclosed in U.S. Provisional Patent Application 60/267,648 to Huibers filed Feb. 9, 2001 and 60/266,780 to Richards et al. filed Feb. 6, 2001, both incorporated herein by reference.

Also, the present invention is suited for a method utilizing a removable (and replaceable) substrate for singulation and assembly purposes such as set forth in U.S. Provisional Patent Application 60/276,222 to Patel et al. filed Mar. 15, 2001. In addition, the micromirrors of the present invention can be actuated within an array by pulse width modulation such as set forth in U.S. patent application Ser. No. 09/564,069 to Richards, filed May 3, 2000, the subject matter of which being incorporated herein by reference. Furthermore, if interhalogens or noble gas fluorides are used as etchants for the release of the micromirrors, methods could be used such as set forth in U.S. patent application Ser. No. 09/427,841 to Patel et al. filed Dec. 26, 1999 and U.S. Pat. No. 09/649,569 to Patel et al. filed Aug. 28, 2000, both being incorporated herein by reference. Or, the sacrificial materials and the methods for removing them could be those set forth in U.S. patent application Ser. No. 60/298,529 to Reid et al. filed Jun. 15, 2001. In addition, other structural materials could be used, such as the MEMS materials set forth in U.S. patent application Ser. No. 60/228,007 filed Aug. 23, 2000 and U.S. patent application Ser. No. 60/300,533 filed Jun. 22, 2001. Each of the above patents and applications are incorporated herein by reference.

Throughout the present application structures or layers are disclosed as being "on" (or deposited on), or over, above, adjacent, etc. other structures or layers. It should be recognized that this is meant to mean directly or indirectly on, over, above, adjacent, etc., as it will be recognized in the art that a variety of intermediate layers or structures could be interposed, including but not limited to sealant layers, adhesion promotion layers, electrically conductive layers, layers for reducing stiction, etc. In the same way, structures such as substrate or layer can be as a laminate due to additional structures or layers. Also, when the phrase "at least one" or "one or more" (or similar) is used, it is for emphasizing the potential plural nature of that particular structure or layer, however this phraseology should in no way imply the lack of potential plurality of other structures or layers that are not set forth in this way. In the same way, when the phrase "directly or indirectly" is used, it should in no way restrict, in places where this phrase is not used, the meaning elsewhere to either directly or indirectly. Also, "MEMS", "micromechanical" and "micro electromechanical" are used interchangeably herein and the structure may or may not have an electrical component. Lastly, unless the word "means" in a "means for" phrase is specifically set forth in the claims, it is not intended that any elements in the claims be interpreted in accordance with the specific rules relating to "means for" phraseology.

We claim:

1. A method for spatially modulating a light beam, comprising directing a light beam from a light source to light collection optics via an array of micromirrors disposed to spatially modulate the light beam from the light source, the array formed on a substrate and each micromirror being in a first position when not modulated, modulating micromirrors in the array so that each micromirror moves to an on position that directs light to the light collection optics for the array, and moves to an off position for directing light away from the light collection optics, both said on and off positions being different from said first position, and wherein the on position is at a magnitude of an angle relative to the first position different from the magnitude of an angle when in the off position.

2. An optical micromechanical element formed on a substrate having an on position at a first magnitude of an angle relative to the substrate, having an off position at a second magnitude of an angle to the substrate, the first and second magnitudes being different, and having a third position substantially parallel to the substrate, both the on and off positions being defined by abutment of the optical micromechanical element against the substrate or against structure formed on said substrate.

3. The micromechanical element of claim 2, wherein landing electrodes are provided on the substrate against which the micromirror stops in the on and off positions.

4. The micromechanical element of claim 3, wherein one landing electrode is positioned higher relative to the substrate than another landing electrode.

5. The micromechanical element of claim 2, that is in a package, the package comprising a window that is at an angle to the substrate.

6. The micromechanical element of claim 5, wherein the package is a hermetic or partially hermetic package.

7. The micromechanical element of claim 5, further comprising a molecular scavenger in the package.

8. The micromechanical element of claim 5, further comprising a stiction reduction agent within the package.

9. The micromechanical element of claim 2, further comprising flexure hinges disposed in a gap between a plate of the micromirror element and the substrate.

10. The micromechanical element of claim 2, further comprising deflection electrodes for deflecting the element to the on or off position.

11. The micromechanical element of claim 10, wherein at least one deflection electrode is disposed for moving the element to the on position, and at least one deflection electrode is disposed for moving the element to the off position.

12. The micromechanical element of claim 2 that is a micromirror.

13. A method for modulating light, comprising:
reflecting light from an array of deflectable micromirrors disposed on a planar substrate;
said micromirrors tilted to either a first position or to a second position;
wherein the angle formed between said first position and the substrate,
and the angle formed between said second position and the substrate, are substantially different.

14. A method for modulating light, comprising:
a light source, a planar light modulator array comprising a deflectable elements and collection optics,
wherein the elements in the array are selectively configured in at least two states,
wherein the first state elements direct the light from the light source through a first angle into the collection optics,
and in the second state elements direct the light from the light source through a second angle;
a third angle representing light that is reflected from the array as if it were a micromirrored surface,
wherein the difference between the first and third and second and third angles are substantially different.

15. A projection system, comprising:
a light source for providing a light beam;
a micromirror array comprising a plurality of micromirrors provided in a path of the light beam; and
collection optics disposed in a path of the light beam after the light beam is incident on the micromirror array and reflects off of the plurality of micromirrors as a pattern of on and off micromirrors in the array;
wherein the micromirror array comprises a substrate, the array of micromirrors being held on the substrate where each micromirror is capable of moving to an on position and an off position from a non-deflected position, wherein the on position is at a different angle than the off position relative to the non-deflected position.

16. The projection system of claim 15, wherein each micromirror is capable of pivoting to an on position that directs light to the light collection optics and capable of pivoting in an opposite direction to an off position for directing light away from the light collection optics, the micromirrors capable of pivoting to a greater extent to the on position than to the off position.

17. The projection system of claim 16, wherein each micromirror is capable of pivoting from −1 to −10 degrees from a rest position to the off position, and capable of pivoting greater than +10 degrees from the rest position to the on position.

18. The projection system of claim 17, wherein each micromirror is capable of pivoting from −1 to −11 degrees from the rest position to the off position, and capable of pivoting from +12 to +20 degrees from the rest position to the on position.

19. The projection system of claim 16, wherein the micromirrors are capable of pivoting at least three degrees further to the on position than to the off position, though in opposite directions.

20. The projection system of claim 16, wherein the collection optics is a single lens or group of lenses for all of the micromirrors in the array.

21. The projection system of claim 16, wherein the array of micromirrors are disposed in a package, the package having a light transmissive window that is at an angle to a substrate on which the micromirrors are formed.

22. The projection system of claim 21, wherein the window is at an angle of from −2 to −15 degrees relative to the substrate.

23. The projection system of claim 17, wherein the window is at an angle of from −3 to −10 degrees relative to the substrate.

24. The projection system of claim 15, wherein the array of micromirrors are disposed in a package, the package having a light transmissive window that is at an angle to a substrate on which the micromirrors are formed.

25. The projection system of claim 24, wherein the window is at an angle of from −2 to −15 degrees relative to the substrate.

26. The projection system of claim 17, wherein the window is at an angle of from −3 to −10 degrees relative to the substrate.

27. A method for projecting an image onto a target, comprising:
directing a light beam from a light source onto a micromirror array;
modulating the micromirrors each to an on or off position, wherein in the on position, micromirrors direct light to collection optics disposed for receiving light from micromirrors in their on position, wherein the pattern of on and off micromirrors forms an image; and
wherein the position of the micromirrors in their on position is at a different magnitude of an angle compared to the magnitude of the angle of the micromirrors in their off position.

28. A method for spatially modulating a light beam, comprising directing a beam of light onto an array of micromirrors, the micromirrors capable of movement to a first or second position, wherein in the first position the micromirrors direct a portion of the beam of light incident thereon into a collection optic, and wherein the minimum distance between adjacent micromirrors when each in the second position is less than the minimum distance between the adjacent micromirrors when each is in the first position.

29. The method of claim 28, wherein the minimum distance is determined in a direction non-parallel to the axis of rotation of the micromirrors.

30. The method of claim 28, wherein the distance is between adjacent parallel micromirror edges that have moved due to rotation of the micromirrors to either the first or second position, and the minimum of the distance is a closest point between the parallel edges of the adjacent micromirrors.

31. A device comprising:
a substrate on which is formed a movable reflective or diffractive micromechanical device;
a package for holding the substrate with the movable micromechanical device;
wherein the package comprises an optically transmissive window that is non-parallel to the substrate.

32. The device of claim 31, wherein the micromechanical device is a light modulator array.

33. The device of claim 31, wherein the window is at an angle of from −2 to −15 degrees relative to the substrate.

34. The device of claim 33, wherein the window is at an angle of from −3 to −10 degrees relative to the substrate.

35. The device of claim 31, wherein the optically transmissive window is display quality glass.

36. The device of claim 31, further comprising bond wires on a first side for electrically connecting the substrate to the package.

37. The device of claim 36, wherein the optically transmissive window is further from the substrate at a point above the bond wires on the substrate than at an opposite end of the substrate.

38. The device of claim 31, wherein the package is a hermetic or partially hermetic package.

39. The device of claim 38, further comprising a molecular scavenger in the package.

40. The device of claim 31, wherein the micromechanical device is a micromirror array for spatially modulating a light beam.

41. The device of claim 40 that is disposed within a projection system.

42. The device of claim 40, wherein each micromirror of the array has an on and off state, wherein the on state is at a different magnitude of an angle relative to the substrate than the off state.

43. The device of claim 42, wherein each micromirror abuts against the substrate or structure on the substrate when in the on and off states.

44. The device of claim 42, wherein the on and off positions are greater than a magnitude of 0 degrees relative to the substrate but less than 45 degrees relative to the substrate.

45. The device of claim 44, wherein the on position is from +10 to +30 degrees and the off position is less than between 0 and −10 degrees.

46. The device of claim 45, wherein the on position is from +12 to +20 degrees and the off position is less than between 0 and −12 degrees.

47. The device of claim 40, wherein micromirrors in the micromirror array are disposed on a semiconductor or light transmissive substrate.

48. The device of claim 47, wherein the substrate is a silicon substrate having circuitry and electrodes thereon for moving micromirrors adjacent thereto.

49. The device of claim 42, wherein the on and off positions are defined by the micromirrors abutting against a substrate or structure thereon.

50. The device of claim 42, wherein the structure thereon are landing electrodes at the same potential as the micromirrors.

51. The device of claim 42, wherein the micromirrors in the array are constructed so as to be pivotable around an axis from a non-deflected position to the on or the off states.

52. The device of claim 42, wherein the micromirrors are digitally addressed.

53. The device of claim 42, wherein the micromirrors have the shape of a concave polygon.

54. The device of claim 42, wherein non-flexible portions of the micromirrors have substantially the shape of an assembly of one or more side by side parallelograms.

55. The device of claim 40, wherein non-flexible portions of the micromirrors have substantially the shape of an assembly of one or more side by side parallelograms.

56. A projection system, comprising:
a light source;
light collection optics;
a substrate on which is formed a movable reflective or diffractive micromechanical device;
a package for holding the substrate with the movable micromechanical device;
wherein the package comprises an optically transmissive window that is non-parallel to the substrate;
the packaged micromechanical device disposed in a path of a light beam from the light source for
modulating light from the light beam, and the collection optics collecting the modulated light.

57. The projection system of claim 56, wherein the micromechanical device is a light modulator array.

58. The projection system of claim 56, wherein the window is at an angle of from −2 to −15 degrees relative to the substrate.

59. The projection system of claim 58, wherein the window is at an angle of from −3 to −10 degrees relative to the substrate.

60. The projection system of claim 56, wherein the optically transmissive window is display quality glass.

61. The projection system of claim 56, further comprising bond wires on a first side for electrically connecting the substrate to the package.

62. The projection system of claim 61, wherein the optically transmissive window is further from the substrate at a point above the bond wires on the substrate than at an opposite end of the substrate.

63. The projection system of claim 56, wherein the package is a hermetic or partially hermetic package.

64. The projection system of claim 63, further comprising a molecular scavenger in the package.

65. The projection system of claim 56, wherein the micromechanical device is a micromirror array for spatially modulating a light beam.

66. The projection system of claim 65, that is disposed within a projection system.

67. The projection system of claim 65, wherein each micromirror of the array has an on and off state, wherein the on state is at a different magnitude of an angle relative to the substrate than the off state.

68. The projection system of claim 67, wherein each micromirror abuts against the substrate or structure on the substrate when in the on and off states.

69. The projection system of claim 67, wherein movement to the on position is through an angle of greater than 0 but less than 30 degrees, and movement in the opposite direction to the off position is through an angle of between 0 and −30 degrees.

70. The projection system of claim 69, wherein the on position is from +10 to +30 degrees and the off position is from 0 to −10 degrees.

71. The projection system of claim 70, wherein the on position is from +12 to +20 degrees and the off position is from 0 to −12 degrees.

72. The projection system of claim 65, wherein micromirrors in the micromirror array are disposed on a semiconductor or light transmissive substrate.

73. The projection system of claim 72, wherein the substrate is a silicon substrate having circuitry and electrodes thereon for moving micromirrors adjacent thereto.

74. The projection system of claim 67, wherein movement of the micromirrors in one direction to the on position relative to a non-deflected position is greater than 1 degree more than movement in the opposite direction of the micromirrors to the off position.

75. The projection system of claim 67, wherein the difference is more than 3 degrees.

76. The projection system of claim 67, wherein the micromirrors in the array are constructed so as to be pivotable around an axis from a non-deflected position to the on or the off states.

77. The projection system of claim 67, wherein the micromirrors are digitally addressed.

78. The projection system of claim 67, wherein the micromirrors have the shape of a concave polygon.

79. The projection system of claim 67, wherein non-flexible portions of the micromirrors have substantially the shape of an assembly of one or more side by side parallelograms.

80. The projection system of claim 65, wherein non-flexible portions of the micromirrors have substantially the shape of an assembly of one or more side by side parallelograms.

81. The projection system of claim 65, wherein the micromirrors are digitally addressed.

82. The projection system of claim 81, wherein the micromirrors achieve grayscale by pulse width modulation.

83. The projection system of claim 65, further comprising a target upon which light from the collection optics is incident.

84. The projection system of claim 65, wherein the light source is an arc lamp.

85. The projection system of claim 65, wherein the on and off positions are at angles greater than 3 degrees but less than 30 degrees from the substrate.

86. The projection system of claim 65, further comprising a screen upon which the pattern of on and off micromirrors is incident.

87. The projection system of claim 65, further comprising a color filter for providing a series of sequential colors onto the micromirror array.

88. The projection system of claim 70, further comprising a device for improving the evenness of light distribution onto the array.

89. The projection system of claim 65, wherein the collection optics is a plurality of lenses disposed so as to project the pattern of light from the micromirror array onto a target.

90. The projection system of claim 72, further comprising one or more micromirrors or lenses for directing and focusing a cone of light onto the micromirror array.

91. The projection system of claim 56 that is a front or rear projection display.

92. The projection system of claim 65, that is a mask projector for maskless patterning of a light sensitive material.

93. The projection system of claim 75, that is a projector in a photolithography system.

94. The projection system of claim 67, further comprising a target upon which an image of a pattern of on and off mirrors is incident.

95. The projection system of claim 56, wherein the micromechanical device is a micromirror array where each micromirror has substantially no micromirror edges perpendicular to the light beam from the light source.

96. A packaged MEMS device having a substrate with a micromechanical device thereon and a window in the package disposed at an angle to the substrate.

97. The projection system of claim 96, wherein the micromechanical device is a light modulator array.

98. The projection system of claim 96, wherein the window is at an angle of from −2 to −15 degrees relative to the substrate.

99. The projection system of claim 98, wherein the window is at an angle of from −3 to −10 degrees relative to the substrate.

100. The projection system of claim 96, wherein the optically transmissive window is display quality glass.

101. The projection system of claim 96, further comprising bond wires on a first side for electrically connecting the substrate to the package.

102. The projection system of claim 101, wherein the optically transmissive window is further from the substrate at a point above the bond wires on the substrate than at an opposite end of the substrate.

103. The projection system of claim 96, wherein the package is a hermetic or partially hermetic package.

104. The projection system of claim 103, further comprising a molecular scavenger in the package.

105. The projection system of claim 96, wherein the micromechanical device is a micromirror array for spatially modulating a light beam.

106. The projection system of claim 105, that is disposed within a projection system.

107. The projection system of claim 105, wherein each micromirror of the array has an on and off state, wherein the on state is at a different magnitude of an angle relative to the substrate than the off state.

108. The projection system of claim 107, wherein each micromirror abuts against the substrate or structure on the substrate when in the on and off states.

109. The projection system of claim 107, wherein the on and off positions are greater than a magnitude of 0 degrees relative to the substrate but less than 45 degrees relative to the substrate.

110. The projection system of claim 109, wherein the on position is from +10 to +30 degrees and the off position is from 0 to −10 degrees.

111. The projection system of claim 110, wherein the on position is from +12 to +20 degrees and the off position is from 0 to −12 degrees.

112. The projection system of claim 105, wherein micromirrors in the micromirror array are disposed on a semiconductor or light transmissive substrate.

113. The projection system of claim 112, wherein the substrate is a silicon substrate having circuitry and electrodes thereon for moving micromirrors adjacent thereto.

114. The projection system of claim 107, wherein movement of the micromirrors in one direction to the on position relative to a non-deflected position is greater than 1 degree more than movement in the opposite direction of the micromirrors to the off position.

115. The projection system of claim 107, wherein the difference is more than 3 degrees.

116. The projection system of claim 107, wherein the micromirrors in the array are constructed so as to be pivotable around an axis from a non-deflected position to the on or the off states.

117. The projection system of claim 107, wherein the micromirrors are digitally addressed.

118. The projection system of claim 107, wherein the micromirrors have the shape of a concave polygon.

119. The projection system of claim 107, wherein non-flexible portions of the micromirrors have substantially the shape of an assembly of one or more side by side parallelograms.

120. The projection system of claim 105, wherein non-flexible portions of the micromirrors have substantially the shape of an assembly of one or more side by side parallelograms.

121. The projection system of claim 105, wherein the micromirrors are digitally addressed.

122. The projection system of claim 121, wherein the micromirrors achieve grayscale by pulse width modulation.

123. A projector comprising a light source, a packaged MEMS device having a substrate with a micromechanical device thereon and a window in the package disposed at an angle to the substrate, and collection optics disposed to receive light from the light source after modulation by the packaged MEMS device.

124. A method for making a micromirror, comprising:
providing a substrate;
depositing and patterning a first sacrificial layer on the substrate;
depositing at least one hinge layer on the sacrificial layer and patterning the at least one hinge layer to define at least one flexure hinge;
depositing and patterning a second sacrificial layer;
depositing at least one mirror layer on the second sacrificial layer and patterning the at least one mirror layer to form a mirror element; and
removing the first and second sacrificial layers so as to release the micromirror.

125. The method of claim 124, wherein the substrate is a light transmissive or semiconductor substrate.

126. The method of claim 124, wherein the sacrificial layers are deposited by spin-on, sputtering or chemical vapor deposition.

127. The method of claim 126, wherein the at least one hinge layer and the at least one mirror layer are conductive layers deposited by chemical vapor deposition or sputtering.

128. An optical micromechanical device, comprising:
a substrate;
a first post on the substrate;
a flexure hinge where a proximal end of flexure hinge is on the post;
a second post attached to a distal end of the flexure hinge; and
a plate attached to the second post.

129. The device of claim 128, wherein the device is formed by micromachining.

130. The device of claim 128, wherein the plate is a reflective and conductive micromirror.

131. The device of claim 130, wherein a plurality of flexure hinges connect the plate to the substrate, via a plurality of corresponding first and second posts.

132. A mirror array comprising:
a substrate;
an array of mirrors held on said substrate, each mirror held by a hinge to said substrate;
a plurality of electrodes formed proximate to each mirror in the array for deflecting a proximate mirror to one of only two different deflection angles depending upon a voltage being applied to one of the plurality of electrodes.

133. The mirror array of claim 132, further comprising a landing electrode held at the same potential as the mirrors in the array.

134. The mirror array of claim 133, wherein a landing electrode is disposed for a mirror on position and a mirror off position.

135. The mirror array of claim 132, wherein a voltage is applied to one electrode of the plurality of electrodes for electrostatically pulling an adjacent mirror to an on position, and a voltage is applied to another electrode of the plurality of electrodes for electrostatically pulling the adjacent mirror to an off position different from the on position.

136. A package for a micromechanical device comprising a bottom substrate for holding the micromechanical device and a top light transmissive substrate that is non-parallel to the bottom substrate.

137. The package of claim 136, capable of hermetic sealing.

138. The package of claim 137 comprising a getter and an agent for reducing stiction.

139. The package of claim 136, further comprising a micromechanical device disposed on the bottom substrate.

140. The package of claim 139, wherein the non-parallel light transmissive substrate is at an angle of from −1 to −15 degrees relative to the bottom substrate.

141. The package of claim 140, further comprising bond wires connecting the micromechanical device to the bottom substrate.

142. The package of claim 136, further comprising a bond pad on the bottom substrate.

* * * * *